(12) United States Patent
Fukuda et al.

(10) Patent No.: US 12,075,620 B2
(45) Date of Patent: Aug. 27, 2024

(54) SEMICONDUCTOR MEMORY DEVICE

(71) Applicant: Kioxia Corporation, Tokyo (JP)

(72) Inventors: Natsuki Fukuda, Yokkaichi Mie (JP); Tadashi Iguchi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 419 days.

(21) Appl. No.: 17/397,165

(22) Filed: Aug. 9, 2021

(65) Prior Publication Data
US 2022/0285389 A1 Sep. 8, 2022

(30) Foreign Application Priority Data

Mar. 3, 2021 (JP) .................................. 2021-33117

(51) Int. Cl.
*H10B 41/27* (2023.01)
*H10B 41/10* (2023.01)
*H10B 41/30* (2023.01)
*H10B 43/10* (2023.01)
*H10B 43/27* (2023.01)
*H10B 43/30* (2023.01)

(52) U.S. Cl.
CPC ............. *H10B 43/27* (2023.02); *H10B 41/10* (2023.02); *H10B 41/27* (2023.02); *H10B 41/30* (2023.02); *H10B 43/10* (2023.02); *H10B 43/30* (2023.02)

(58) Field of Classification Search
CPC ...................................................... H10B 41/27
See application file for complete search history.

(56) References Cited

U.S. PATENT DOCUMENTS

| 10,276,585 B2 | 4/2019 | Utsumi | |
|---|---|---|---|
| 2017/0309635 A1* | 10/2017 | Kim | H10B 43/27 |
| 2018/0102316 A1* | 4/2018 | Kim | H01L 28/00 |
| 2020/0091243 A1 | 3/2020 | Aiba et al. | |
| 2020/0152654 A1 | 5/2020 | Hwang et al. | |
| 2021/0287991 A1 | 9/2021 | Sun et al. | |
| 2022/0285389 A1* | 9/2022 | Fukuda | H10B 41/30 |
| 2023/0088929 A1* | 3/2023 | Fukuda | H10B 43/27 |
| | | | 257/314 |

(Continued)

FOREIGN PATENT DOCUMENTS

| CN | 111180418 A | 5/2020 |
|---|---|---|
| CN | 111448648 A | 7/2020 |
| JP | 2018-026518 A | 2/2018 |

*Primary Examiner* — Eugene Lee
(74) *Attorney, Agent, or Firm* — Foley & Lardner LLP

(57) ABSTRACT

A semiconductor memory device includes a substrate, conductive layers arranged in a first direction and extend in a second direction, a semiconductor layer extending in the first direction and opposed to the conductive layers, and n contact electrode regions arranged in a third direction. The n is a power of 2. The contact electrode region includes contact electrodes arranged in the second direction. The conductive layers include a first conductive layer and a second conductive layer that is an n-th conductive layer counted from the first conductive layer. The contact electrodes include a first contact electrode connected to the first conductive layer, a second contact electrode connected to the second conductive layer, and a third contact electrode disposed between them. The first contact electrode, the second contact electrode, and the third contact electrode are arranged in the second direction or the third direction.

11 Claims, 62 Drawing Sheets

(56) References Cited

U.S. PATENT DOCUMENTS

| | | | |
|---|---|---|---|
| 2023/0090305 A1* | 3/2023 | Iguchi | H10B 43/27 |
| | | | 257/314 |
| 2023/0309302 A1* | 9/2023 | Shimizu | H10B 43/35 |
| 2024/0064980 A1* | 2/2024 | Nishikawa | H10B 43/27 |

* cited by examiner

SEMICONDUCTOR MEMORY DEVICE

CROSS-REFERENCE TO RELATED APPLICATIONS

This application is based upon and claims the benefit of Japanese Patent Application No. 2021-33117, filed on Mar. 3, 2021, the entire contents of which are incorporated herein by reference.

BACKGROUND

Field

This embodiment relates to a semiconductor memory device.

Description of the Related Art

There has been known a semiconductor memory device that includes a substrate, a plurality of conductive layers, a semiconductor layer, and a gate insulating layer. The plurality of conductive layers are stacked in a direction intersecting with a surface of the substrate. The semiconductor layer is opposed to the plurality of conductive layers. The gate insulating layer is disposed between the conductive layers and the semiconductor layer. The gate insulating layer includes a memory unit configured to store data, and the memory unit is, for example, an insulative electric charge accumulating layer of silicon nitride ($Si_3N_4$) or the like, and a conductive electric charge accumulating layer, such as a floating gate.

DETAILED DESCRIPTION

Figure 1:
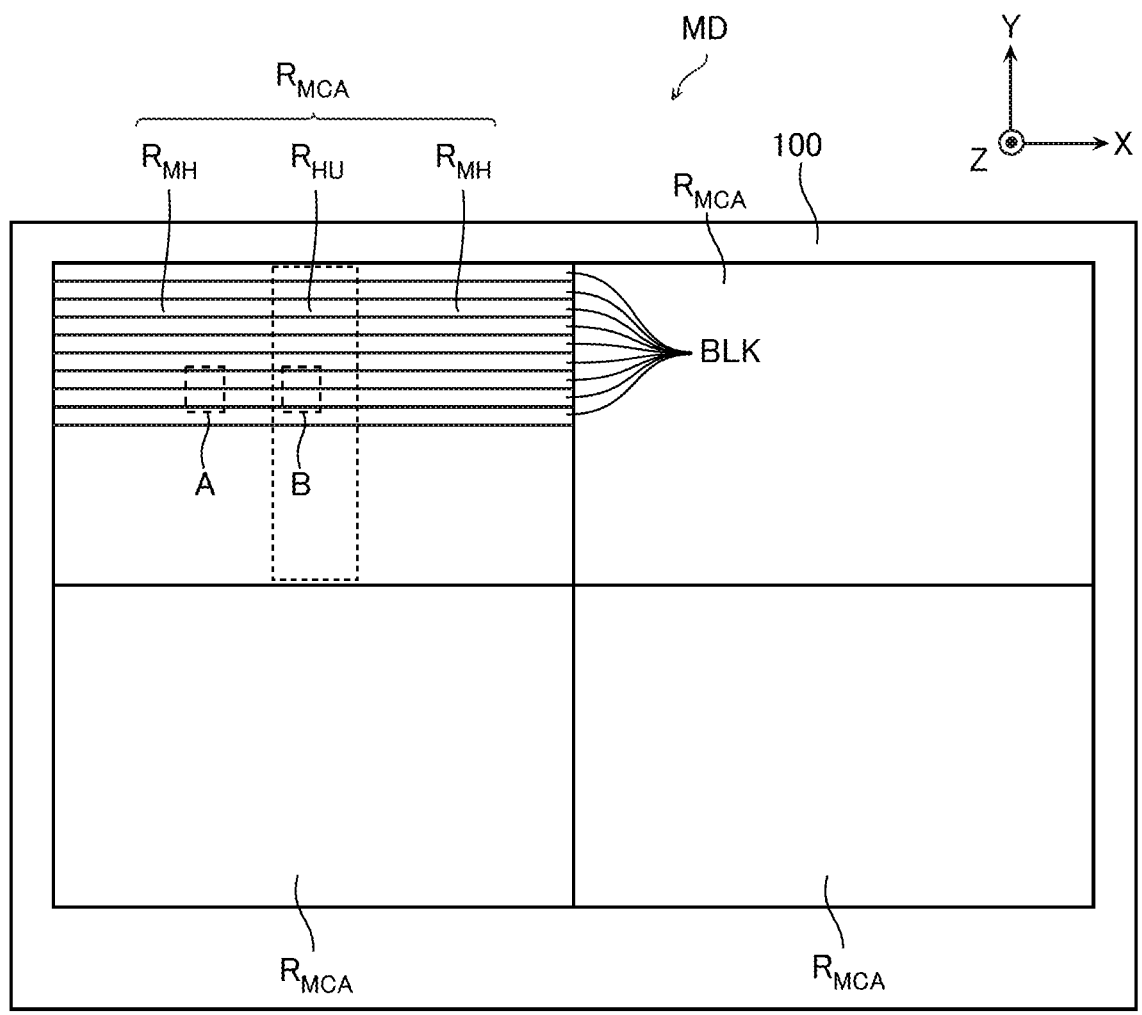
FIG. 1 is a schematic plan view of a memory die MD according to a first embodiment.

A semiconductor memory device according to one embodiment comprises: a substrate; a plurality of conductive layers that are arranged in a first direction and extend in a second direction, the first direction intersecting with a surface of the substrate, and the second direction intersecting with the first direction; a semiconductor layer that extends in the first direction and is opposed to the plurality of conductive layers; and n (n is an integer of 2 or more) contact electrode regions arranged in a third direction intersecting with the first direction and the second direction. The n is a power of 2, the contact electrode region includes a plurality of contact electrodes arranged in the second direction, and the plurality of conductive layers include a first conductive layer and a second conductive layer that is an n-th conductive layer counted from the first conductive layer. The plurality of contact electrodes included in the n contact electrode regions include: a first contact electrode connected to the first conductive layer; a second contact electrode connected to the second conductive layer; and a third contact electrode disposed between the first contact electrode and the second contact electrode. The first contact electrode, the second contact electrode, and the third contact electrode are arranged in the second direction or the third direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a control die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as aside surface and the like.

In this specification, when referring to a "width", a "length", a "thickness", or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

Figure 2:
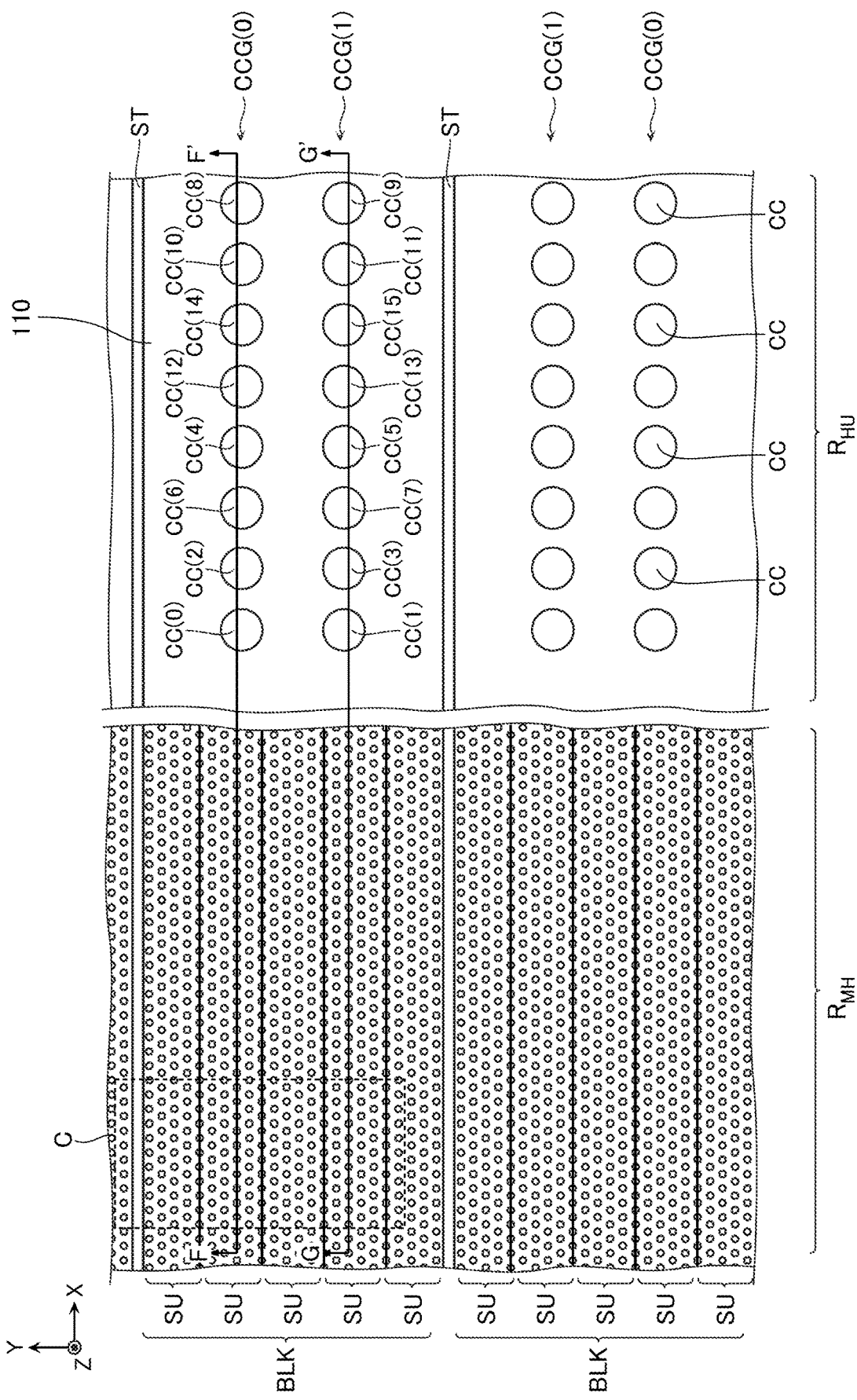
FIG. 2 is a schematic enlarged view of a part indicated by A and a part indicated by B in FIG. 1.
Figure 3:
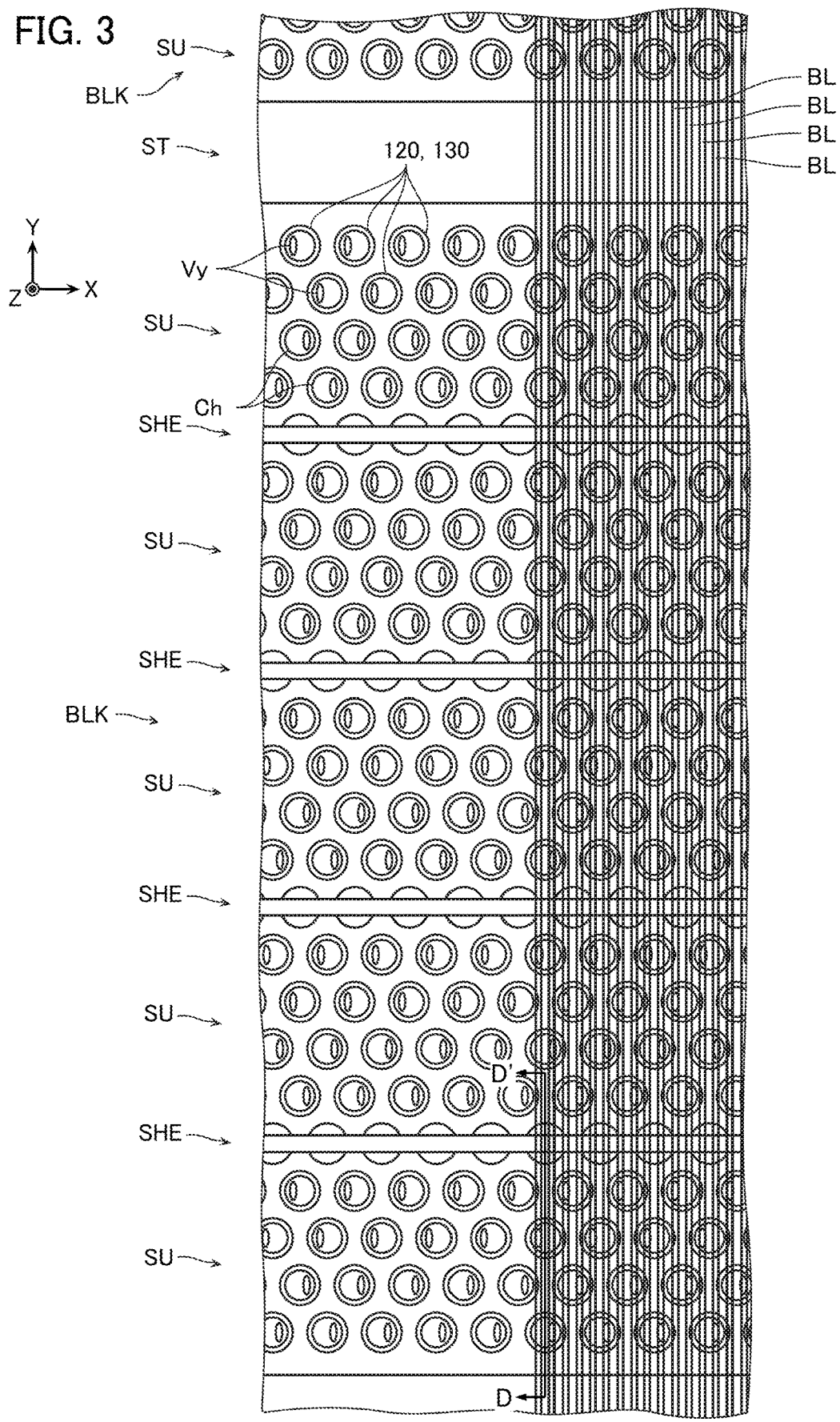
FIG. 3 is a schematic enlarged view of a part indicated by C in FIG. 2.
Figure 4:
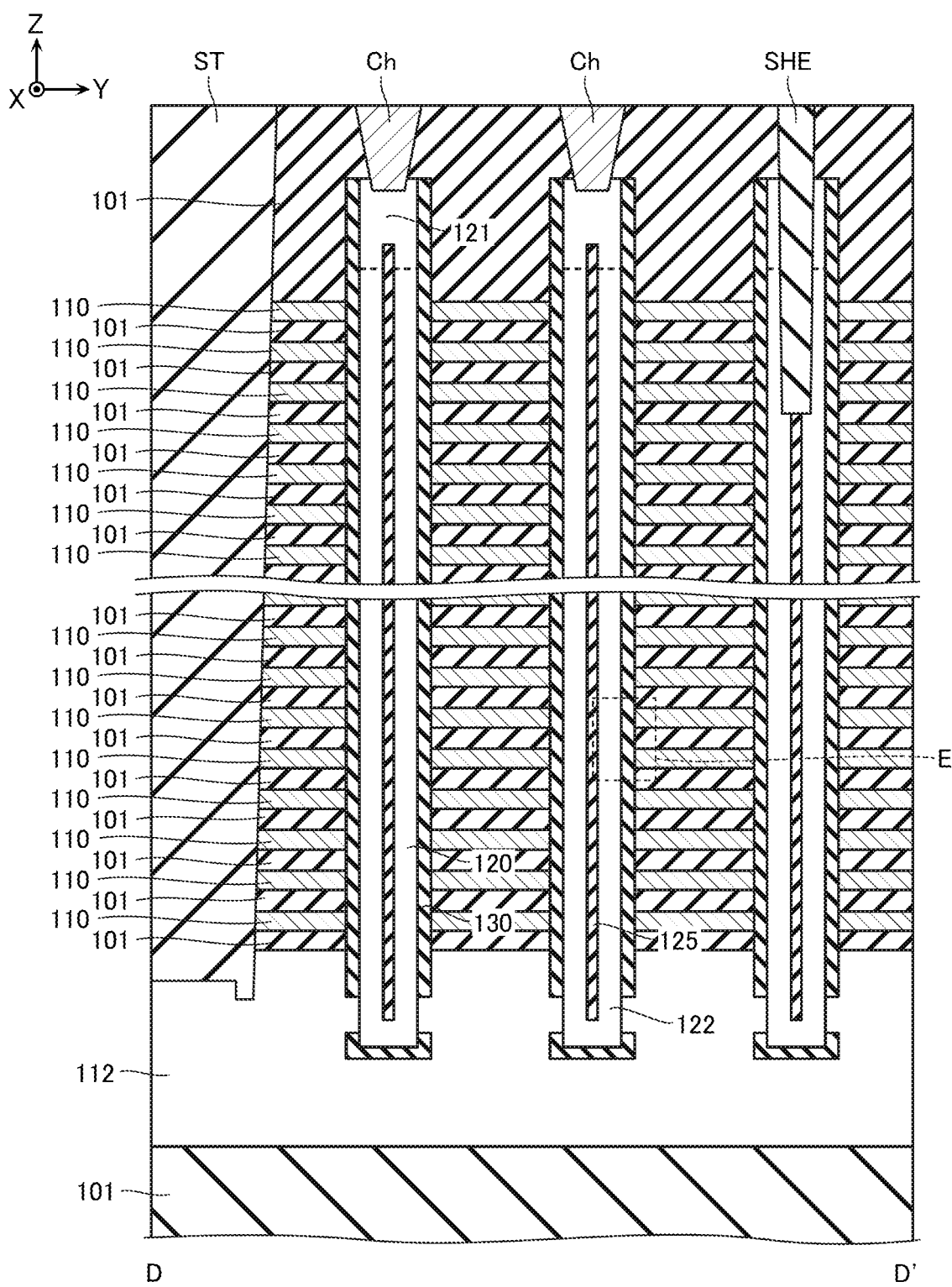
FIG. 4 is a schematic cross-sectional view of a structure illustrated in FIG. 3 taken along a line D-D' viewed in an arrow direction.
Figure 5:
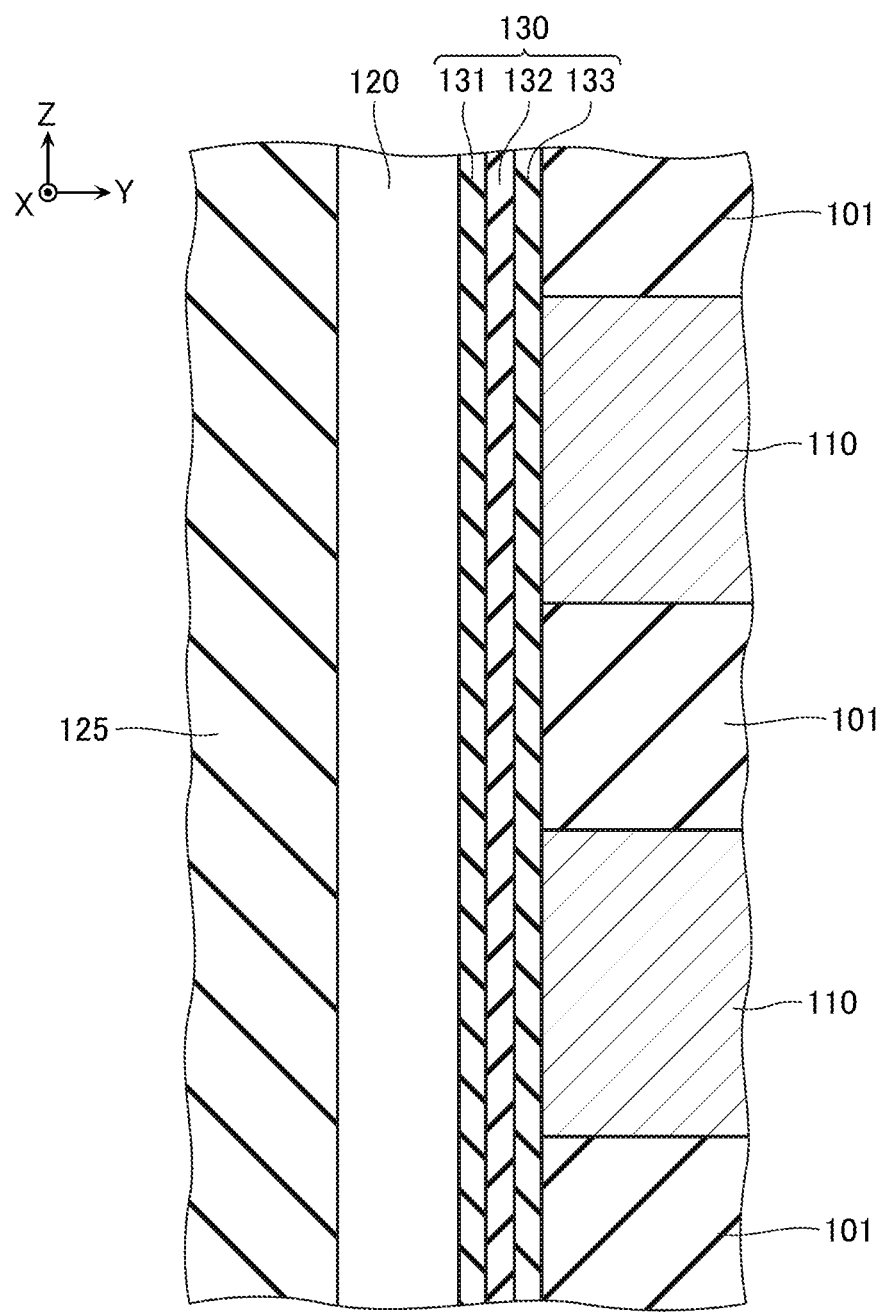
FIG. 5 is a schematic enlarged view of a part indicated by E in FIG. 4.
Figure 6:
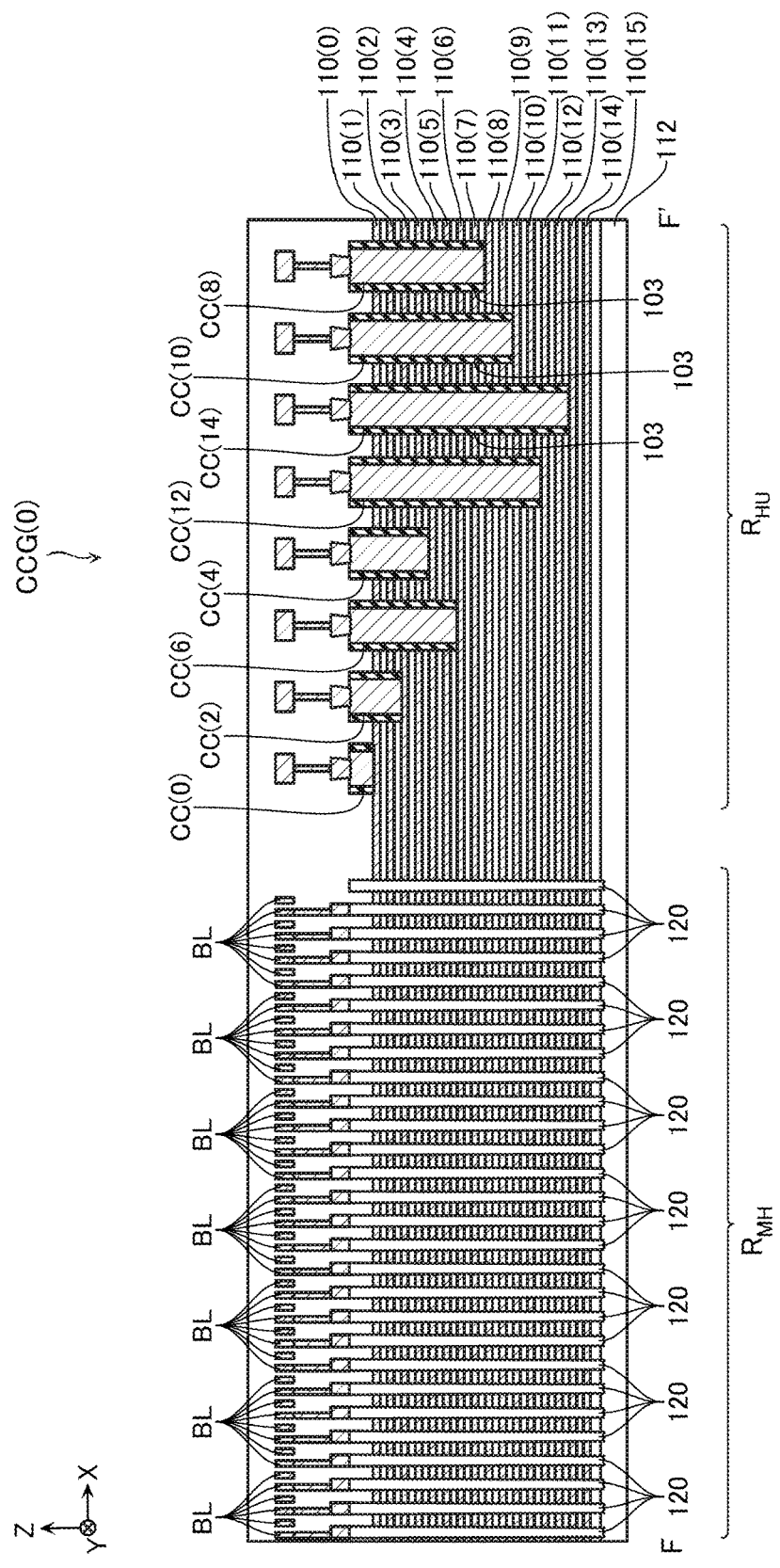
FIG. 6 is a schematic cross-sectional view of a structure illustrated in FIG. 2 taken along a line F-F' viewed in an arrow direction.
Figure 7:
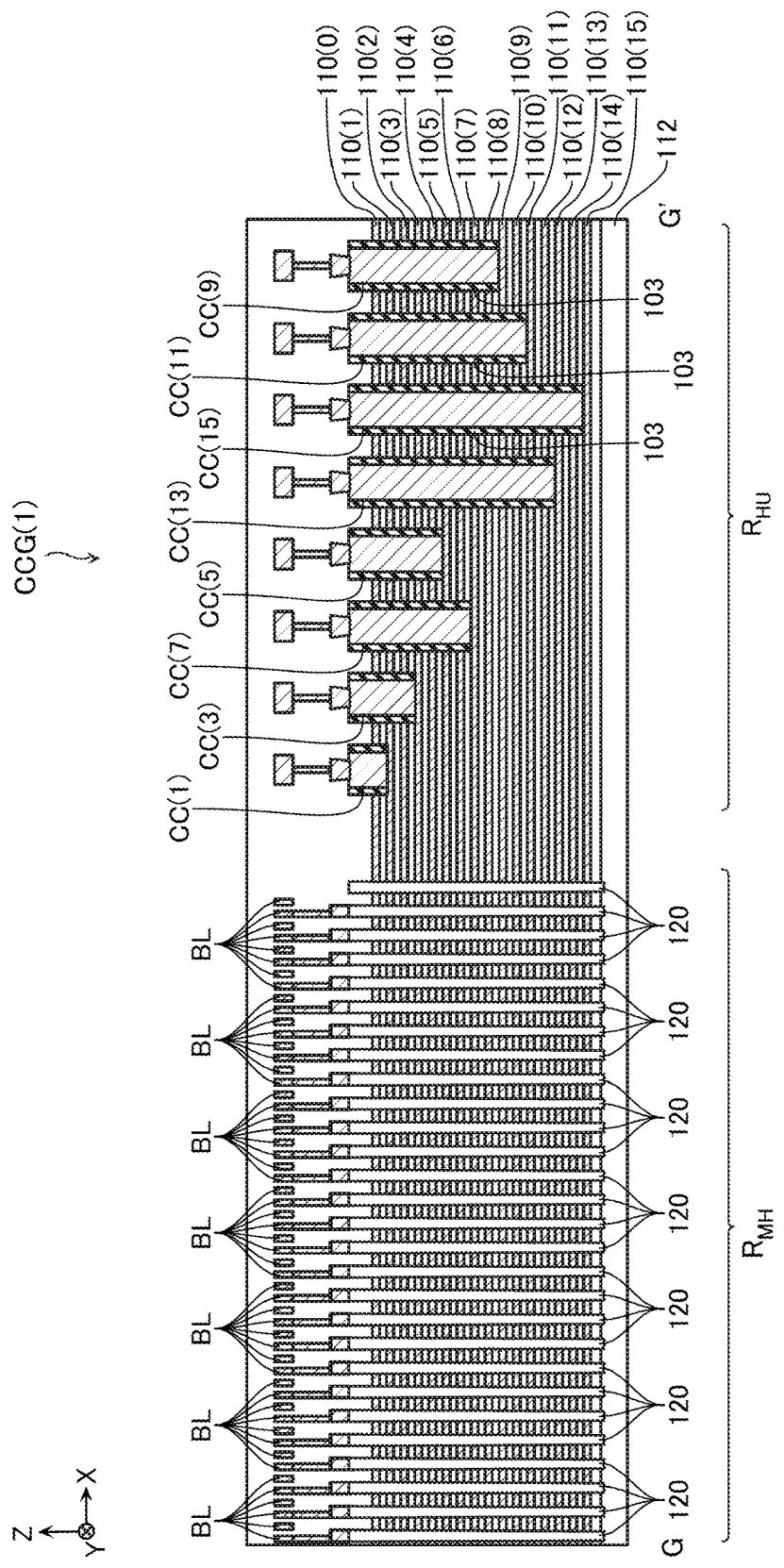
FIG. 7 is a schematic cross-sectional view of the structure illustrated in FIG. 2 taken along a line G-G' viewed in an arrow direction.

[Configuration]
FIG. 1 is a schematic plan view of a memory die MD. FIG. 2 is a schematic enlarged view of the part indicated by A and the part indicated by B in FIG. 1. FIG. 3 is a schematic enlarged view of the part indicated by C in FIG. 2. FIG. 4 is a schematic cross-sectional view of the structure illustrated in FIG. 3 taken along the line D-D' viewed in the arrow direction. FIG. 5 is a schematic enlarged view of the part indicated by E in FIG. 4. FIG. 6 is a schematic cross-sectional view of the structure illustrated in FIG. 2 taken along the line F-F' viewed in the arrow direction. FIG. 7 is a schematic cross-sectional view of the structure illustrated in FIG. 2 taken along the line G-G' viewed in the arrow direction.

For example, as illustrated in FIG. 1, the memory die MD includes a semiconductor substrate 100. The semiconductor substrate 100 is a semiconductor substrate formed of a P-type silicon (Si) that contains P-type impurities, such as boron (B). The semiconductor substrate 100 has a surface that includes an N-type well region, a P-type well region, a semiconductor substrate region, and an insulating region. The N-type well region contains N-type impurities, such as phosphorus (P). The P-type well region contains P-type impurities, such as boron (B). Neither the N-type well region nor the P-type well region is disposed in the semiconductor substrate region.

The memory die MD includes four memory cell array regions $R_{MCA}$ arranged in the X-direction and the Y-direction. The memory cell array region $R_{MCA}$ includes two memory hole regions $R_{MH}$ arranged in the X-direction and a hook-up region $R_{HU}$ disposed between these memory hole regions $R_{MH}$.

The memory cell array region $R_{MCA}$ includes a plurality of memory blocks BLK arranged in the Y-direction. For example, as illustrated in FIG. 2, the memory block BLK includes a plurality of string units SU arranged in the Y-direction. An inter-block insulating layer ST of silicon oxide ($SiO_2$) or the like is disposed between the two memory blocks BLK mutually adjacent in the Y-direction. For example, as illustrated in FIG. 3, an inter-string unit insulating layer SHE of silicon oxide ($SiO_2$) or the like is disposed between the two string units SU mutually adjacent in the Y-direction.

For example, as illustrated in FIG. 4, the memory hole region $R_{MH}$ of the memory block BLK includes a plurality of conductive layers 110 arranged in the Z-direction, a plurality of semiconductor layers 120 extending in the Z-direction, and a plurality of respective gate insulating films 130 disposed between the plurality of conductive layers 110 and the plurality of semiconductor layers 120.

The conductive layer 110 is an approximately plate-shaped conductive layer extending in the X-direction. The conductive layer 110 may include, for example, a stacked film of a barrier conductive film, such as titanium nitride (TiN), and a metal film, such as tungsten (W). The conductive layer 110 may contain, for example, a polycrystalline silicon that contains impurities, such as phosphorus (P) or boron (B). Insulating layers 101 of silicon oxide ($SiO_2$) or the like are disposed between the plurality of conductive layers 110 arranged in the Z-direction. The conductive layer 110 functions as a gate electrode and a word line of the memory cell, or a gate electrode and a select gate line of a select transistor.

A semiconductor layer 112 is disposed below the conductive layer 110. The semiconductor layer 112 may contain, for example, a polycrystalline silicon that contains impurities, such as phosphorus (P) or boron (B). Insulating layers 101 of silicon oxide ($SiO_2$) or the like are disposed between the conductive layers 110 and between the conductive layer 110 and the semiconductor layer 112. The semiconductor layer 112 functions as a part of a source line.

For example, as illustrated in FIG. 3, the semiconductor layers 120 are arranged in the X-direction and the Y-direction in a predetermined pattern. The semiconductor layers 120 function as channel regions of the plurality of memory cells and the select transistors. The semiconductor layer 120 is a semiconductor layer of polycrystalline silicon (Si) or the like. For example, as illustrated in FIG. 4, the semiconductor layer 120 has an approximately cylindrical shape, and includes an insulating layer 125 of silicon oxide or the like in the center portion. Outer peripheral surfaces of the semiconductor layers 120 are each surrounded by the conductive layers 110, and opposed to the conductive layers 110.

An impurity region 121 containing N-type impurities, such as phosphorus (P), is disposed in an upper end portion of the semiconductor layer 120. In the example of FIG. 4, a boundary line between the upper end portion of the semiconductor layer 120 and a lower end portion of the impurity region 121 is indicated by a dashed line. The impurity region 121 is connected to the bit lines BL via a contact Ch and a contact Vy (FIG. 3).

The semiconductor layer 120 has a lower end portion connected to the semiconductor layer 112.

The gate insulating film 130 has an approximately cylindrical shape covering the outer peripheral surface of the semiconductor layer 120. For example, as illustrated in FIG. 5, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 are insulating films of silicon oxide ($SiO_2$) or the like. The electric charge accumulating film 132 is a film of silicon nitride ($Si_3N_4$) or the like and can accumulate electric charge. The tunnel insulating film 131, the electric charge accumulating film 132, and the block insulating film 133 have approximately cylindrical shapes, and extend in the Z-direction along the outer peripheral surface of the semiconductor layer 120 excluding a contact portion of the semiconductor layer 120 and the semiconductor layer 112.

FIG. 5 illustrates an example where the gate insulating film 130 includes the electric charge accumulating film 132 of silicon nitride or the like. However, the gate insulating film 130 may include, for example, a floating gate of polycrystalline silicon containing N-type or P-type impurities.

For example, as illustrated in FIG. 2, the hook-up region $R_{HU}$ of the memory block BLK includes a part of the conductive layer 110 and two contact electrode rows CCG (contact electrode region) arranged in the Y-direction. In FIG. 2, these two contact electrode rows CCG are indicated as CCG(0) and CCG(1).

As illustrated in FIG. 6 and FIG. 7, the contact electrode row CCG includes a plurality of contact electrodes CC arranged in the X-direction. The plurality of contact electrodes CC extend in the Z-direction, and are each connected to the conductive layer 110 at the lower end. The contact electrode CC may include, for example, a stacked film of a barrier conductive film, such as titanium nitride (TiN), and a metal film, such as tungsten (W). An insulating layer 103 of silicon oxide ($SiO_2$) or the like is disposed on an outer peripheral surface of the contact electrode CC.

In the following description, the n-th (n is an integer of 1 or more) conductive layer 110 counted from the upper side is referred to as the conductive layer 110 (n−1) in some cases. Among the plurality of contact electrodes CC, the one connected to the conductive layer 110(n) is referred to as the contact electrode CC(n) in some cases.

As illustrated in FIG. 6, the contact electrode row CCG(0) includes the contact electrodes CC(0), CC(2), CC(6), CC(4), CC(12), CC(14), CC(10), and CC(8) in the order from the one close to the memory hole region $R_{MH}$.

As illustrated in FIG. 7, the contact electrode row CCG(1) includes the contact electrodes CC(1), CC(3), CC(7), CC(5), CC(13), CC(15), CC(11), and CC(9) in the order from the one close to the memory hole region $R_{MH}$.

As illustrated in FIG. 2, the plurality of contact electrodes CC(0), CC(2), CC(6), CC(4), CC(12), CC(14), CC(10), and CC(8) in the contact electrode row CCG(0) are aligned with the plurality of contact electrodes CC(1), CC(3), CC(7), CC(5), CC(13), CC(15), CC(11), and CC(9) in the contact electrode row CCG(1) in the Y-direction, respectively.

[Manufacturing Method]

Next, with reference to FIG. 8 to FIG. 35, the method for manufacturing the memory die MD will be described. FIG. 10, FIG. 12, FIG. 16, FIG. 21, and FIG. 26 are schematic plan views for describing the manufacturing method, and illustrate the plane corresponding to that in FIG. 2. FIG. 8, FIG. 9, FIG. 11, FIG. 13, FIG. 17, FIG. 19, FIG. 22, FIG. 24, FIG. 27, FIG. 29, FIG. 31, and FIG. 34 are schematic cross-sectional views for describing the manufacturing method, and illustrate the cross-sectional surface corresponding to that in FIG. 6. FIG. 14, FIG. 15, FIG. 18, FIG. 20, FIG. 23, FIG. 25, FIG. 28, FIG. 30, FIG. 32, FIG. 33, and FIG. 35 are schematic cross-sectional views for describing the manufacturing method, and illustrate the cross-sectional surface corresponding to that in FIG. 7.

Figure 8:
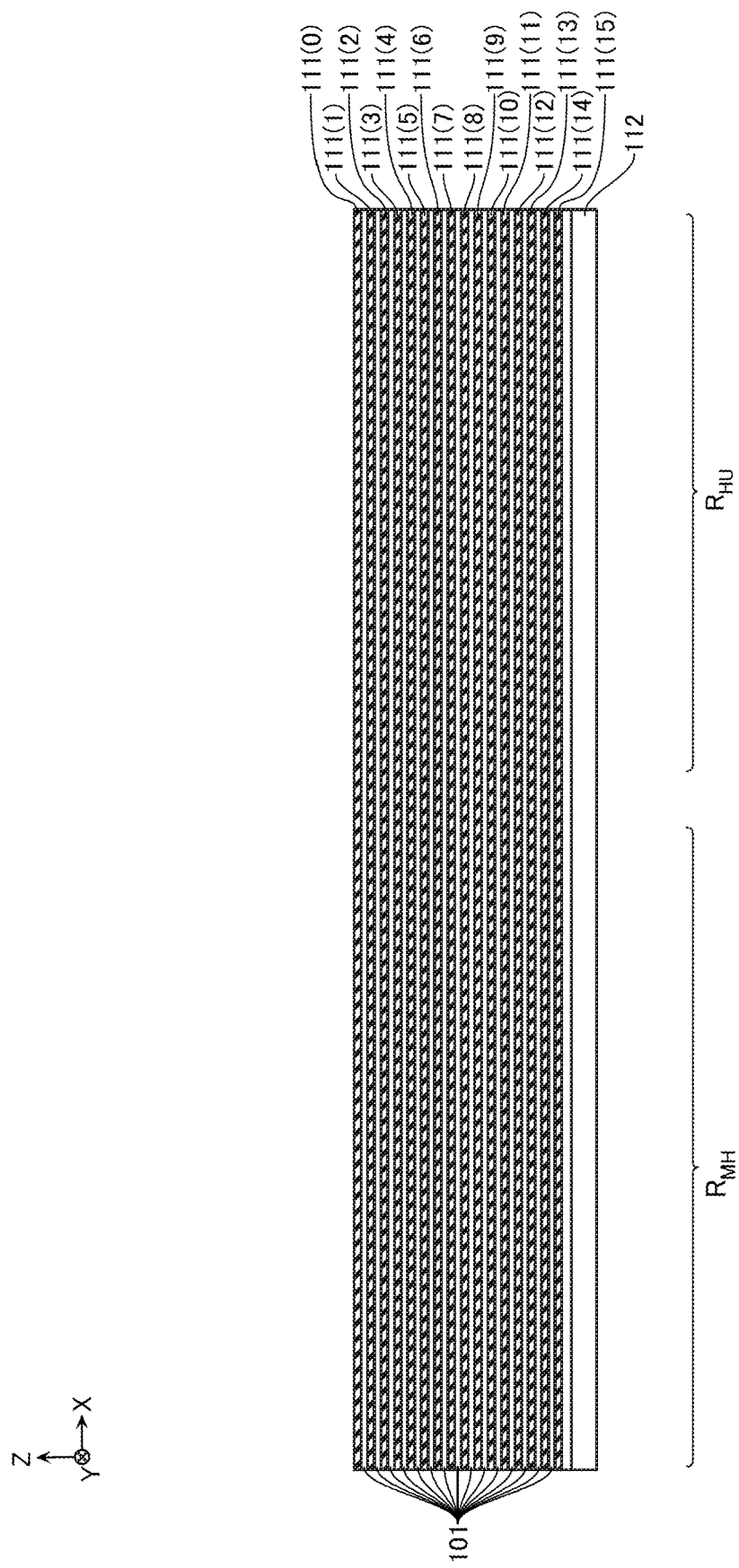
FIG. 8 is a schematic cross-sectional view for describing a method for manufacturing a semiconductor memory device according to the first embodiment.

In the manufacture of the memory die MD according to the embodiment, for example, as illustrated in FIG. 8, the semiconductor layer 112 is formed. A plurality of the insulating layers 101 and a plurality of sacrifice layers 111 are alternately formed above the semiconductor layer 112. This process is performed by a method, such as Chemical Vapor Deposition (CVD).

Figure 9:
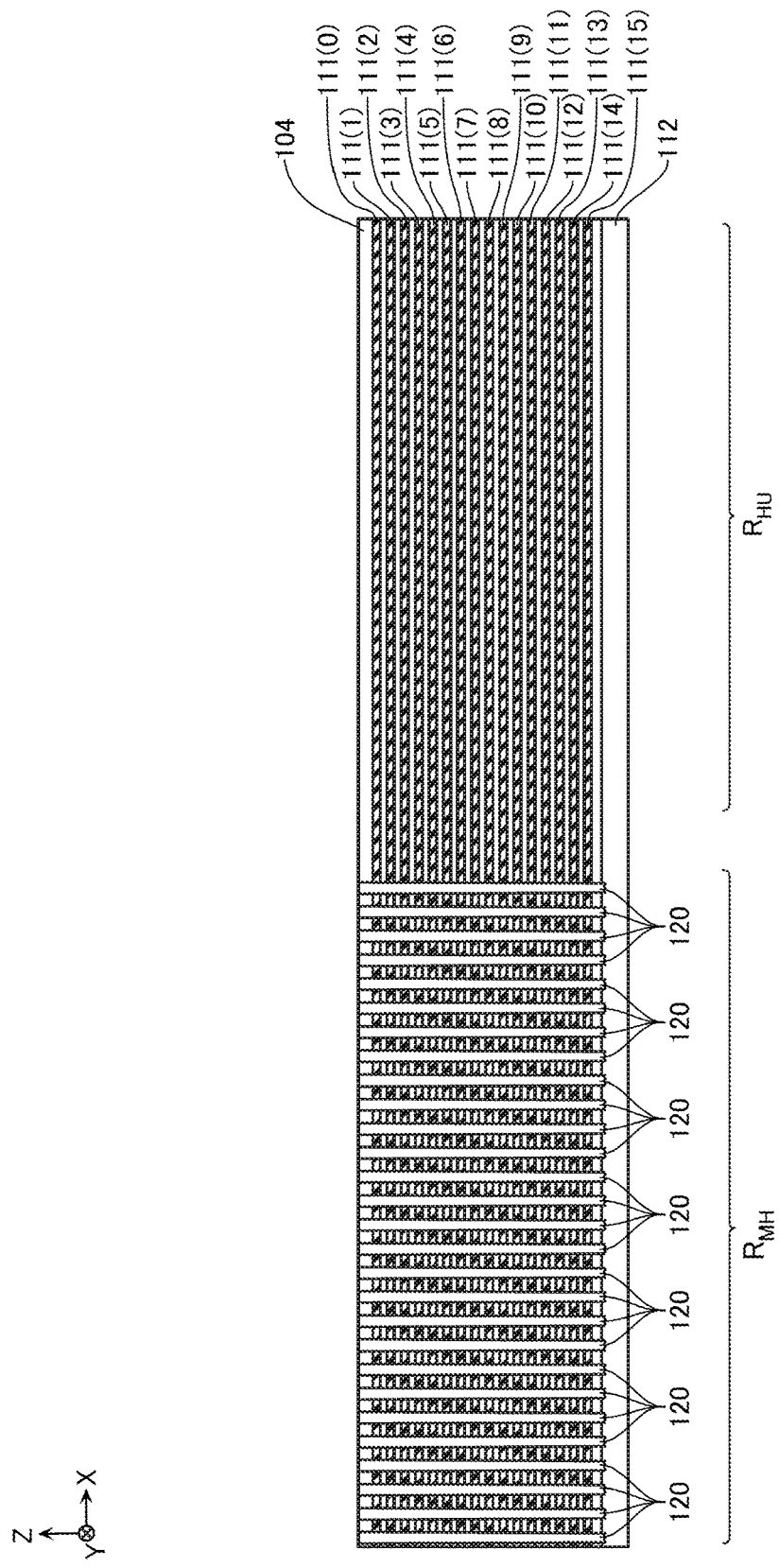
FIG. 9 is a schematic cross-sectional view for describing the manufacturing method.

Next, for example, as illustrated in FIG. 9, a plurality of the semiconductor layers 120 are formed. In this process, for example, an insulating layer 104 of silicon oxide ($SiO_2$) or the like is formed on the top surface of the structure described with reference to FIG. 8 by the method, such as CVD. Next, through holes penetrating the insulating layer 104, the plurality of insulating layers 101, and the plurality of sacrifice layers 111 are formed by a method, such as Reactive Ion Etching (RIE). The gate insulating film 130 (FIG. 5) and the semiconductor layer 120 are formed on an inner peripheral surface of the through hole by the method, such as CVD.

Figure 10:
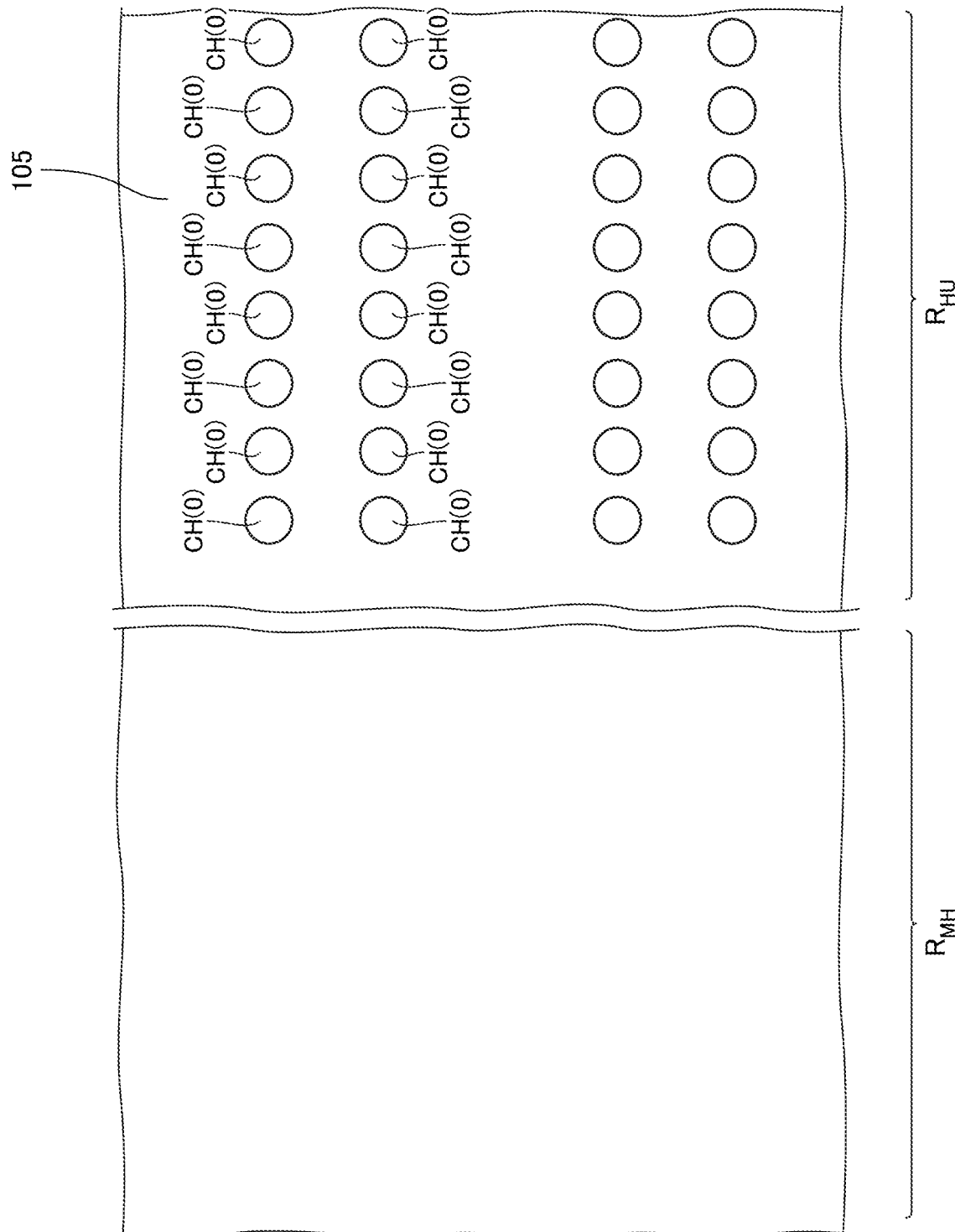
FIG. 10 is a schematic plan view for describing the manufacturing method.
Figure 11:
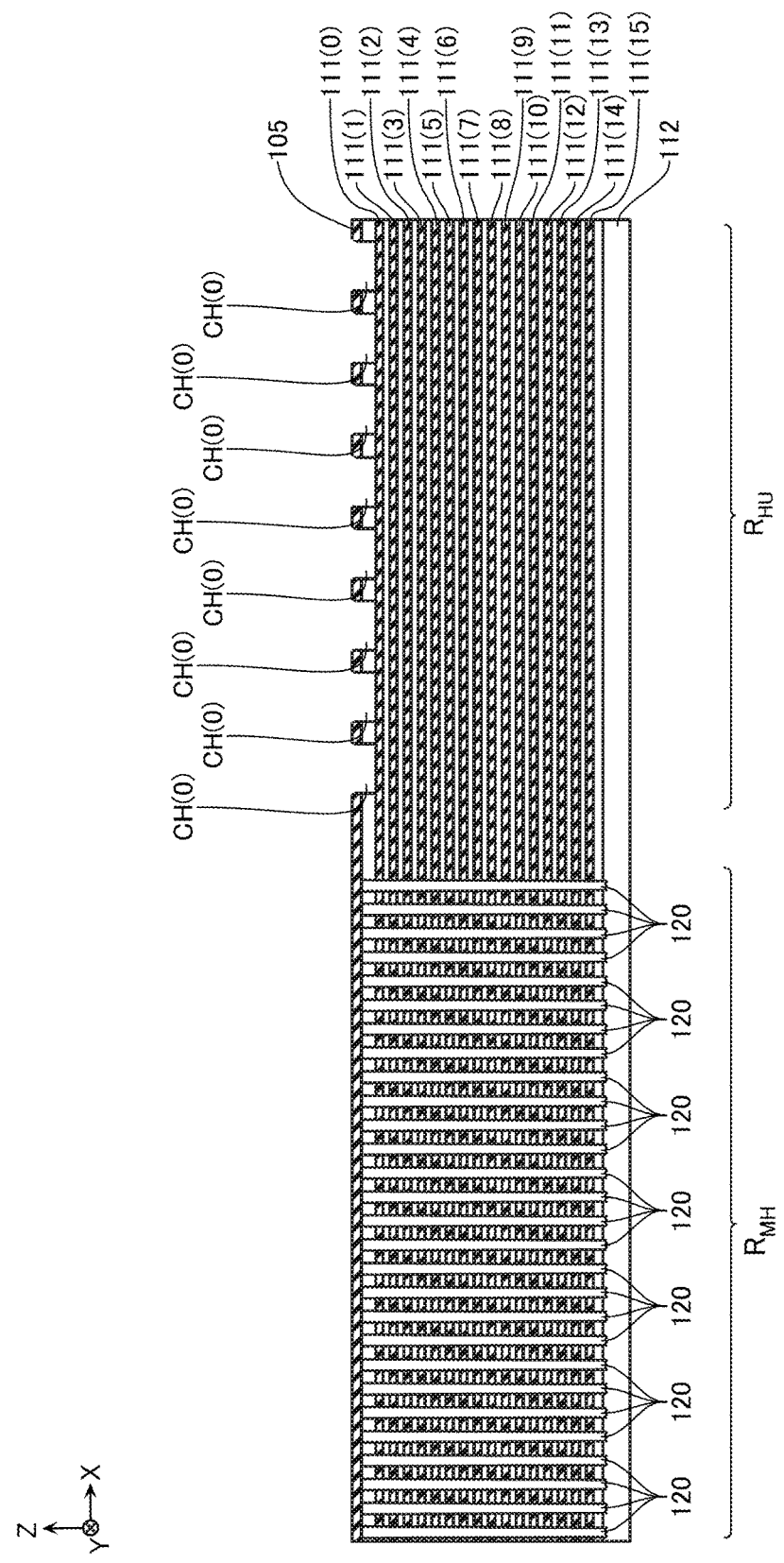
FIG. 11 is a schematic cross-sectional view for describing the manufacturing method.

Next, for example, as illustrated in FIG. 10 and FIG. 11, a plurality of contact holes CH(0) are formed at positions corresponding to the contact electrodes CC. For example, a hard mask 105 is formed on the top surface of the structure described with reference to FIG. 9. Next, through holes that penetrate the hard mask 105 and the insulating layer 104 and exposes the top surface of the sacrifice layer 111 are formed by the method, such as RIE.

In the following description, the n-th (n is an integer of 1 or more) sacrifice layer 111 counted from the upper side is referred to as the sacrifice layer 111(n−1) in some cases. Among the plurality of contact holes CH, the one that exposes the top surface of the sacrifice layer 111(n) and penetrates all the sacrifice layers 111 disposed thereabove is referred to as the contact hole CH(n) in some cases.

Figure 12:
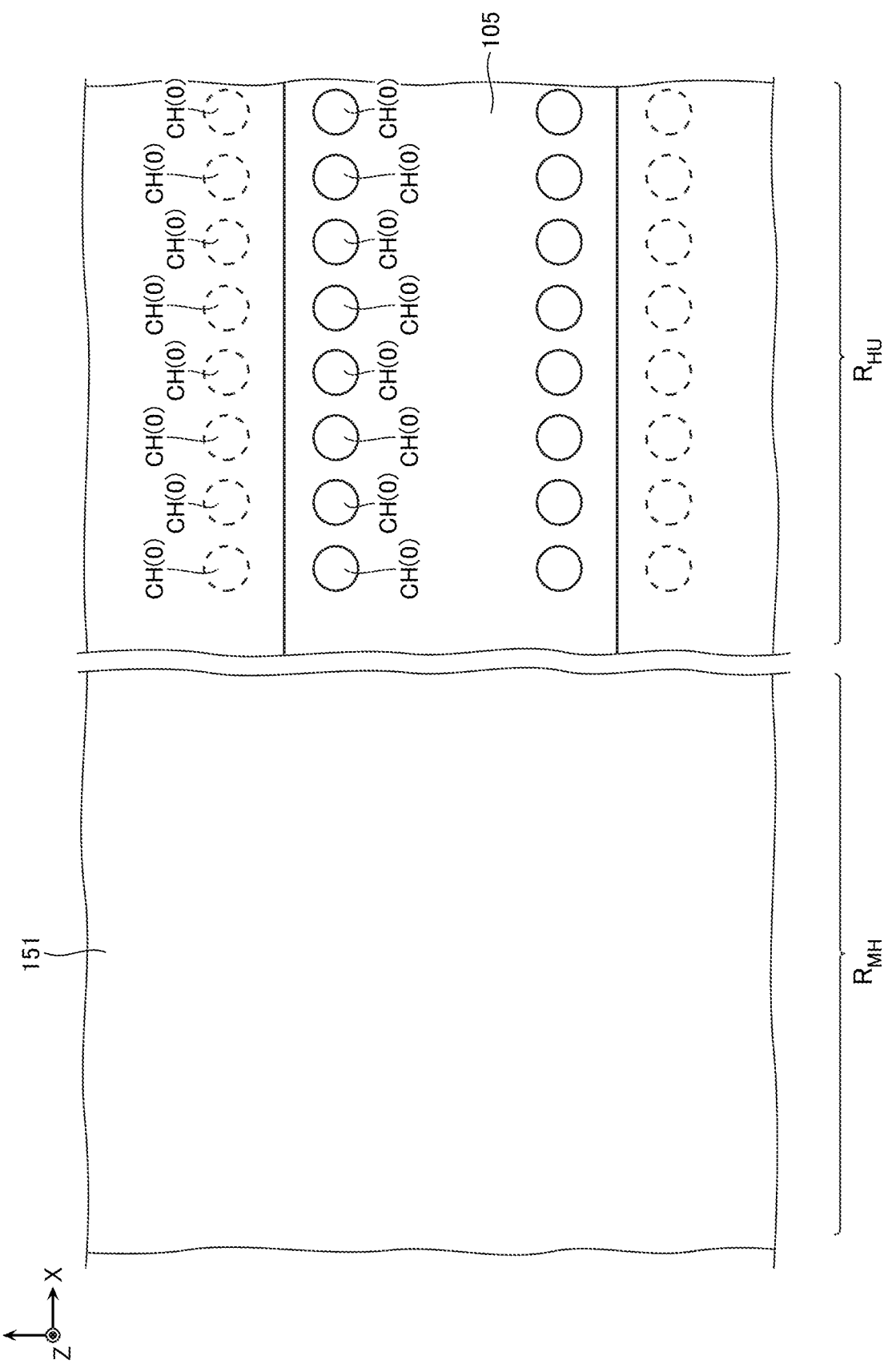
FIG. 12 is a schematic plan view for describing the manufacturing method.
Figure 13:
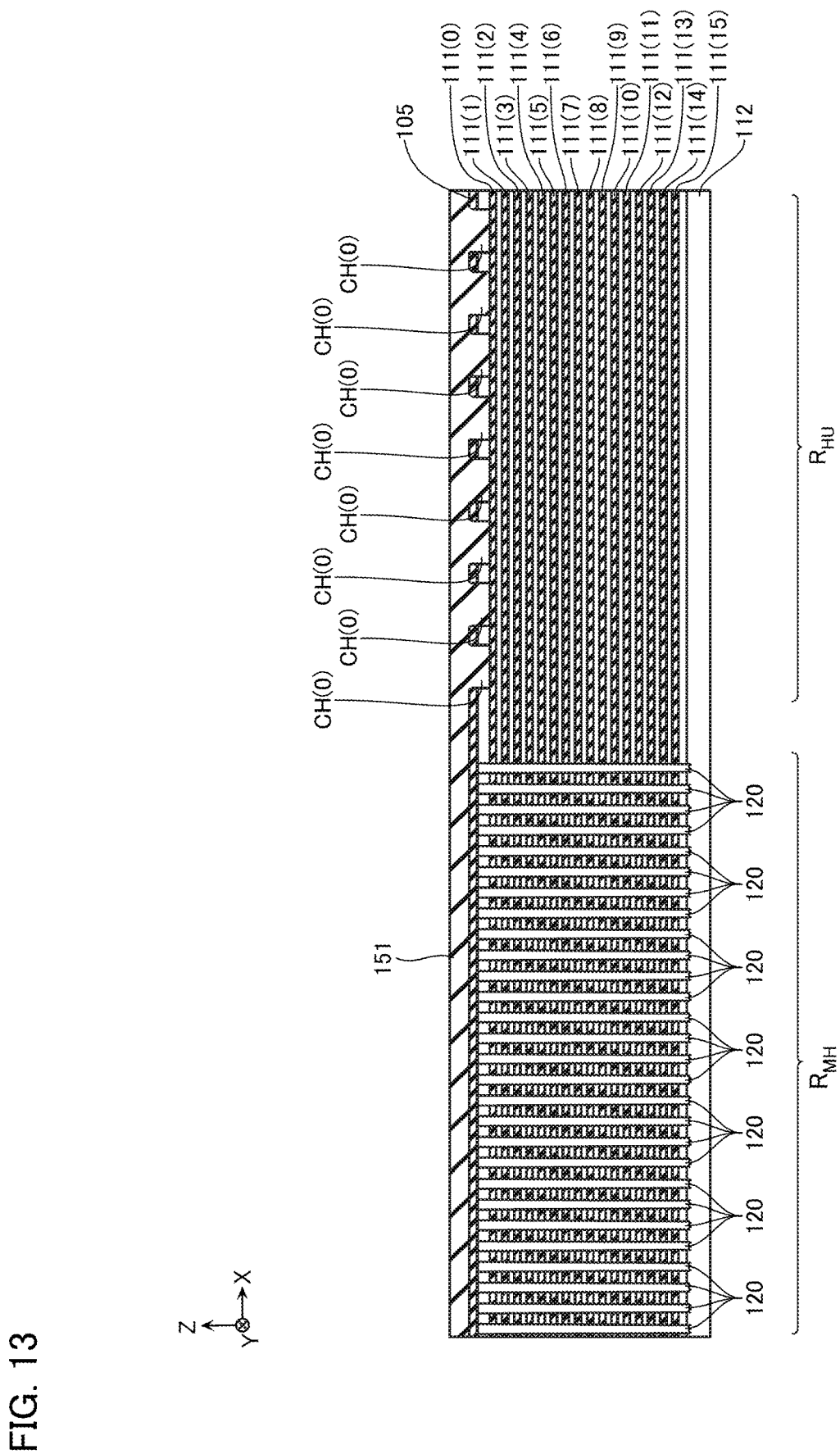
FIG. 13 is a schematic cross-sectional view for describing the manufacturing method.
Figure 14:
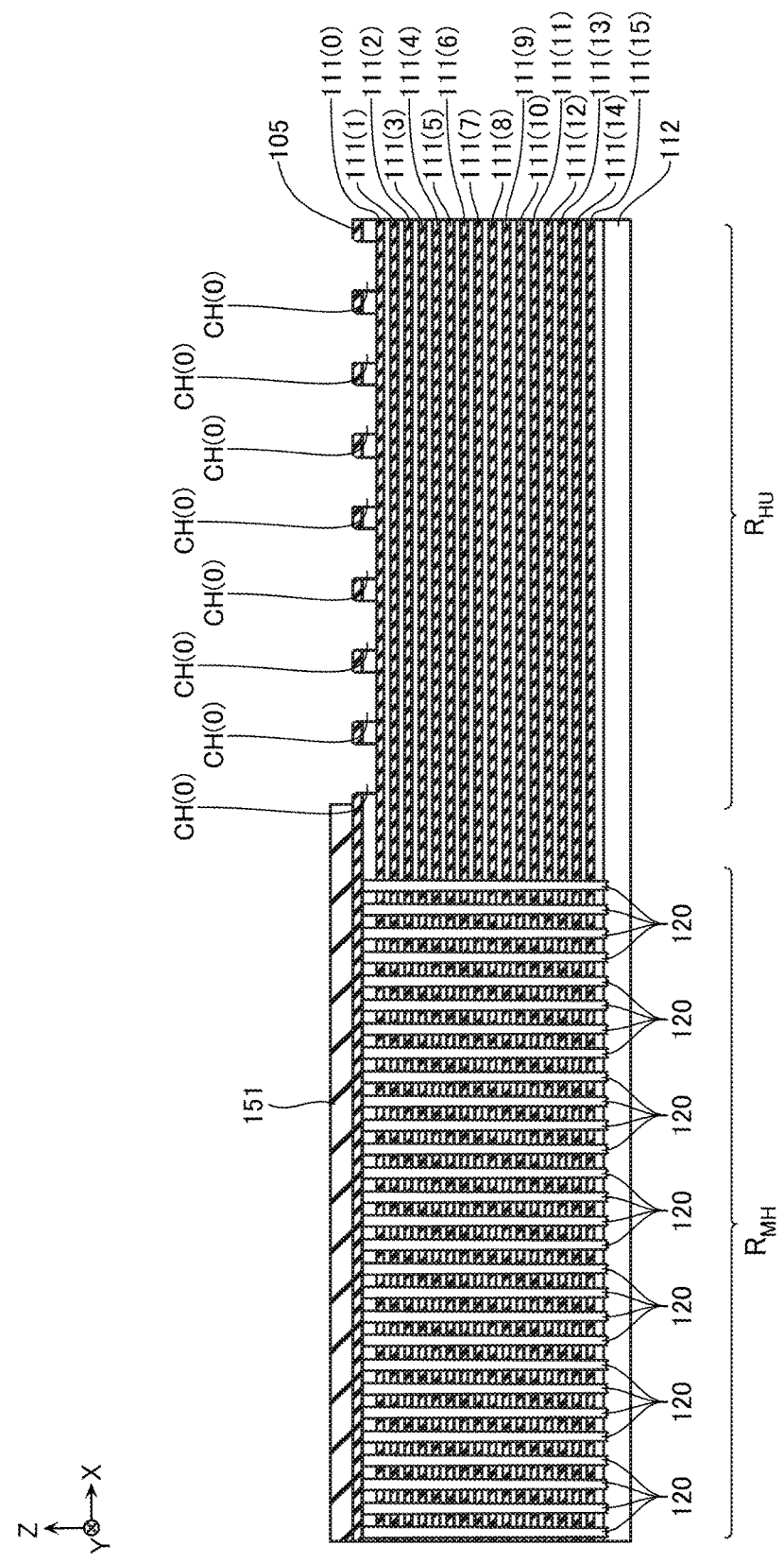
FIG. 14 is a schematic cross-sectional view for describing the manufacturing method.

Next, for example, as illustrated in FIG. 12 to FIG. 14, a resist 151 is formed. The resist 151 covers the contact holes CH corresponding to the contact electrode row CCG(0), and exposes the contact holes CH corresponding to the contact electrode row CCG(1).

Figure 15:
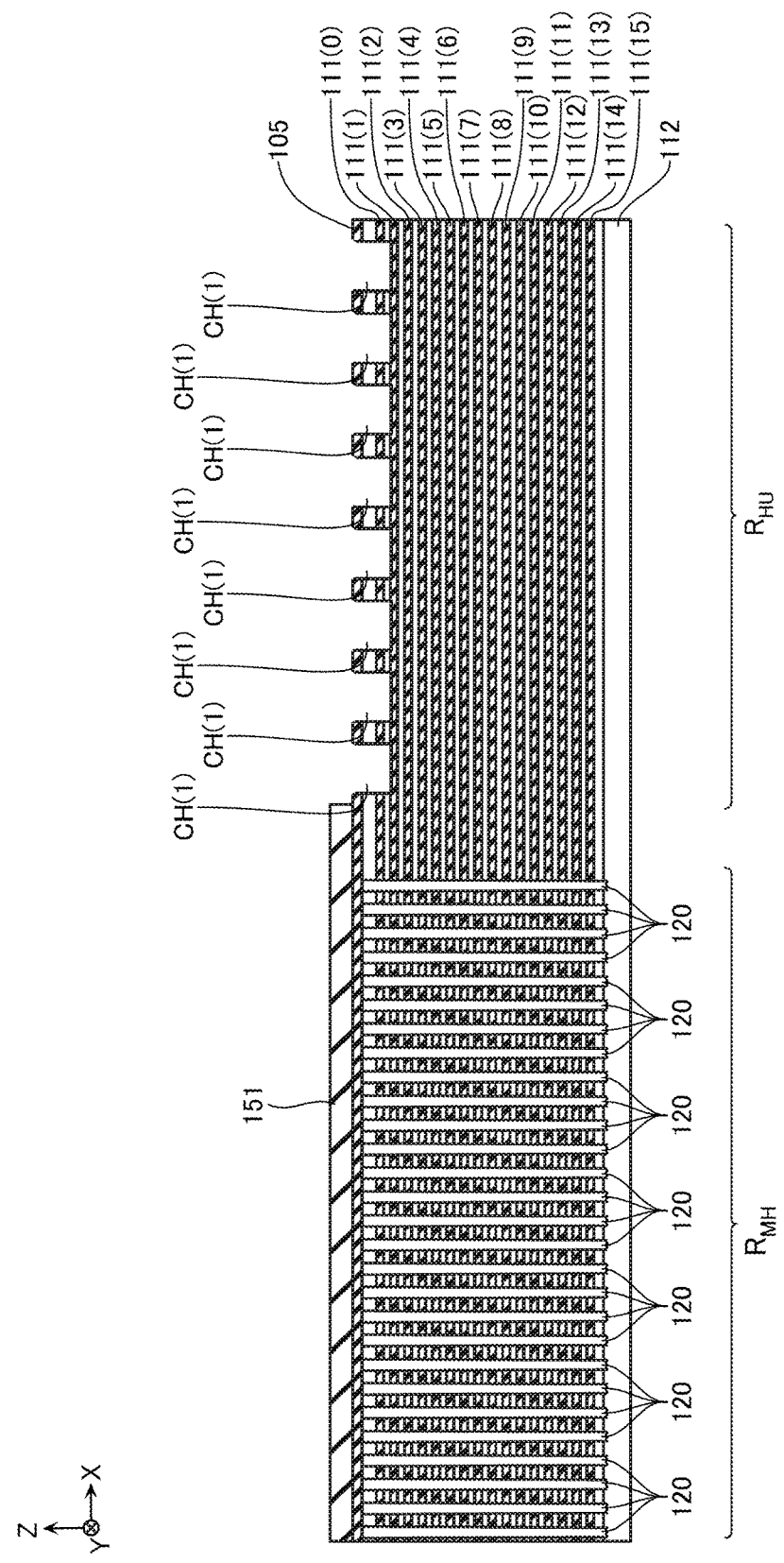
FIG. 15 is a schematic cross-sectional view for describing the manufacturing method.

Next, for example, as illustrated in FIG. 15, among the contact holes CH, in the portion not covered with the resist 151, the sacrifice layer 111 and the insulating layer 101 are removed by one layer for each. Accordingly, contact holes CH(1) are formed at positions corresponding to the contact electrodes CC in the contact electrode row CCG(1). This process is performed by RIE or the like.

Figure 16:
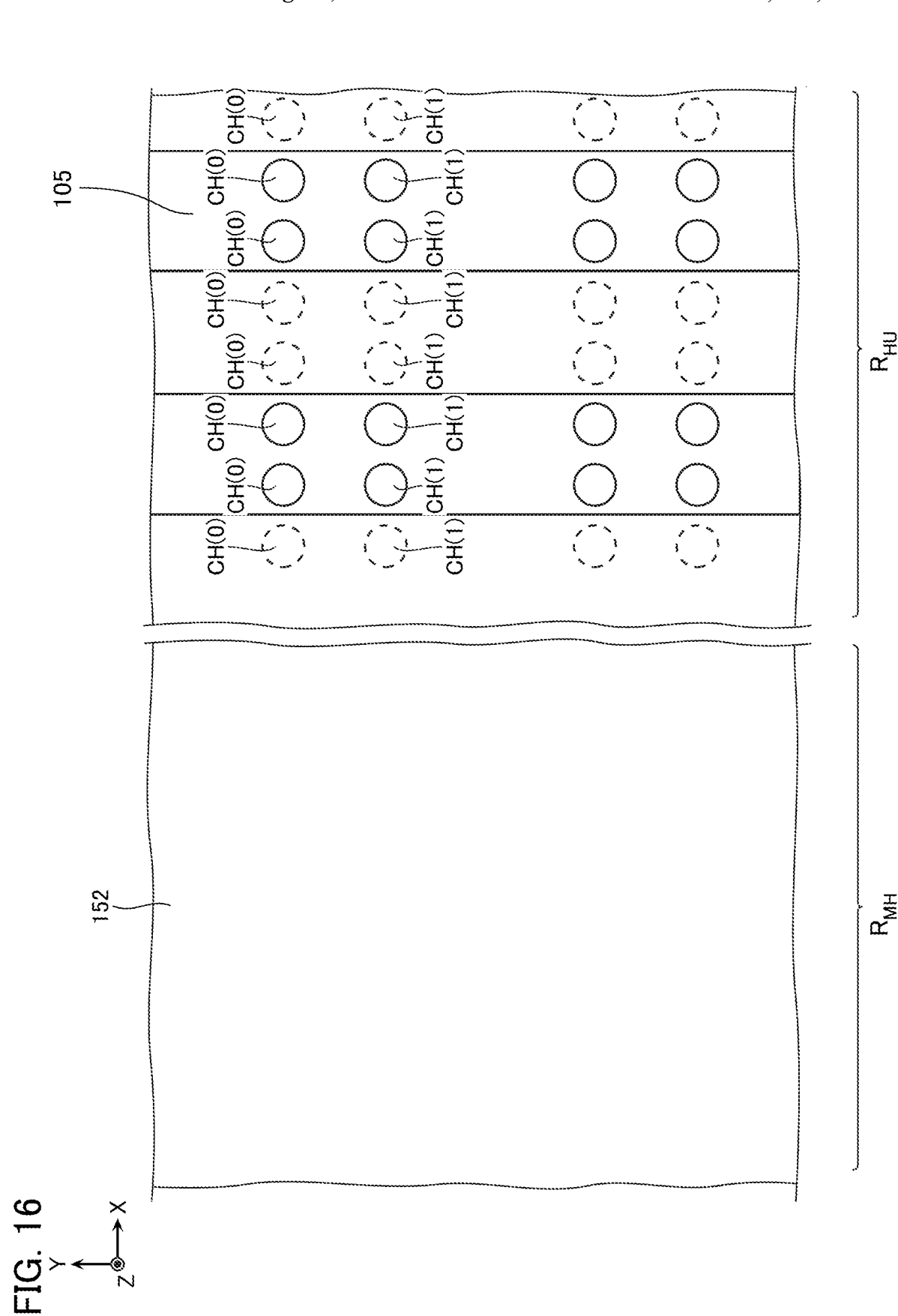
FIG. 16 is a schematic plan view for describing the manufacturing method.
Figure 17:
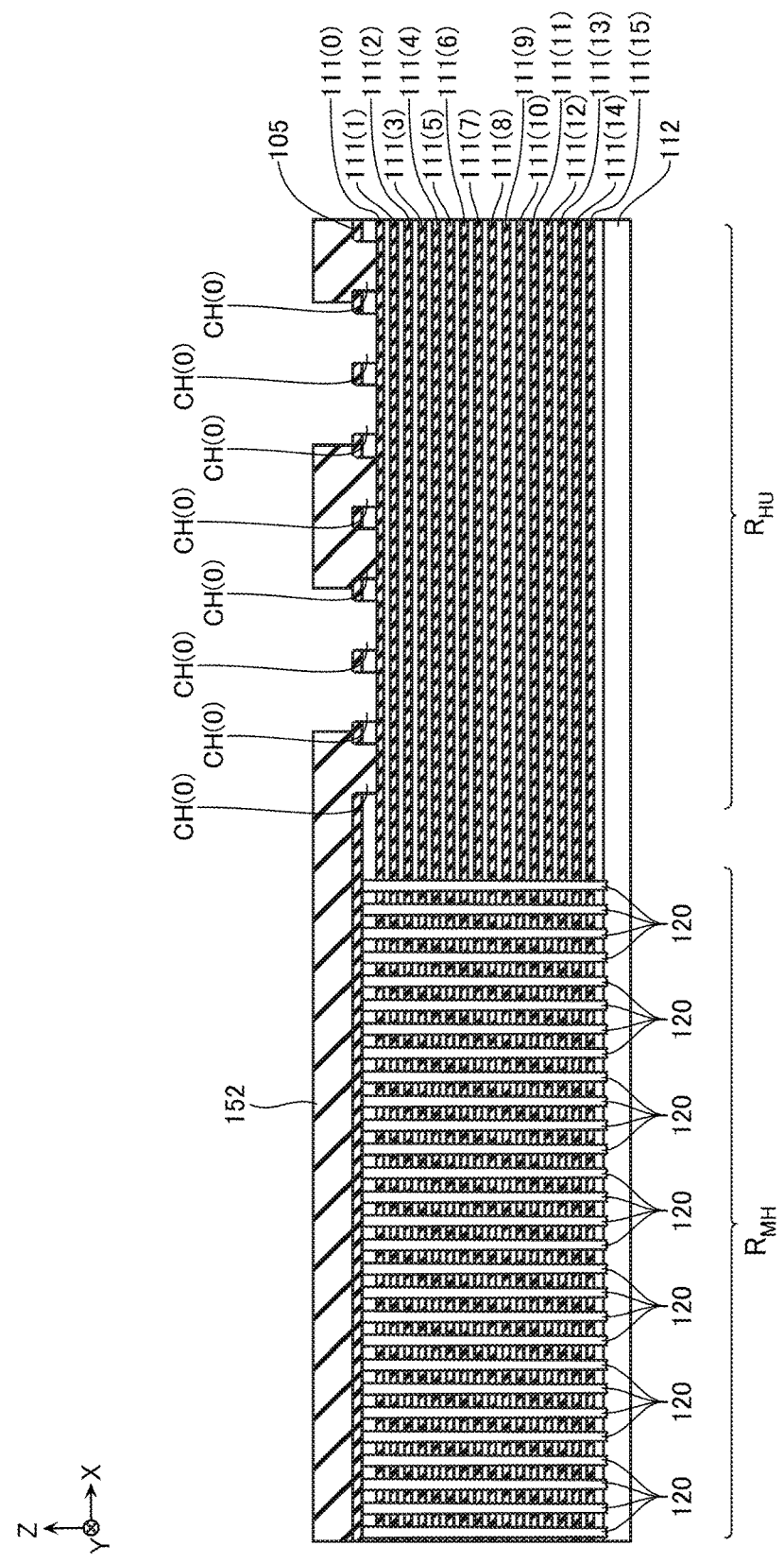
FIG. 17 is a schematic cross-sectional view for describing the manufacturing method.
Figure 18:
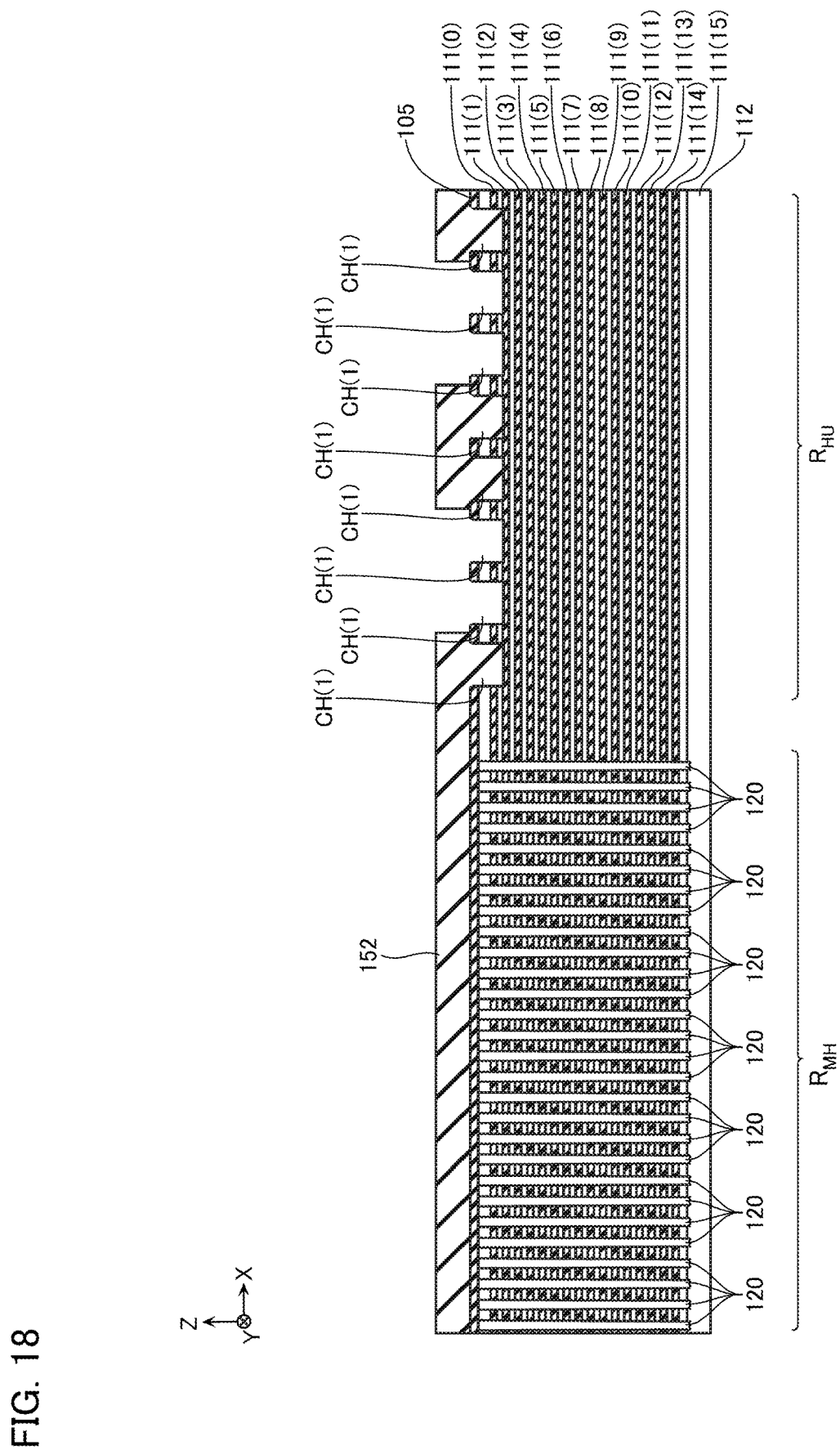
FIG. 18 is a schematic cross-sectional view for describing the manufacturing method.

Next, for example, as illustrated in FIG. 16 to FIG. 18, the resist 151 is removed and a resist 152 is formed. The resist 152 covers the 4a+1-th and 4a+4-th (a is an integer of 0 or more) contact holes CH counted from the side close to the memory hole region $R_{MH}$ among the plurality of contact holes CH arranged in the X-direction, and exposes the other contact holes CH. The resist 152 has a film thickness (thickness in the Z-direction) larger than a film thickness of the resist 151.

Figure 19:
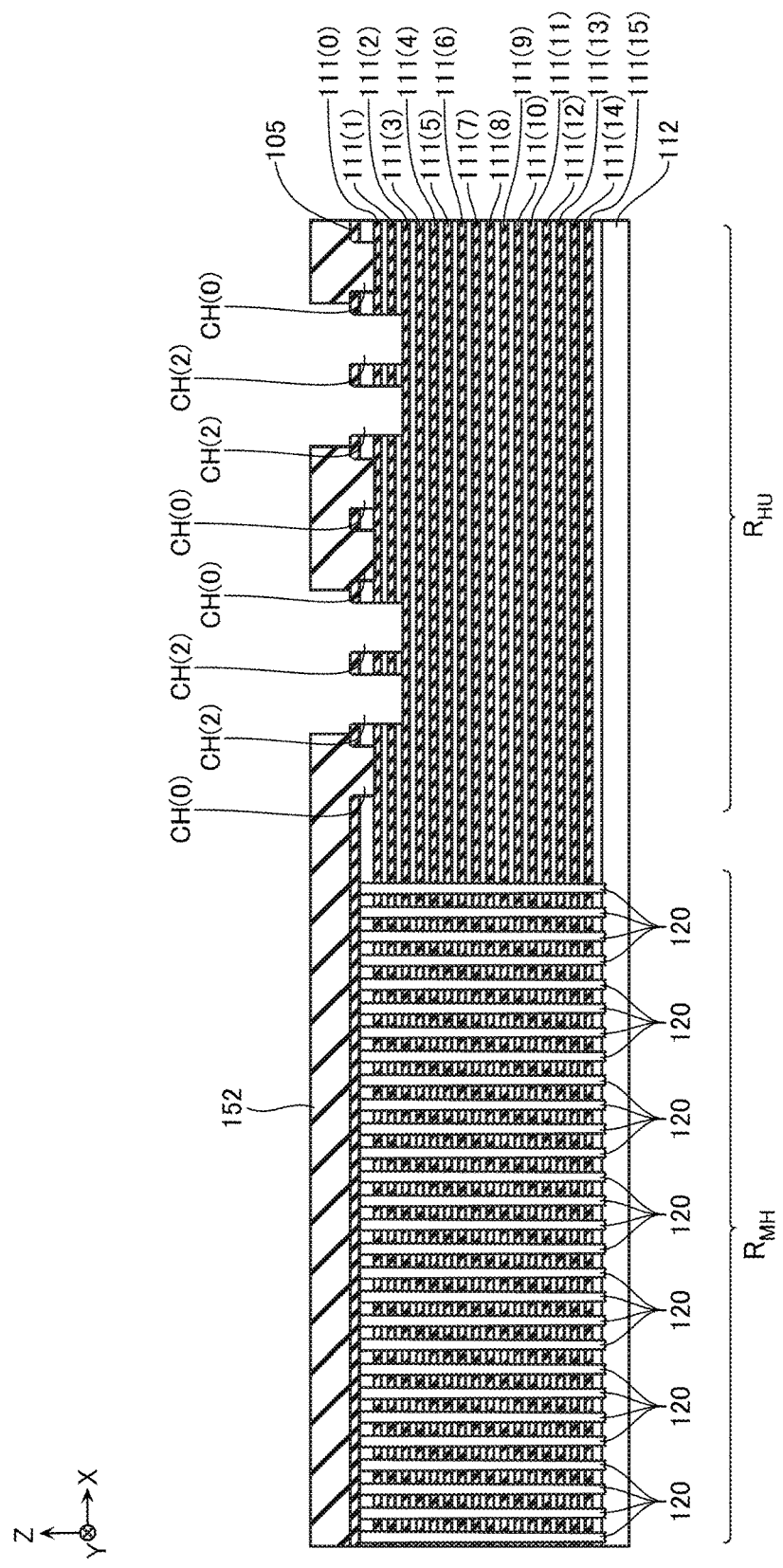
FIG. 19 is a schematic cross-sectional view for describing the manufacturing method.
Figure 20:
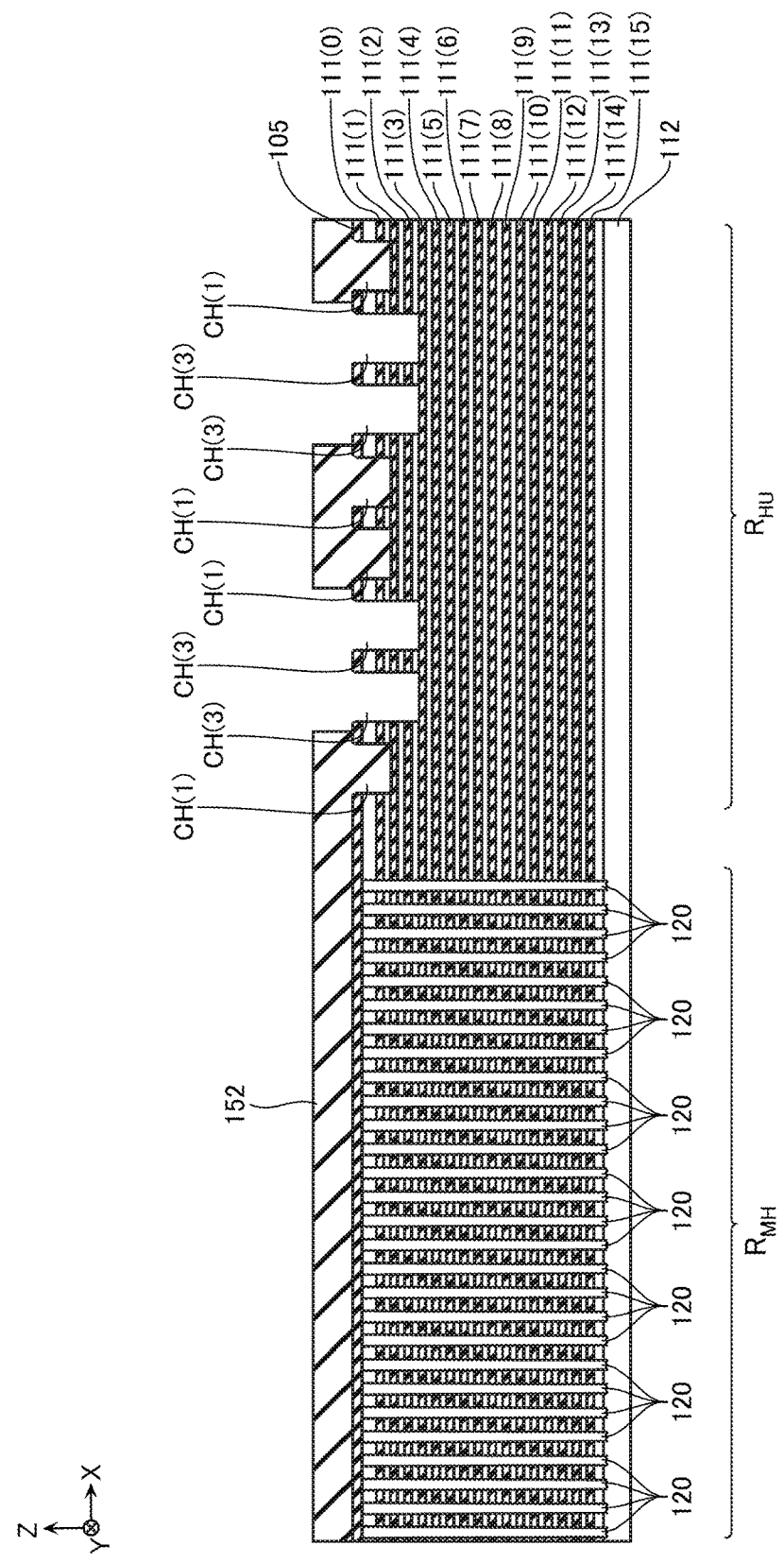
FIG. 20 is a schematic cross-sectional view for describing the manufacturing method.

Next, for example, as illustrated in FIG. 19 and FIG. 20, among the contact holes CH, in the portion not covered with the resist 152, the sacrifice layers 111 and the insulating layers 101 are removed by two layers for each. Accordingly, contact holes CH(2) are formed at portions corresponding to the 4a+2-th and the 4a+3-th counted from the side close to the memory hole region $R_{MH}$ among the plurality of contact holes CH corresponding to the contact electrode row CCG (0). Contact holes CH(3) are formed at portions corresponding to the 4a+2-th and the 4a+3-th counted from the side close to the memory hole region $R_{MH}$ among the plurality of contact holes CH corresponding to the contact electrode row CCG(1).

Figure 21:
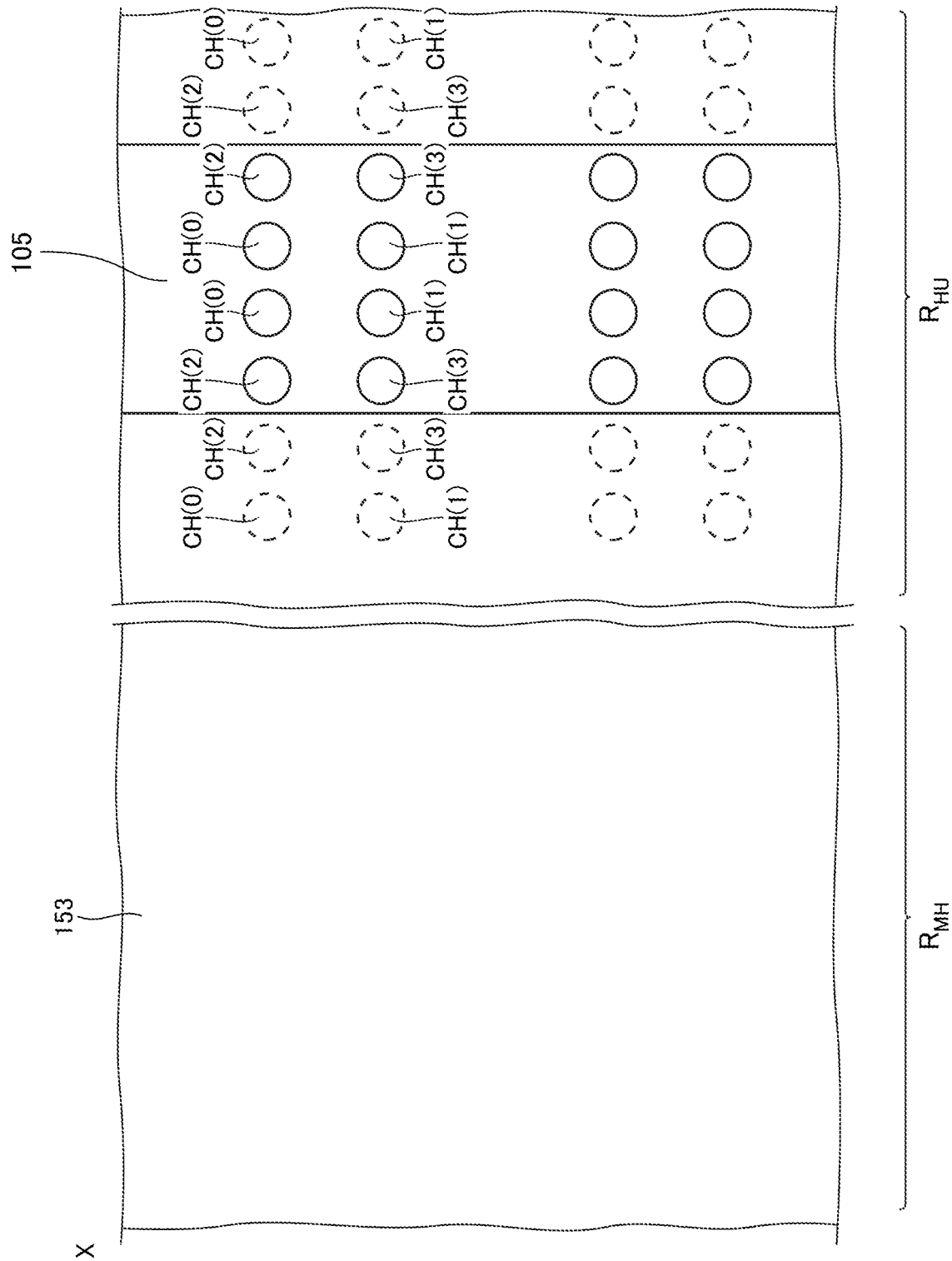
FIG. 21 is a schematic plan view for describing the manufacturing method.
Figure 22:
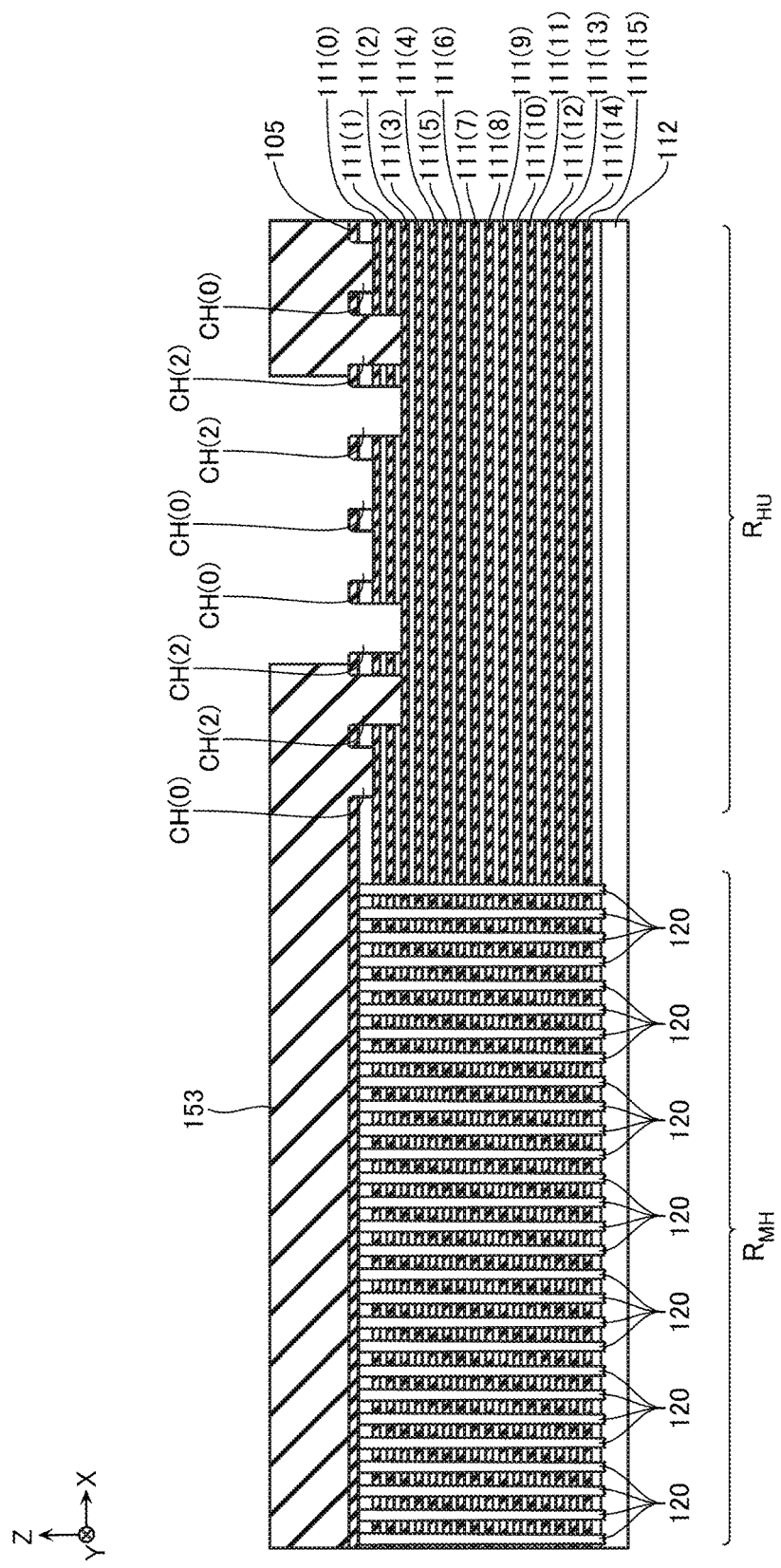
FIG. 22 is a schematic cross-sectional view for describing the manufacturing method.
Figure 23:
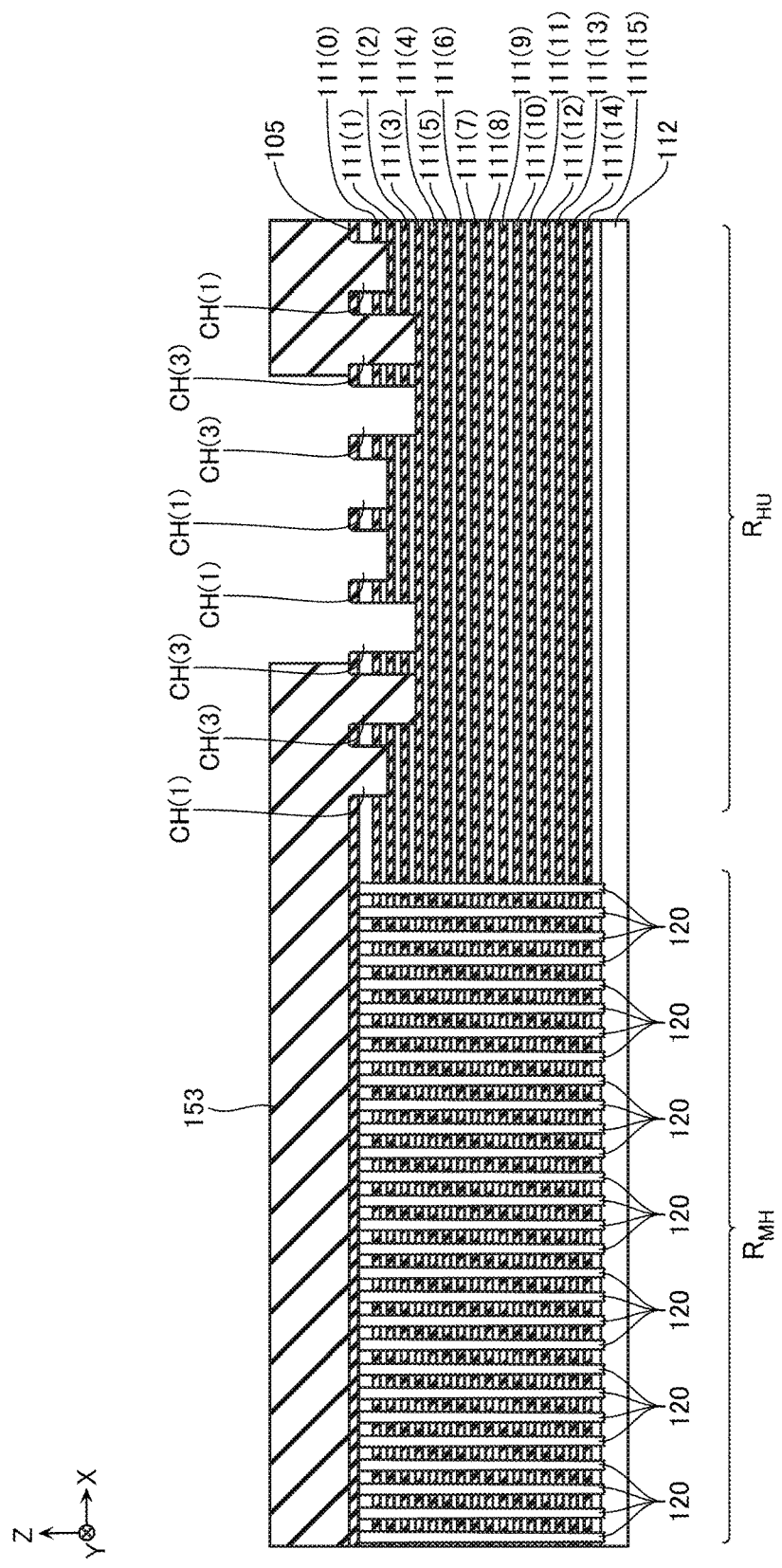
FIG. 23 is a schematic cross-sectional view for describing the manufacturing method.

Next, for example, as illustrated in FIG. 21 to FIG. 23, the resist 152 is removed, and a resist 153 is formed. The resist 153 covers the 8a+1-th, 8a+2-th, 8a+7-th, and 8a+8-th (a is an integer of 0 or more) contact holes CH counted from the side close to the memory hole region $R_{MH}$ among the plurality of contact holes CH arranged in the X-direction, and exposes the other contact holes CH. The resist 153 has a film thickness (thickness in the Z-direction) larger than the film thickness of the resist 152.

Figure 24:
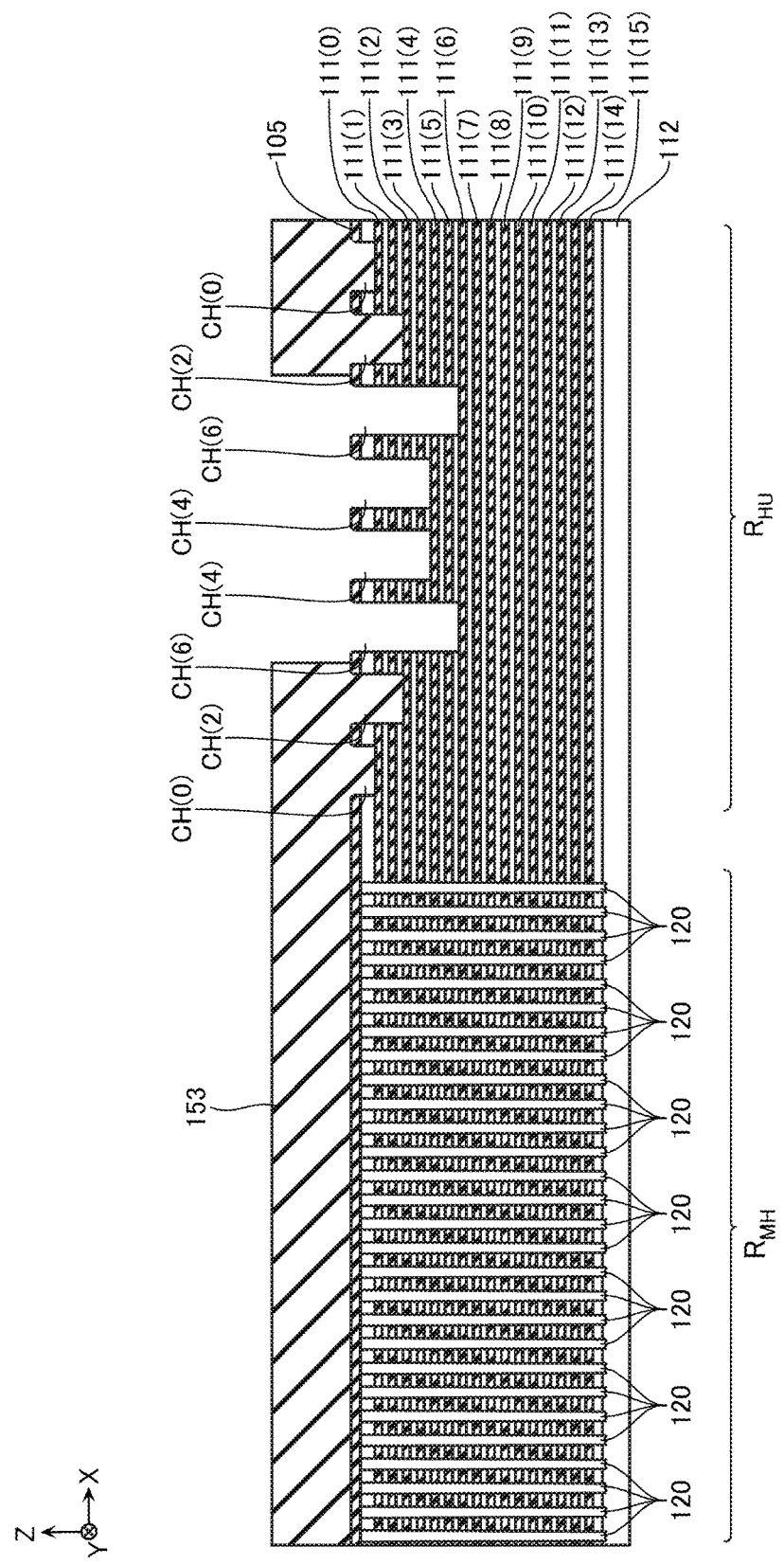
FIG. 24 is a schematic cross-sectional view for describing the manufacturing method.
Figure 25:
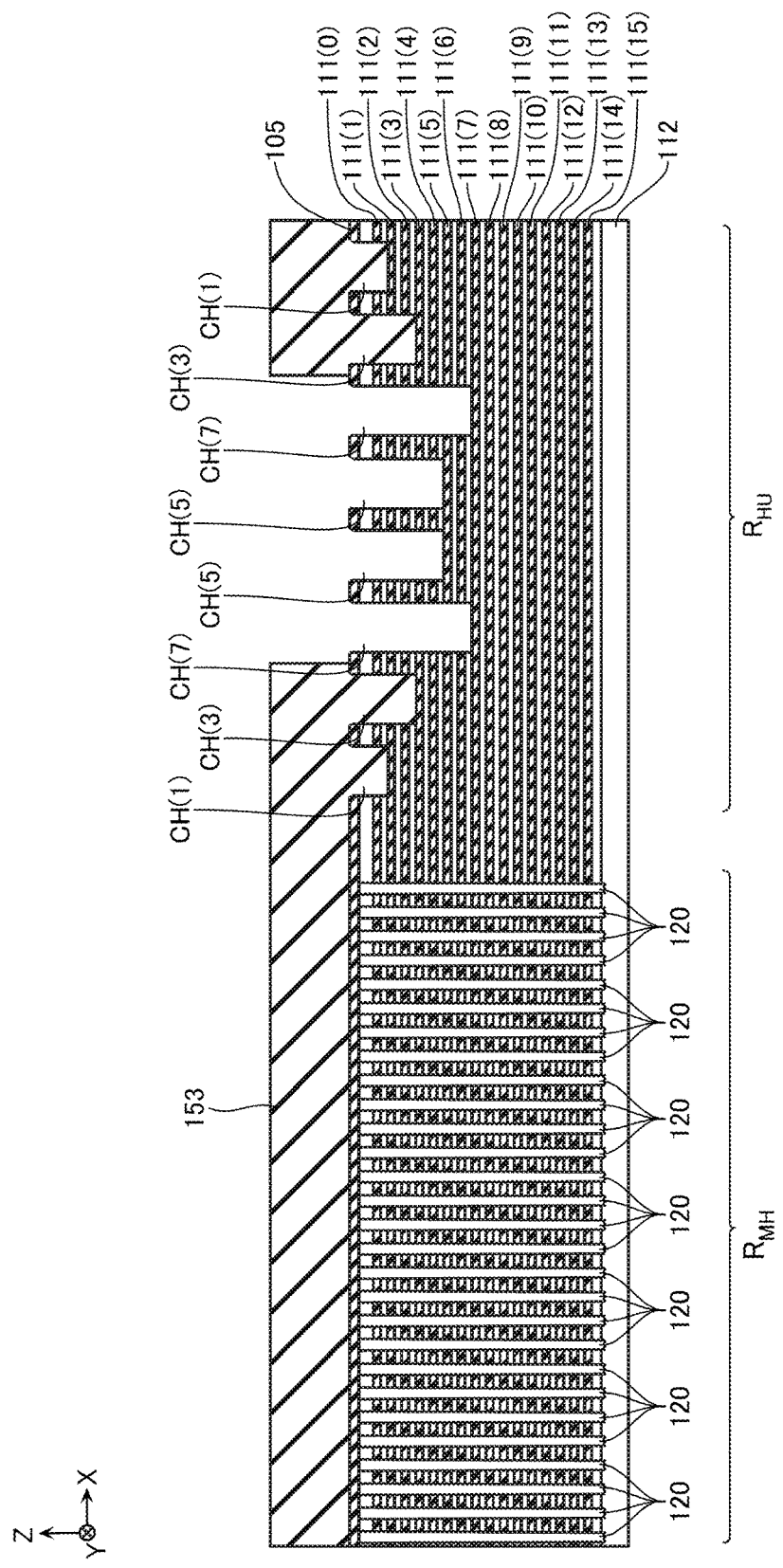
FIG. 25 is a schematic cross-sectional view for describing the manufacturing method.

Next, for example, as illustrated in FIG. 24 and FIG. 25, among the contact holes CH, in the portion not covered with the resist 153, the sacrifice layers 111 and the insulating layers 101 are removed by four layers for each. Accordingly, contact holes CH(4) and CH(6) are formed at portions corresponding to the 8a+3-th to the 8a+6-th counted from the side close to the memory hole region $R_{MH}$ among the plurality of contact holes CH corresponding to the contact electrode row CCG(0). Contact holes CH(5) and CH(7) are formed at portions corresponding to the 8a+3-th to the 8a+6-th counted from the side close to the memory hole region $R_{MH}$ among the plurality of contact holes CH corresponding to the contact electrode row CCG(1). This process is performed by RIE or the like.

Figure 26:
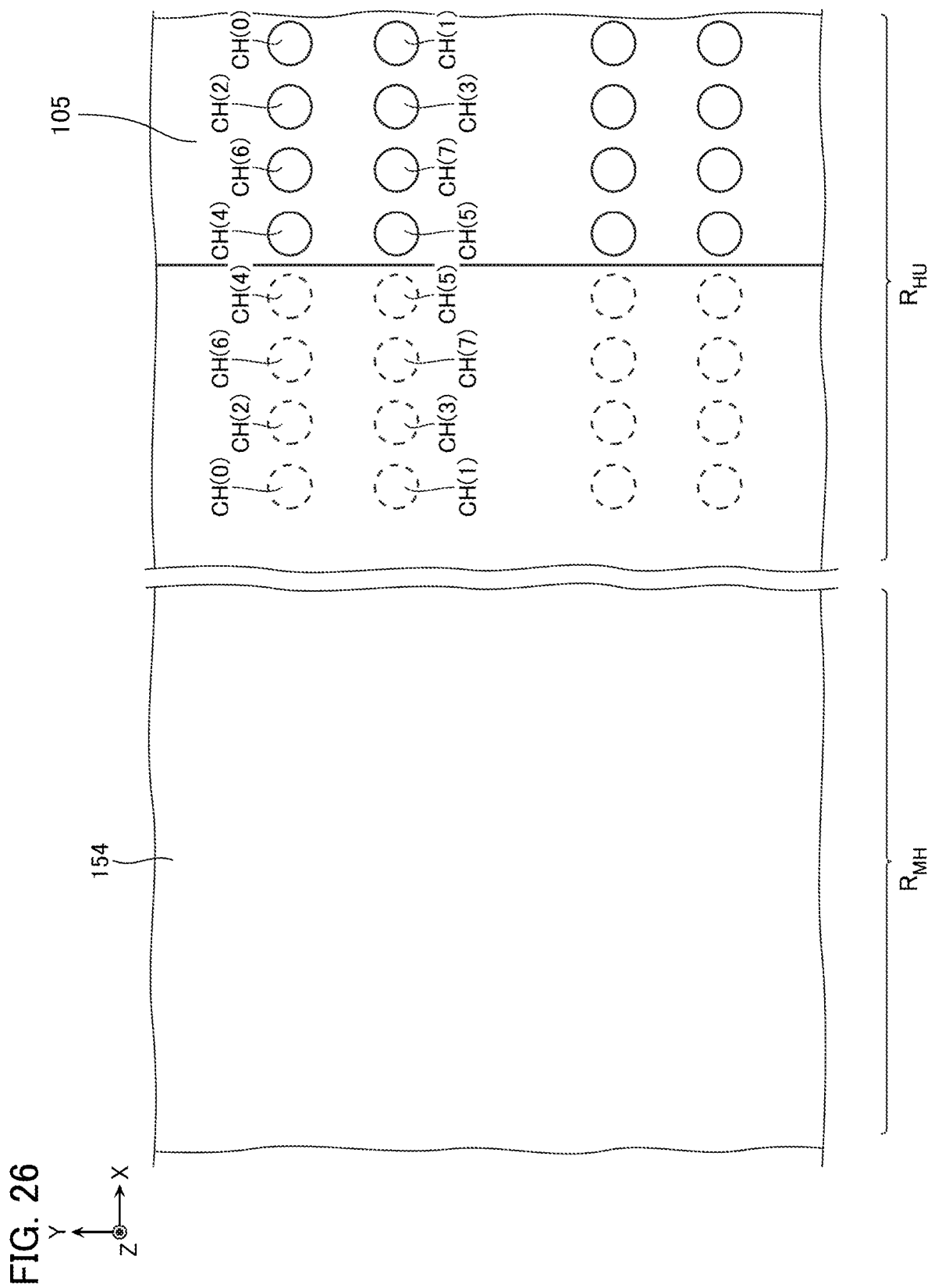
FIG. 26 is a schematic plan view for describing the manufacturing method.
Figure 27:
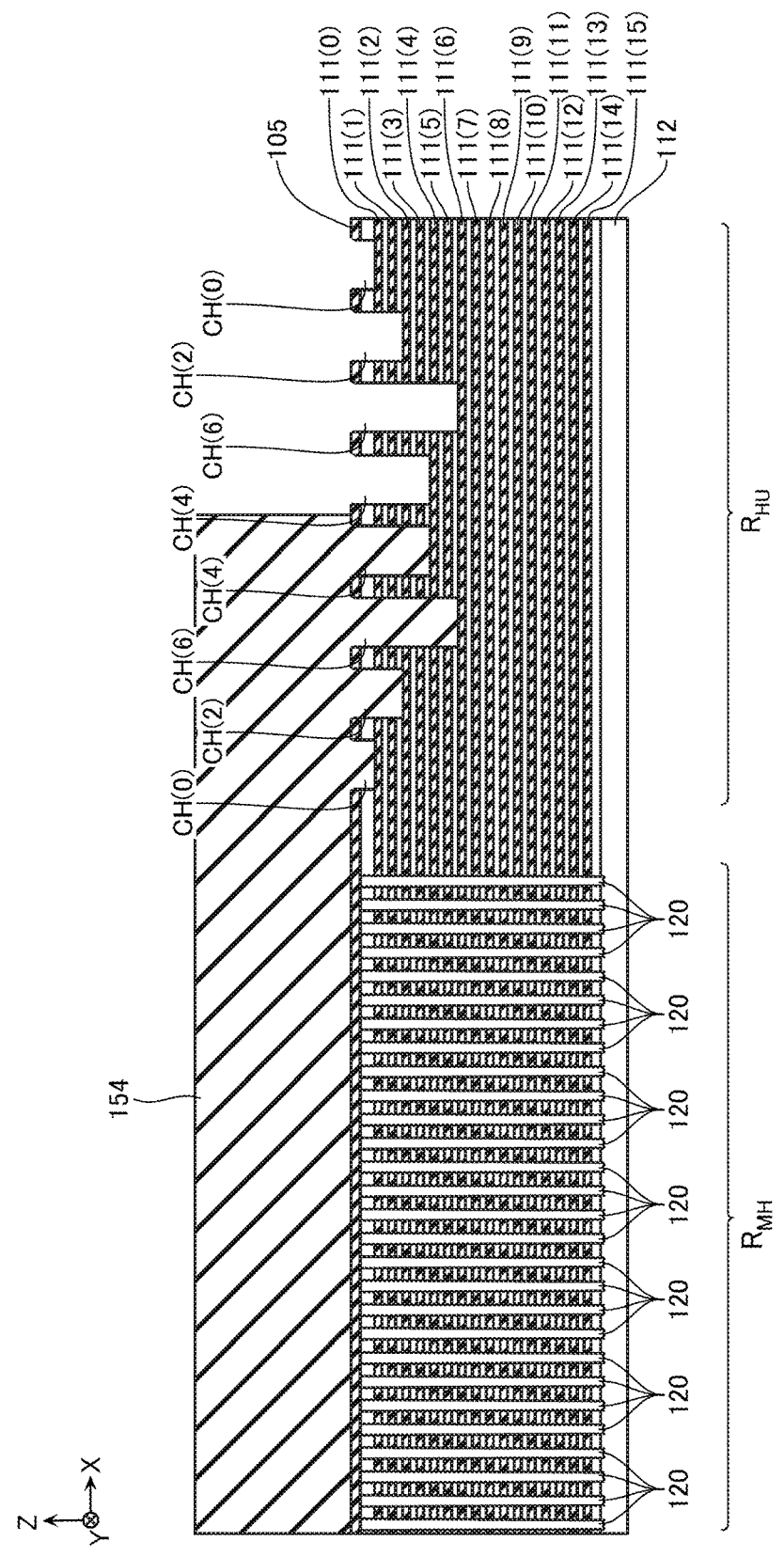
FIG. 27 is a schematic cross-sectional view for describing the manufacturing method.
Figure 28:
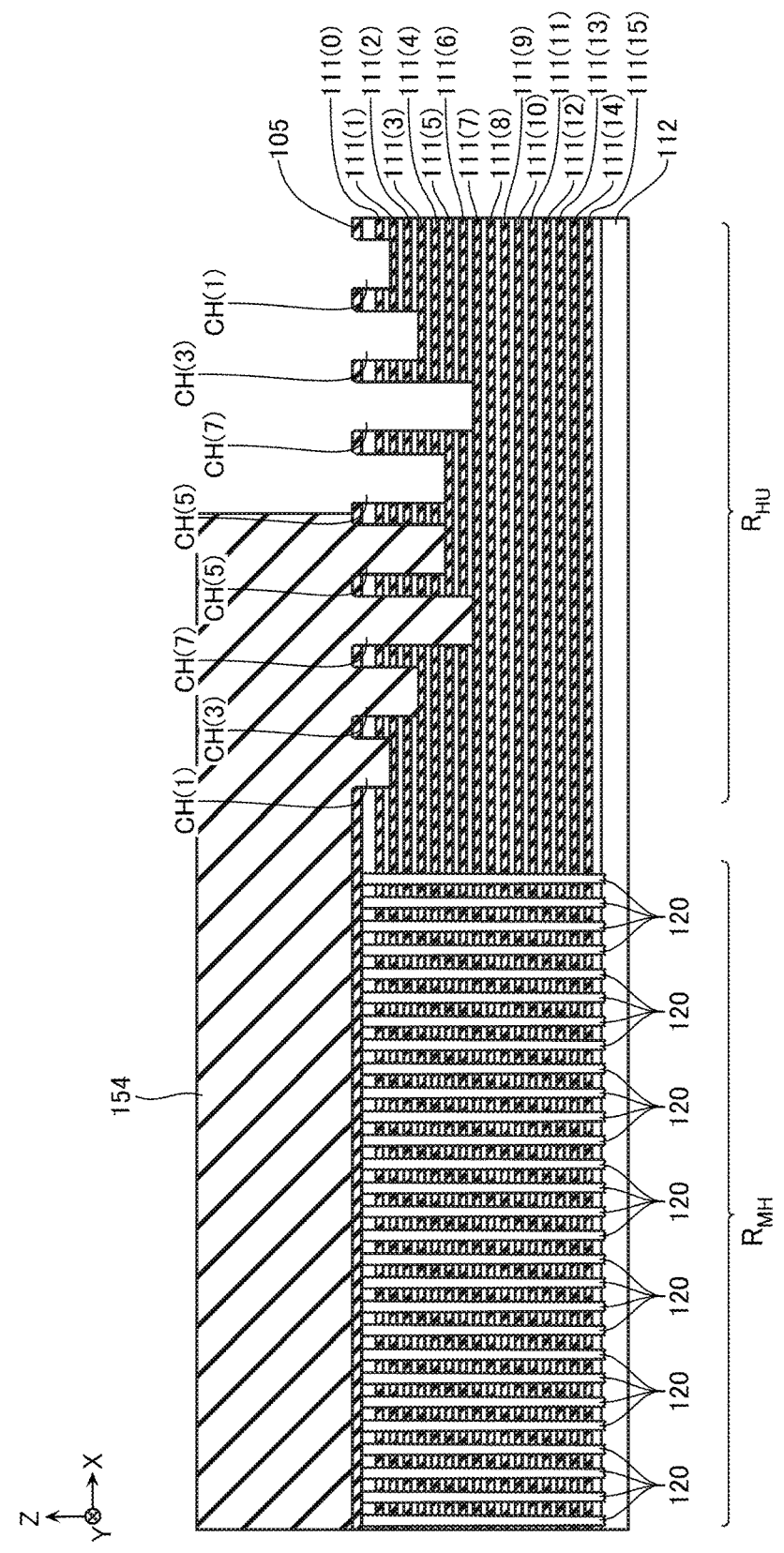
FIG. 28 is a schematic cross-sectional view for describing the manufacturing method.

Next, for example, as illustrated in FIG. 26 to FIG. 28, the resist 153 is removed, and a resist 154 is formed. The resist 154 covers a half close to the memory hole region $R_{MH}$ among the plurality of contact holes CH arranged in the X-direction, and exposes the other contact holes CH. The resist 154 has a film thickness (thickness in the Z-direction) larger than the film thickness of the resist 153.

Figure 29:
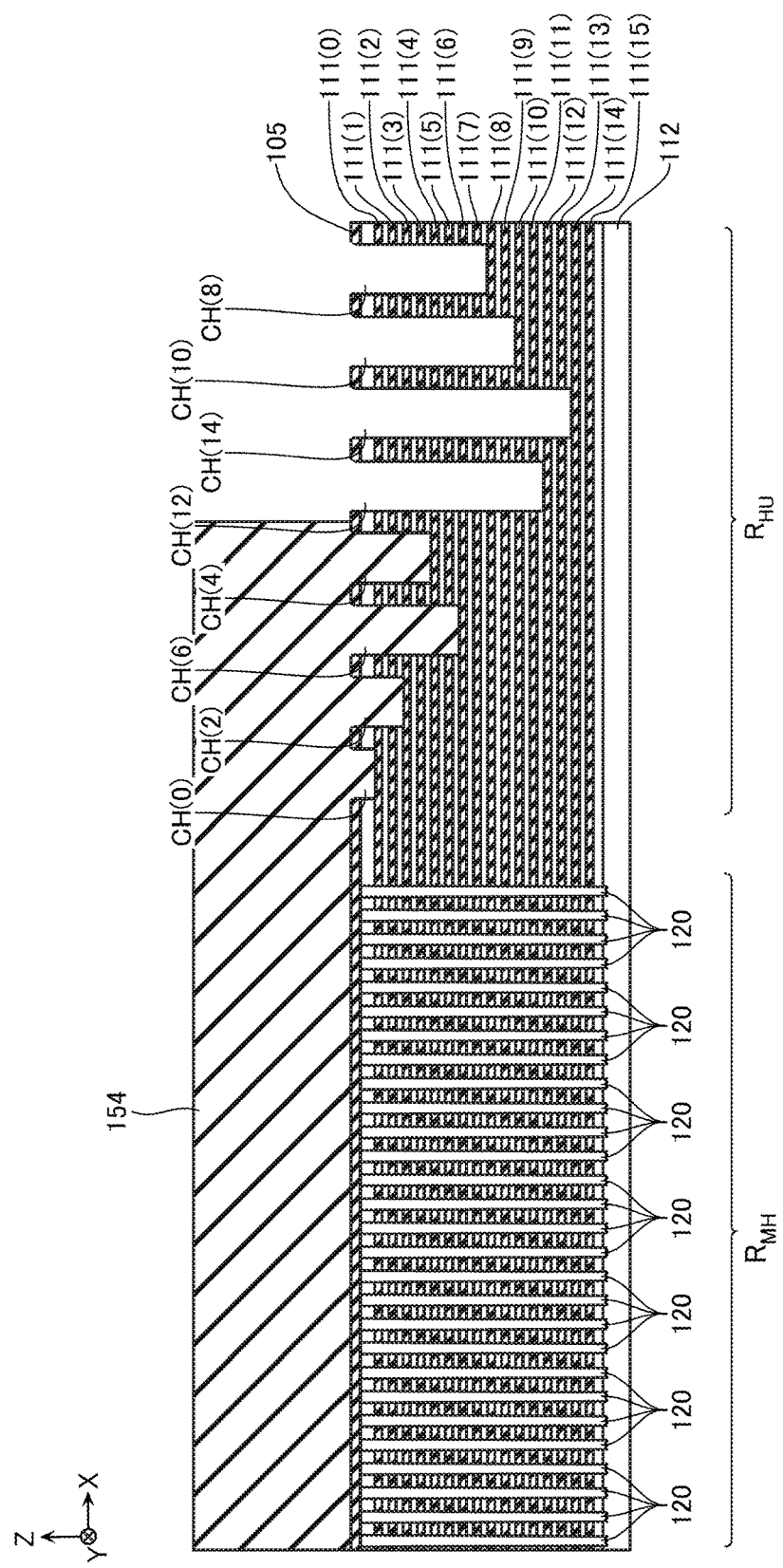
FIG. 29 is a schematic cross-sectional view for describing the manufacturing method.
Figure 30:
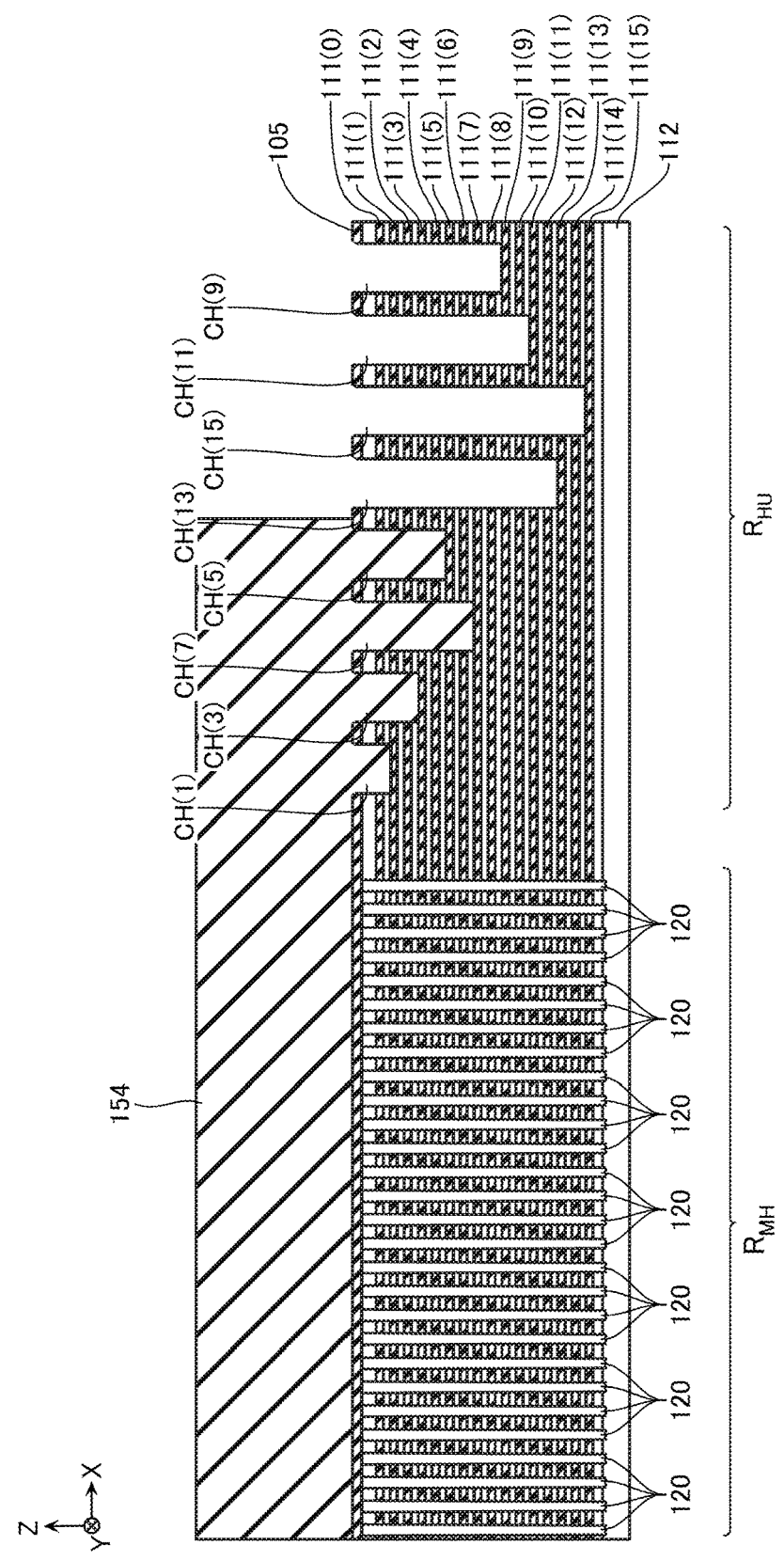
FIG. 30 is a schematic cross-sectional view for describing the manufacturing method.

Next, for example, as illustrated in FIG. 29 and FIG. 30, among the contact holes CH, in the portion not covered with the resist 154, the sacrifice layers 111 and the insulating layers 101 are removed by eight layers for each. Accordingly, contact holes CH(8), CH(10), CH(12), and CH(14) are formed at portions corresponding to a half far from the memory hole region $R_{MH}$ among the plurality of contact holes CH corresponding to the contact electrode row CCG(0). Contact holes CH(9), CH(11), CH(13), and CH(15) are formed at portions corresponding to a half far from the memory hole region $R_{MH}$ among the plurality of contact holes CH corresponding to the contact electrode row CCG(1). This process is performed by RIE or the like.

Figure 31:
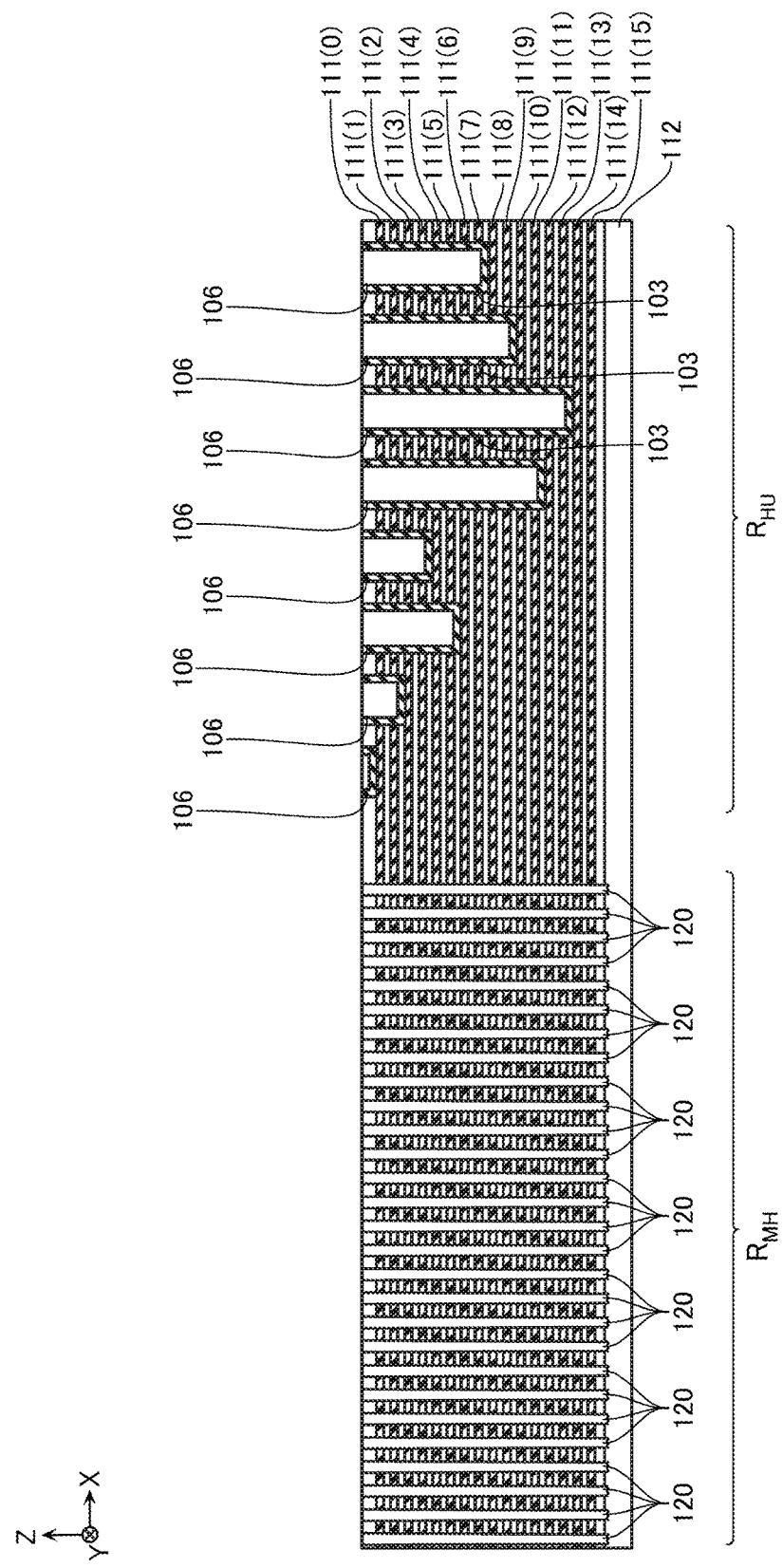
FIG. 31 is a schematic cross-sectional view for describing the manufacturing method.
Figure 32:
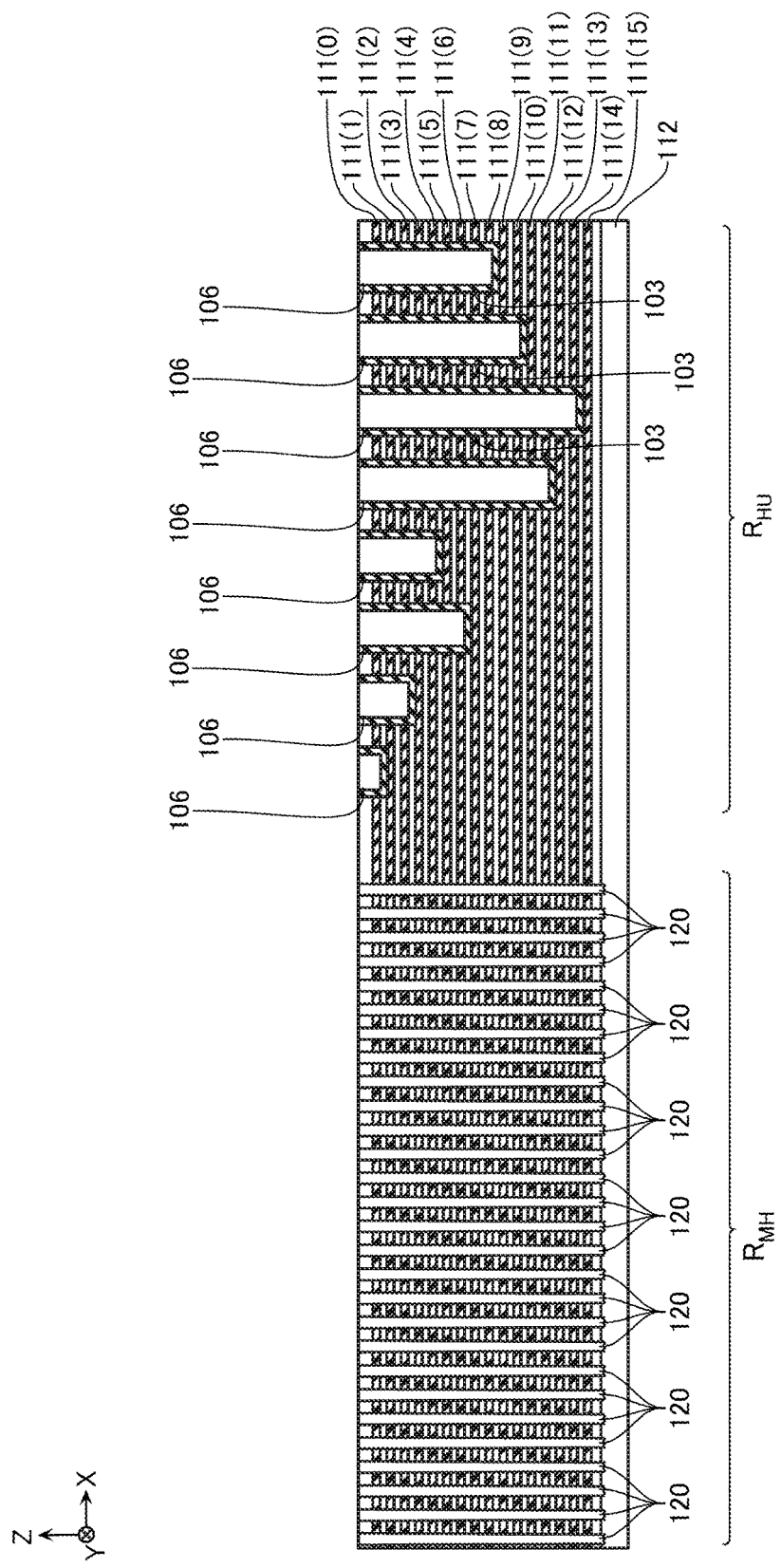
FIG. 32 is a schematic cross-sectional view for describing the manufacturing method.

Next, for example, as illustrated in FIG. 31 and FIG. 32, the resist 154 and the hard mask 105 are removed, and the insulating layers 103 and sacrifice layers 106 are formed inside the contact hole CH(0) to the contact hole CH(15). This process is performed by CVD or the like.

Figure 33:
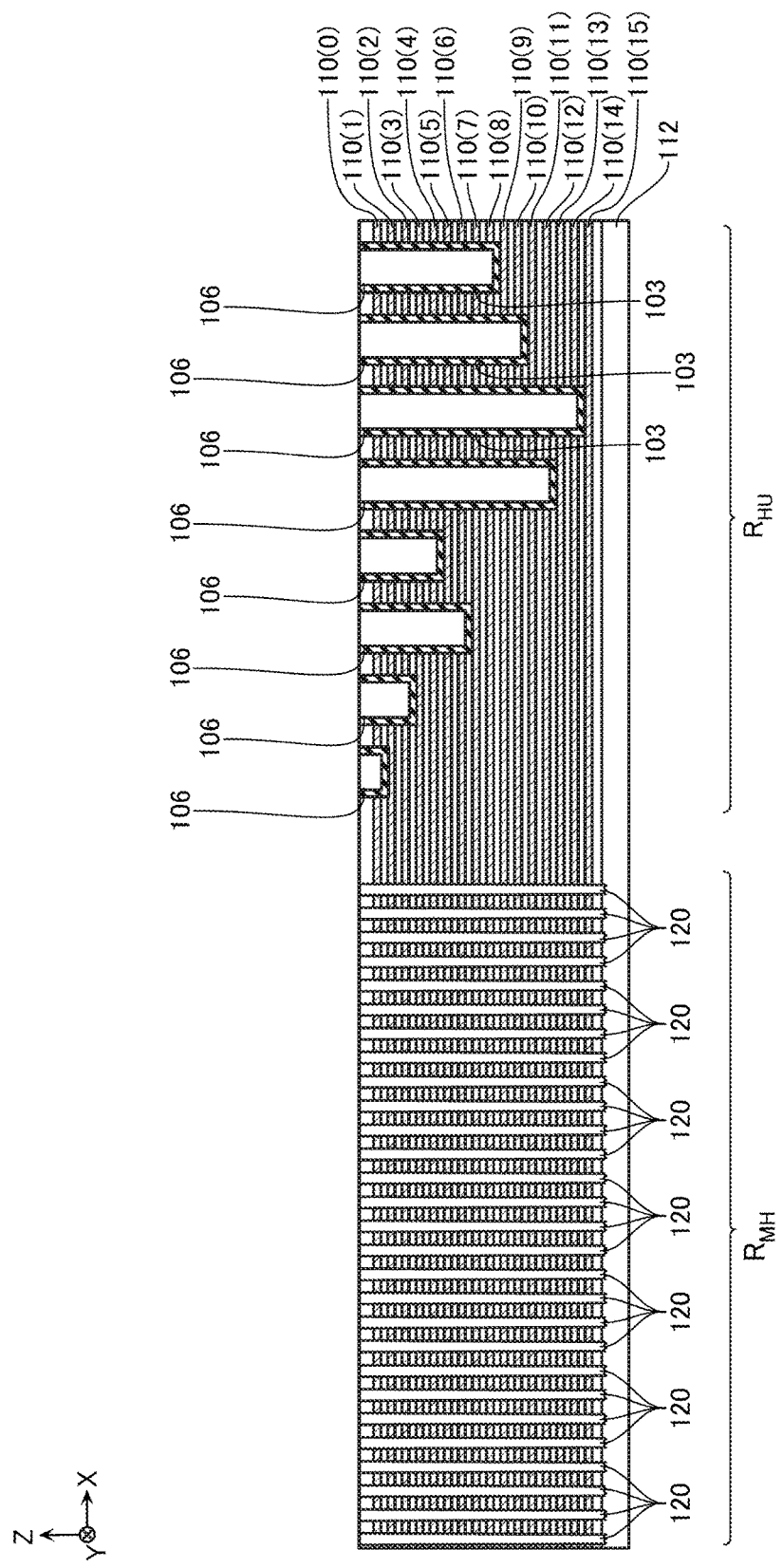
FIG. 33 is a schematic cross-sectional view for describing the manufacturing method.

Next, for example, as illustrated in FIG. 33, the conductive layers 110 are formed. In this process, trenches each penetrating the plurality of insulating layers 101 and the plurality of sacrifice layers 111 are formed at positions corresponding to the inter-block insulating layers ST (FIG. 2) by the method, such as RIE. Next, the plurality of sacrifice layers 111 are removed through the trenches by the method, such as a wet etching. Next, the plurality of conductive layers 110 are formed by the method, such as CVD.

Figure 34:
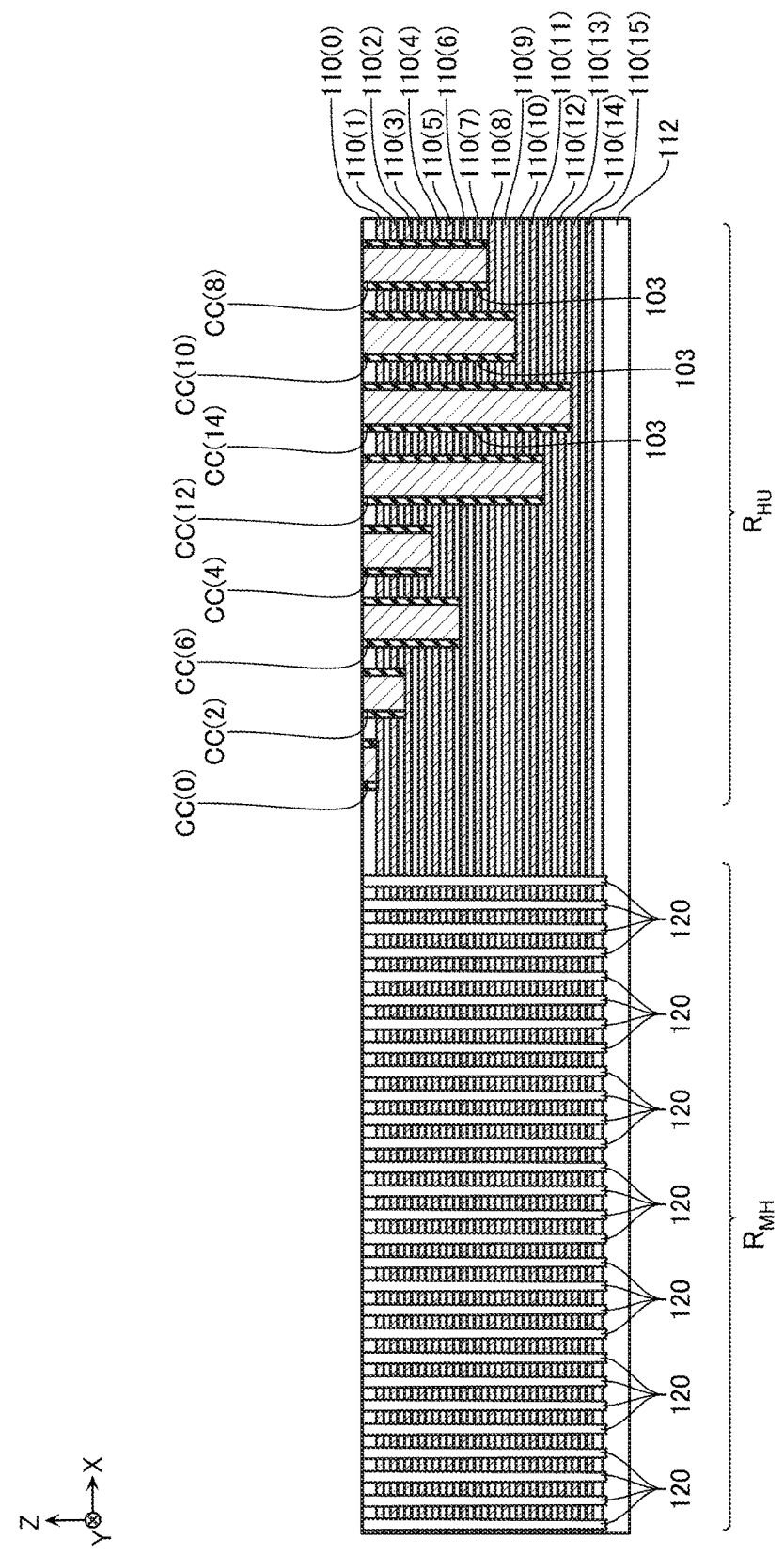
FIG. 34 is a schematic cross-sectional view for describing the manufacturing method.
Figure 35:
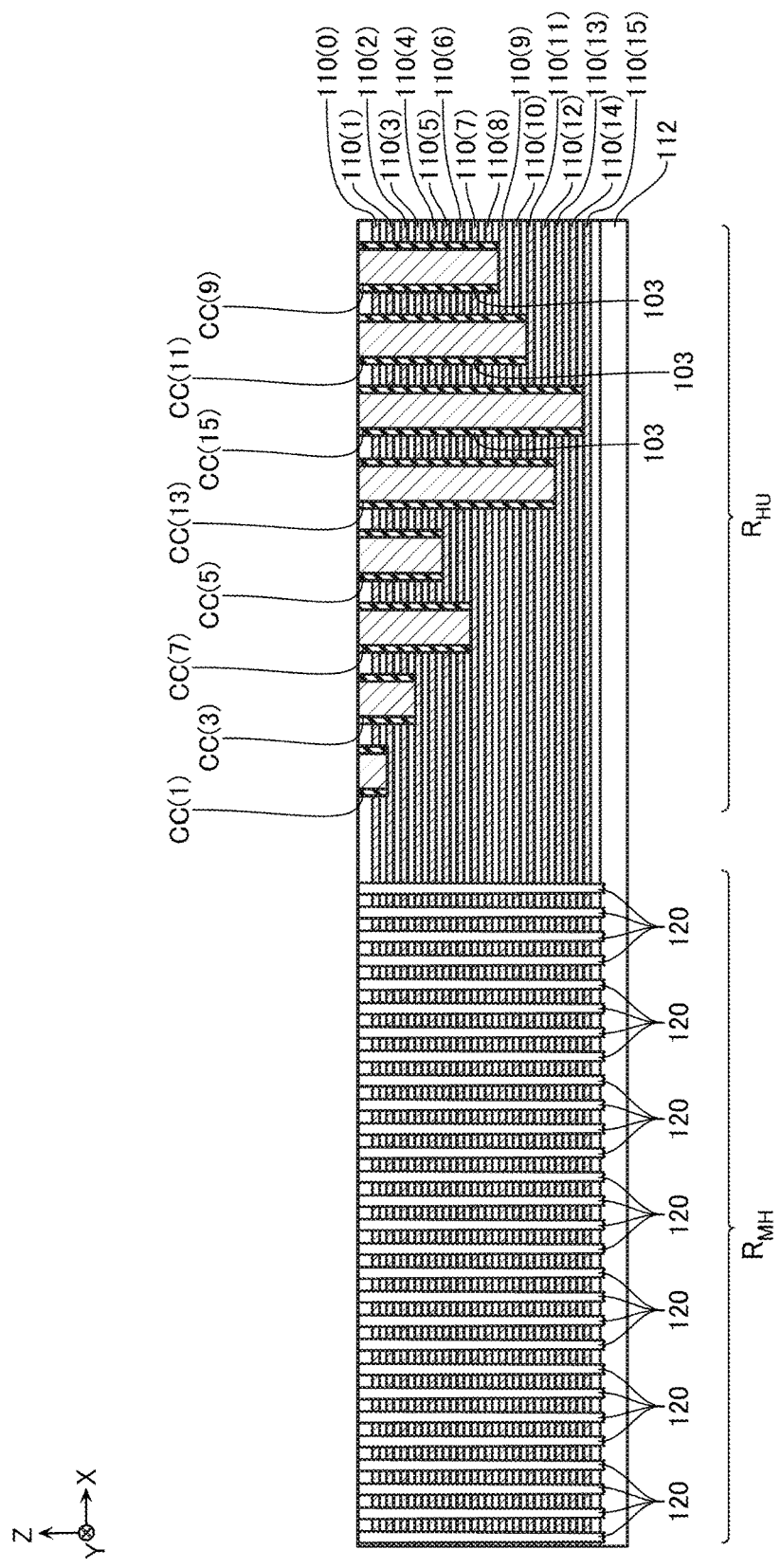
FIG. 35 is a schematic cross-sectional view for describing the manufacturing method.

Next, for example, as illustrated in FIG. 34 and FIG. 35, the contact electrode CC(0) to the contact electrode CC(15) are formed. In this process, for example, the sacrifice layers 106 are removed. Next, the insulating layers 103 are partially removed by the method, such as RIE, thus exposing the upper surfaces of the conductive layer 110(0) to the conductive layer 110(15). Next, the contact electrode CC(0) to the contact electrode CC(15) are formed by the method, such as CVD.

Subsequently, the bit line BL and the like are formed, thus forming the semiconductor memory device described with reference to FIG. 1 to FIG. 7.

Comparative Example

[Configuration]

Figure 36:
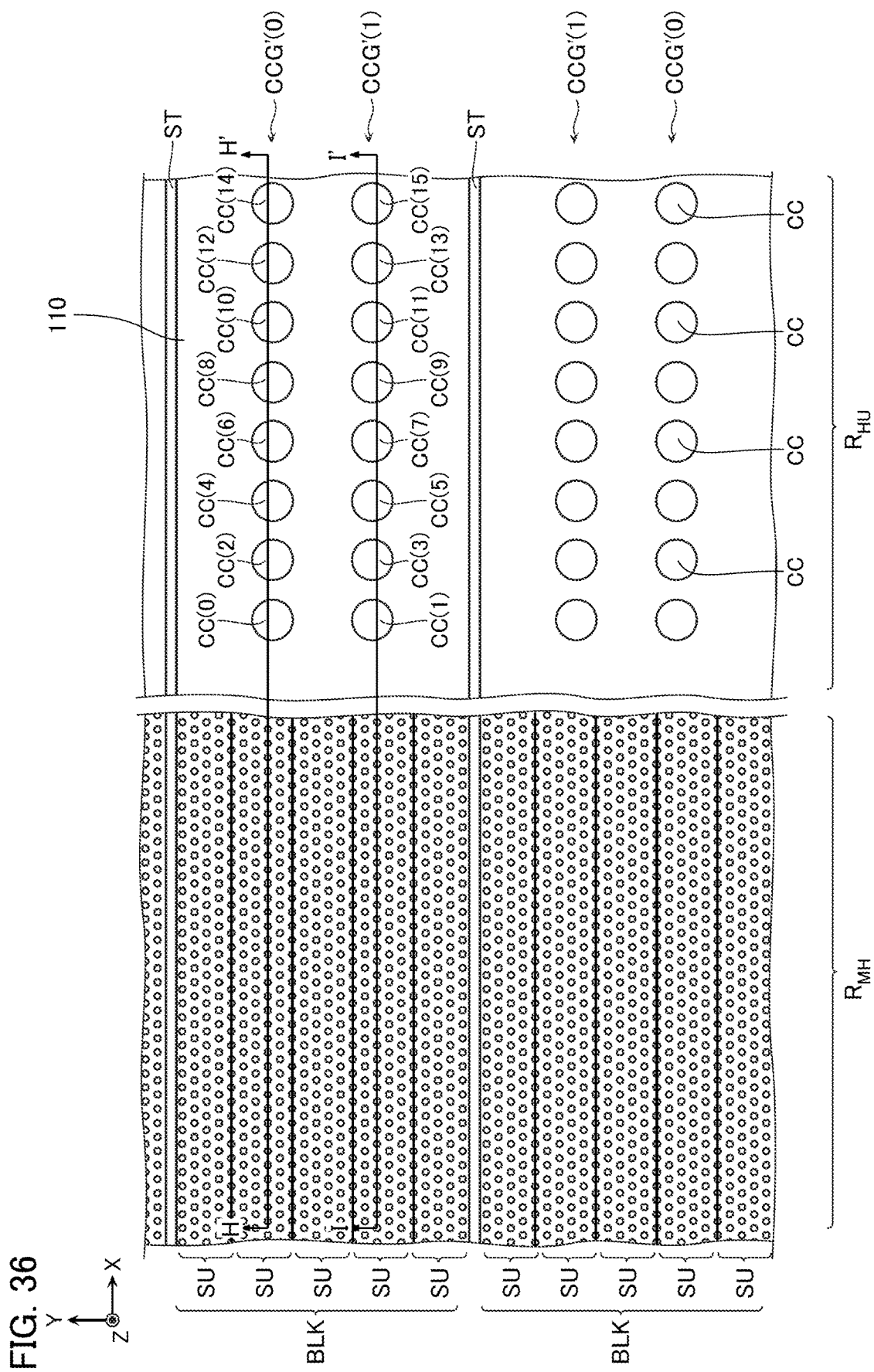
FIG. 36 is a schematic plan view of a semiconductor memory device according to a comparative example.
Figure 37:
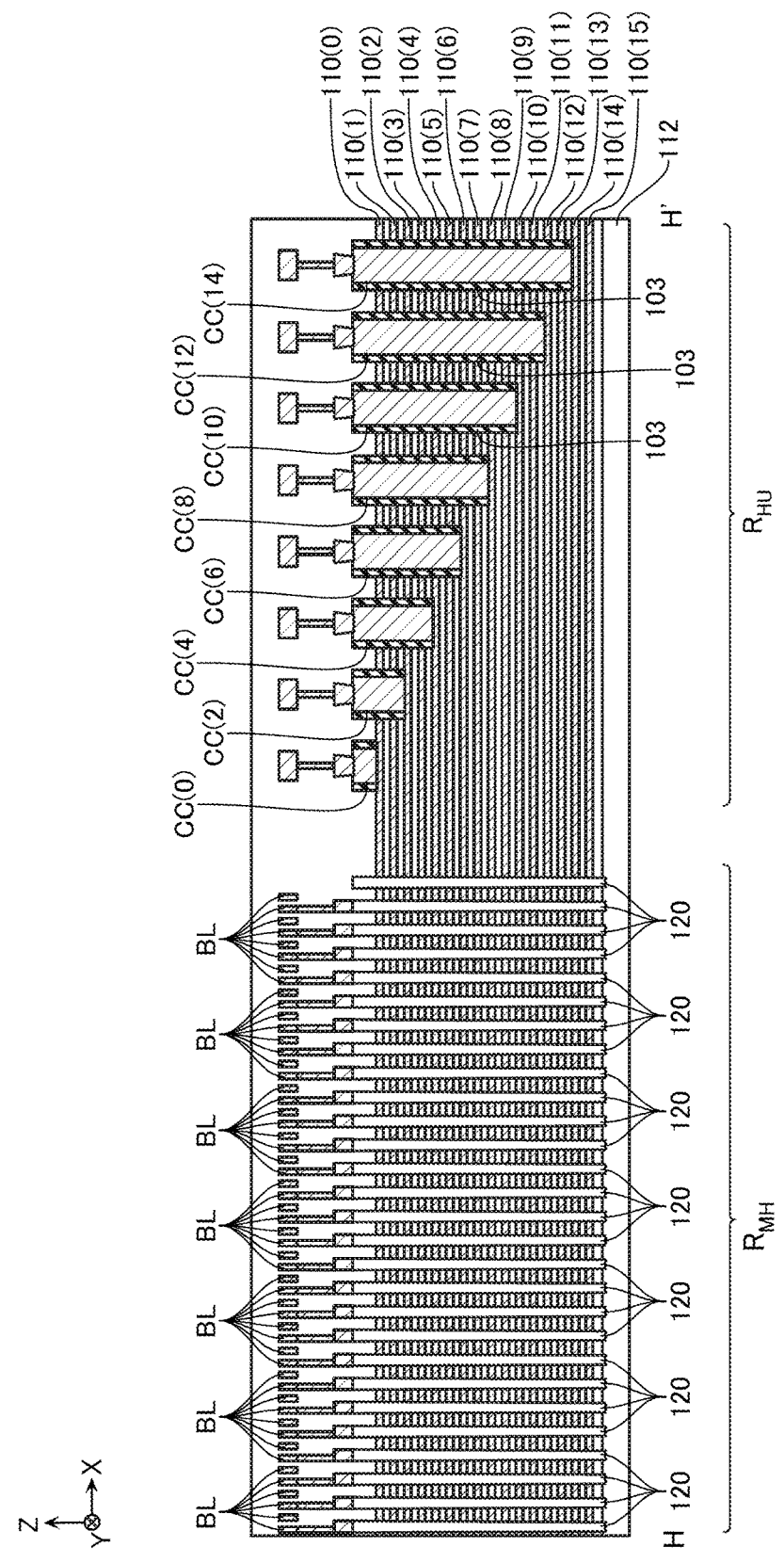
FIG. 37 is a schematic cross-sectional view of a structure illustrated in FIG. 36 taken along a line H-H' viewed in an arrow direction.
Figure 38:
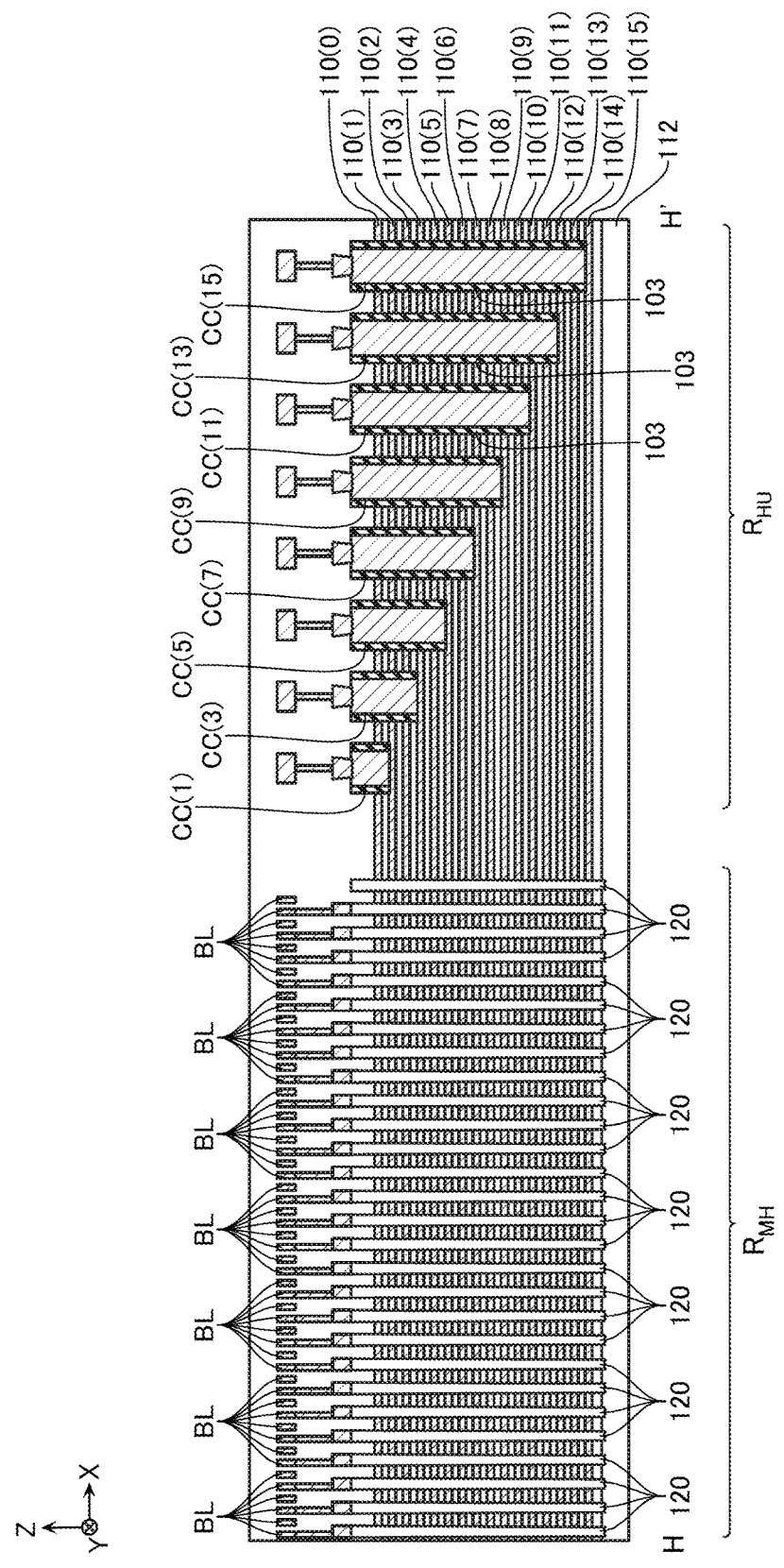
FIG. 38 is a schematic cross-sectional view of the structure illustrated in FIG. 36 taken along a line I-I' viewed in an arrow direction.

Next, with reference to FIG. 36 to FIG. 38, a configuration of a semiconductor memory device according to the comparative example will be described. FIG. 36 is a schematic plan view of the semiconductor memory device according to the comparative example. FIG. 37 is a schematic cross-sectional view of the structure illustrated in FIG. 36 taken along the line H-H' viewed in the arrow direction. FIG. 38 is a schematic cross-sectional view of the structure illustrated in FIG. 36 taken along the line I-I' viewed in the arrow direction.

The semiconductor memory device according to the comparative example includes contact electrode rows CCG' instead of the contact electrode rows CCG. In FIG. 36, the two contact electrode rows CCG' are indicated as CCG'(0) and CCG'(1).

The contact electrode row CCG'(0) includes the contact electrodes CC(0), CC(2), CC(4), CC(6), CC(8), CC(10), CC(12), and CC(14) in the order from the one close to the memory hole region $R_{MH}$.

The contact electrode row CCG'(1) includes the contact electrodes CC(1), CC(3), CC(5), CC(7), CC(9), CC(11), CC(13), and CC(15) in the order from the one close to the memory hole region $R_{MH}$.

[Manufacturing Method]

Figure 39:
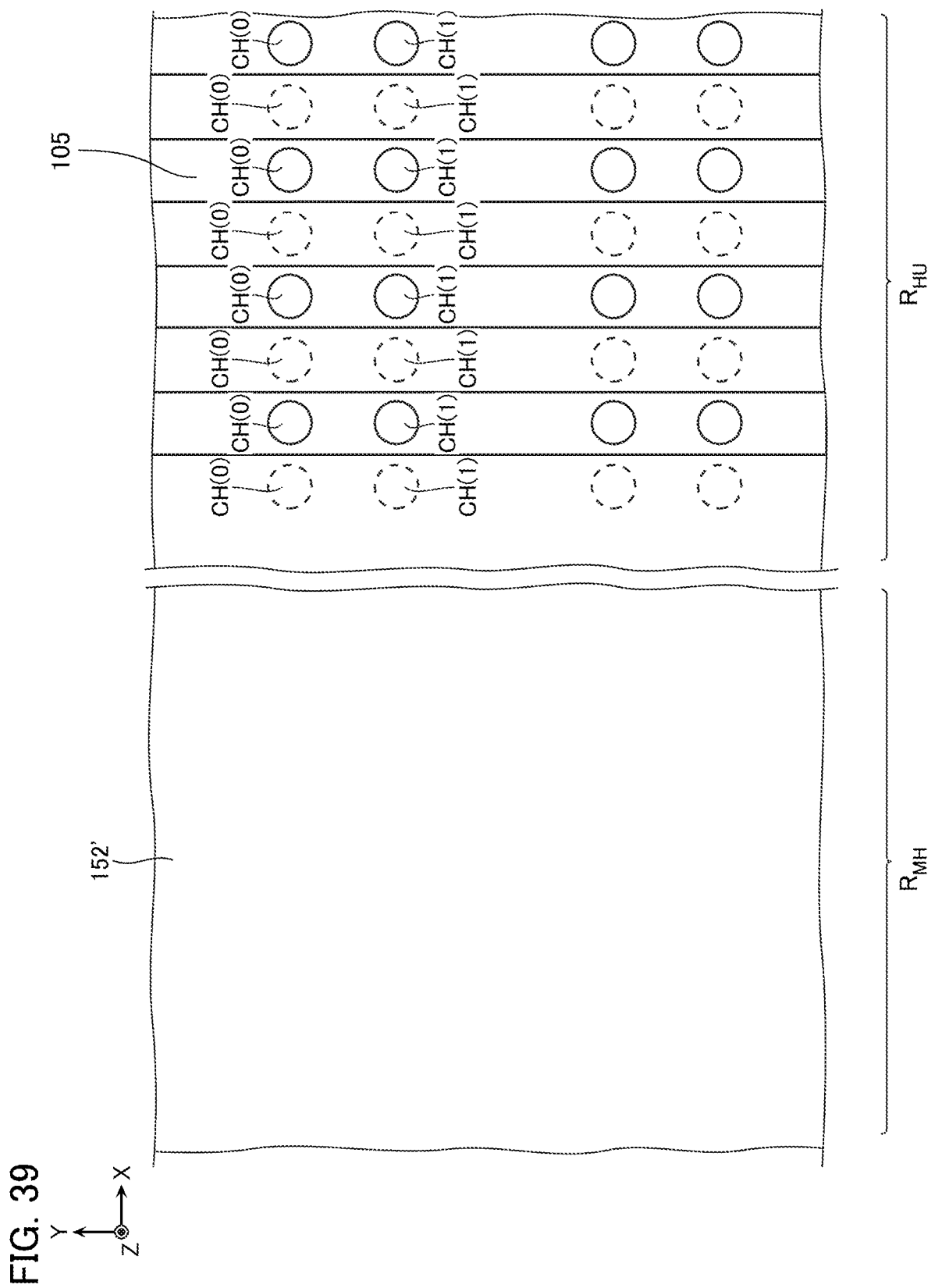
FIG. 39 is a schematic plan view for describing a method for manufacturing the semiconductor memory device according to the comparative example.

Next, with reference to FIG. 39 to FIG. 53, the method for manufacturing the semiconductor memory device according to the comparative example will be described. FIG. 39, FIG. 44, and FIG. 49 are schematic plan views for describing the manufacturing method, and illustrate the plane corresponding to that in FIG. 36. FIG. 40, FIG. 42, FIG. 45, FIG. 47, FIG. 50, and FIG. 52 are schematic cross-sectional views for describing the manufacturing method, and illustrate the cross-sectional surface corresponding to that in FIG. 37. FIG. 41, FIG. 43, FIG. 46, FIG. 48, FIG. 51, and FIG. 53 are schematic cross-sectional views for describing the manufacturing method, and illustrate the cross-sectional surface corresponding to that in FIG. 38.

In the manufacture of the semiconductor memory device according to the comparative example, the process described with reference to FIG. 8 to the process described with reference to FIG. 14 and FIG. 15 are performed.

Figure 40:
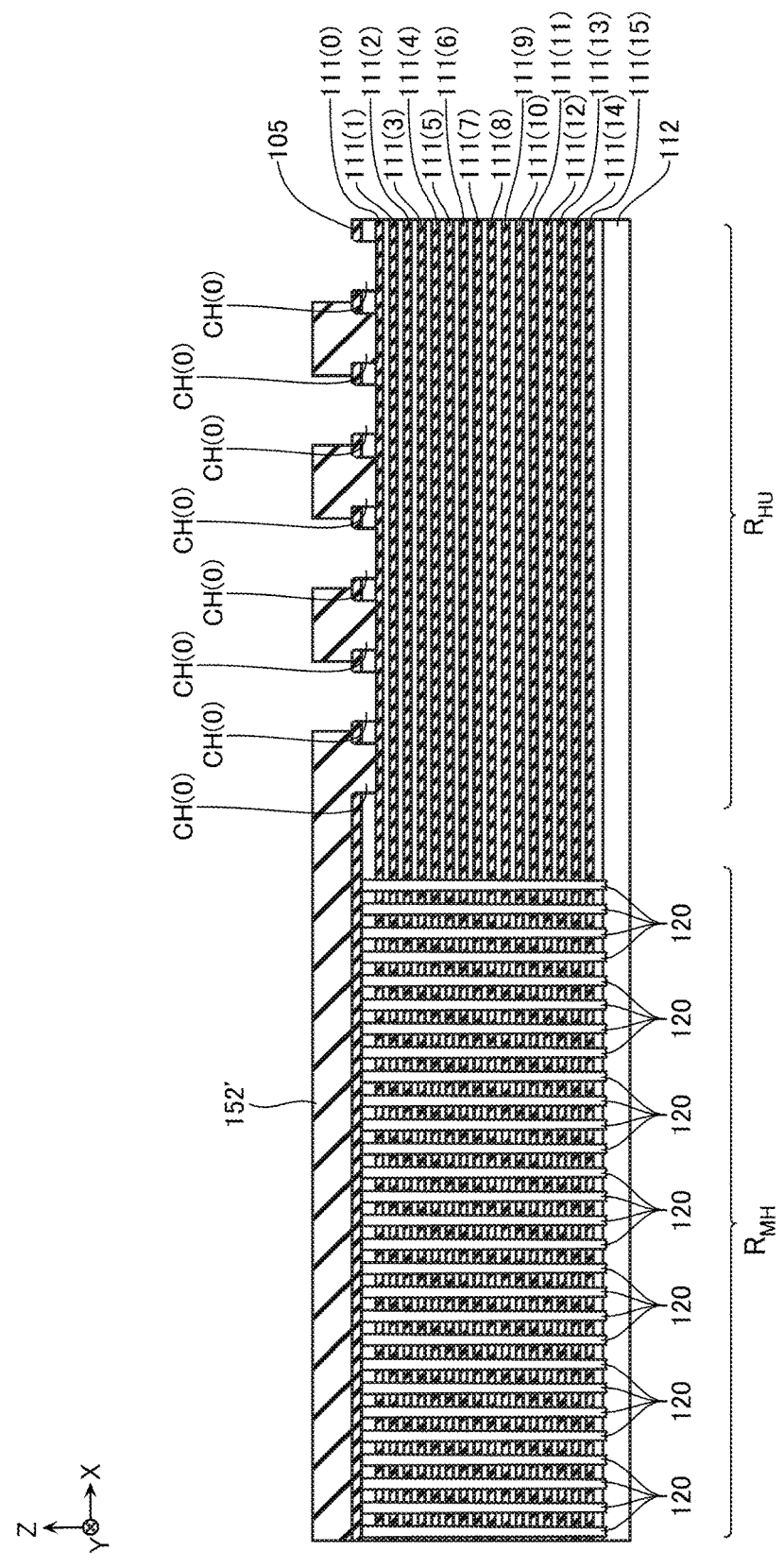
FIG. 40 is a schematic cross-sectional view for describing the manufacturing method.
Figure 41:
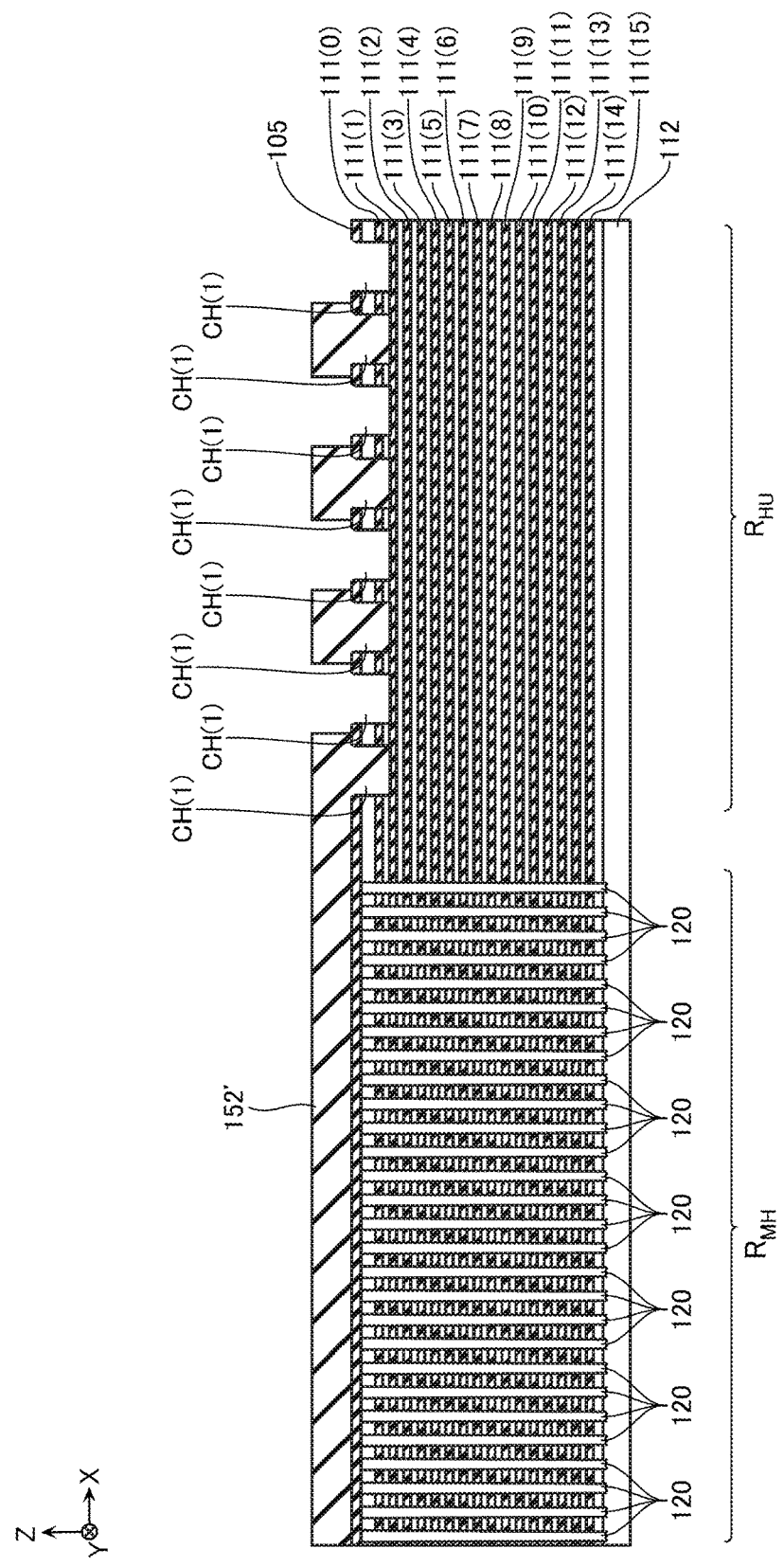
FIG. 41 is a schematic cross-sectional view for describing the manufacturing method.

Next, for example, as illustrated in FIG. 39 to FIG. 41, the resist 151 is removed, and a resist 152' is formed. The resist 152' covers the 2b+1-th (b is an integer of 0 or more) contact holes CH counted from the side close to the memory hole region $R_{MH}$ among the plurality of contact holes CH arranged in the X-direction, and exposes the other contact holes CH. The resist 152' has a film thickness (thickness in the Z-direction) larger than the film thickness of the resist 151.

Figure 42:
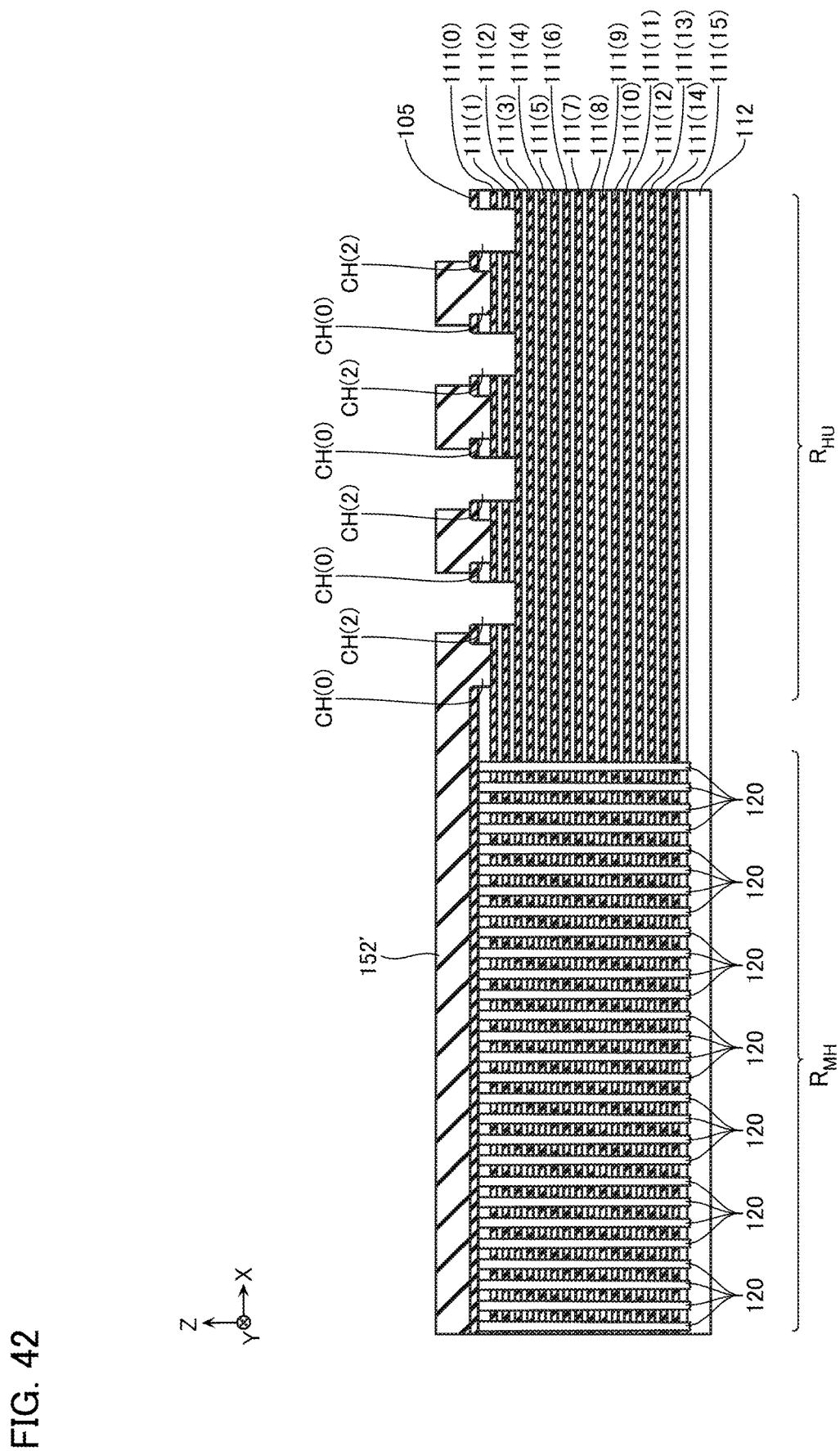
FIG. 42 is a schematic cross-sectional view for describing the manufacturing method.
Figure 43:
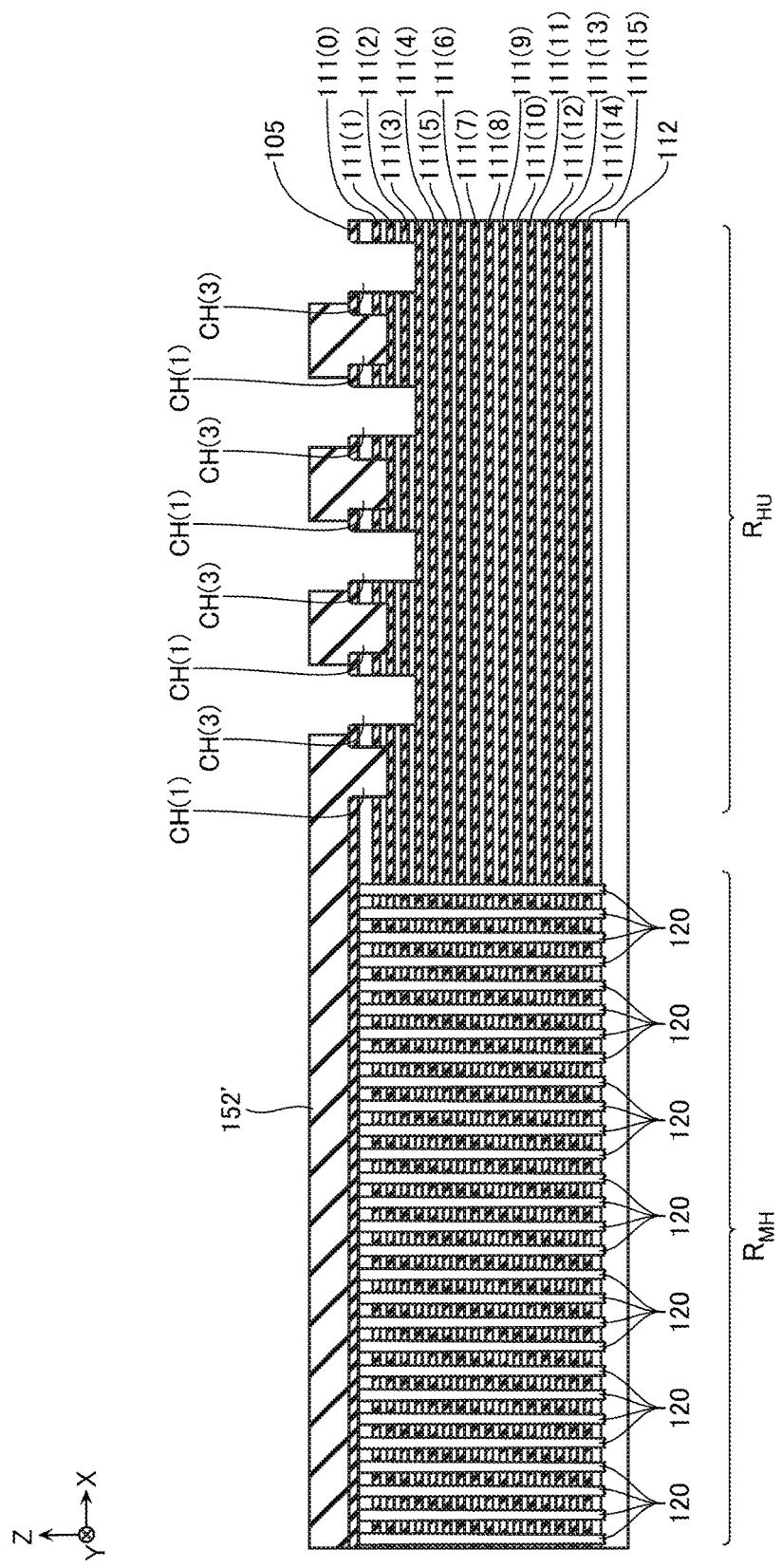
FIG. 43 is a schematic cross-sectional view for describing the manufacturing method.
Figure 44:
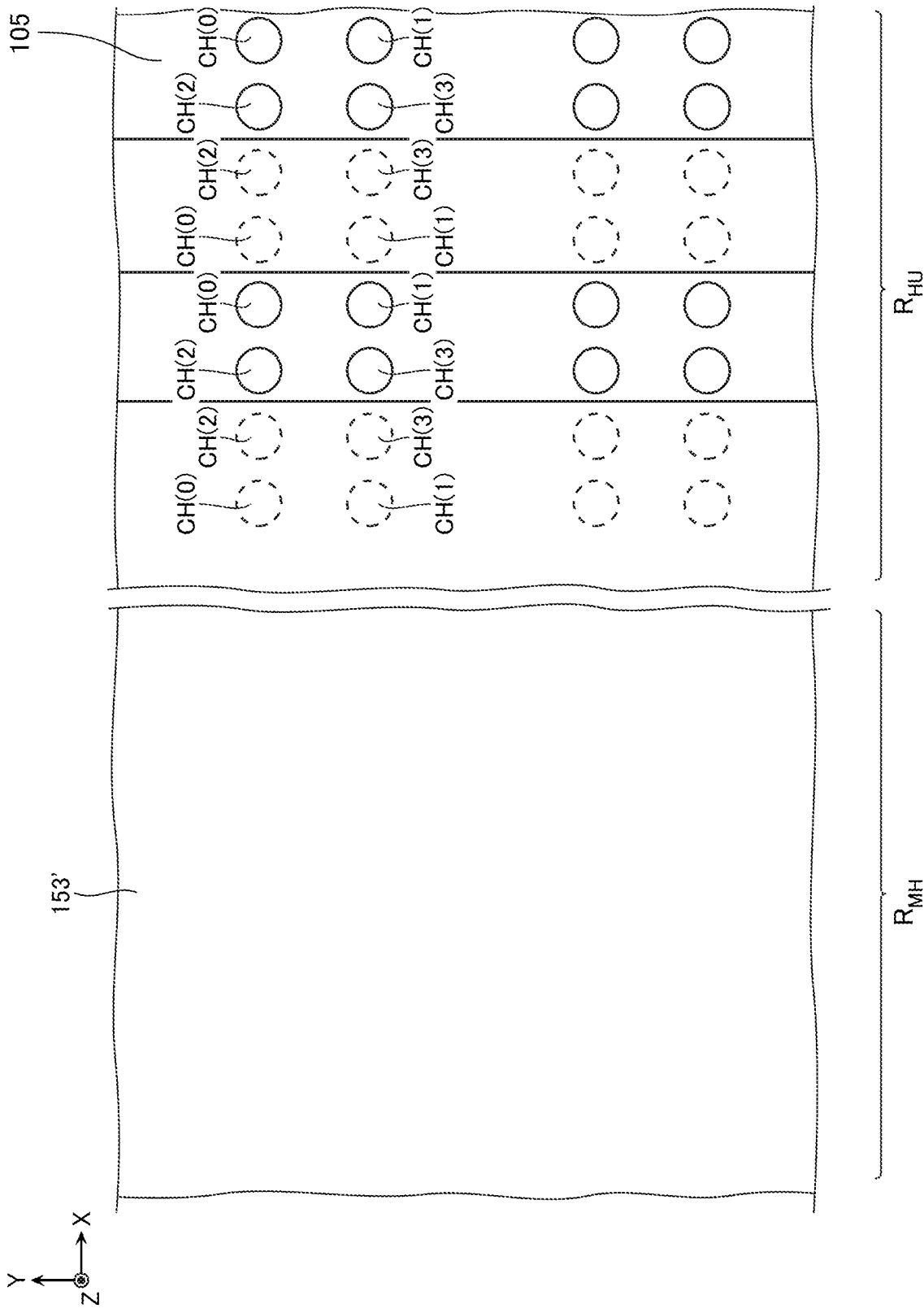
FIG. 44 is a schematic plan view for describing the manufacturing method.

Next, for example, as illustrated in FIG. 42 and FIG. 43, among the contact holes CH, in the portion not covered with the resist 152', the sacrifice layers 111 and the insulating layers 101 are removed by two layers for each. Accordingly, contact holes CH(2) are formed at portions corresponding to the 2b+2-th counted from the side close to the memory hole region $R_{MH}$ among the plurality of contact holes CH corresponding to the contact electrode row CCG'(0). Contact holes CH(3) are formed at portions corresponding to the 2b+2-th counted from the side close to the memory hole region $R_{MH}$ among the plurality of contact holes CH corresponding to the contact electrode row CCG'(1).

Figure 45:
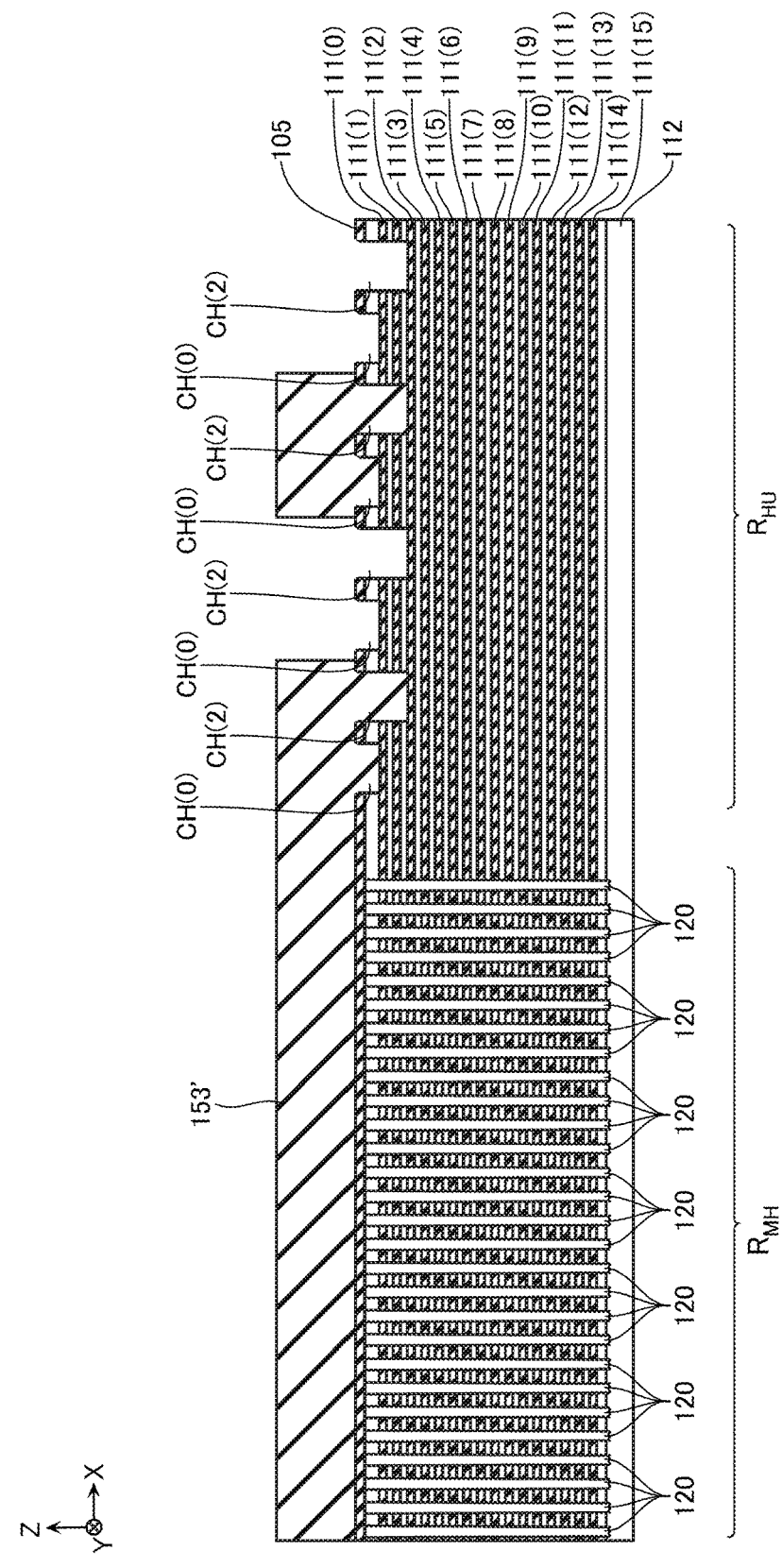
FIG. 45 is a schematic cross-sectional view for describing the manufacturing method.
Figure 46:
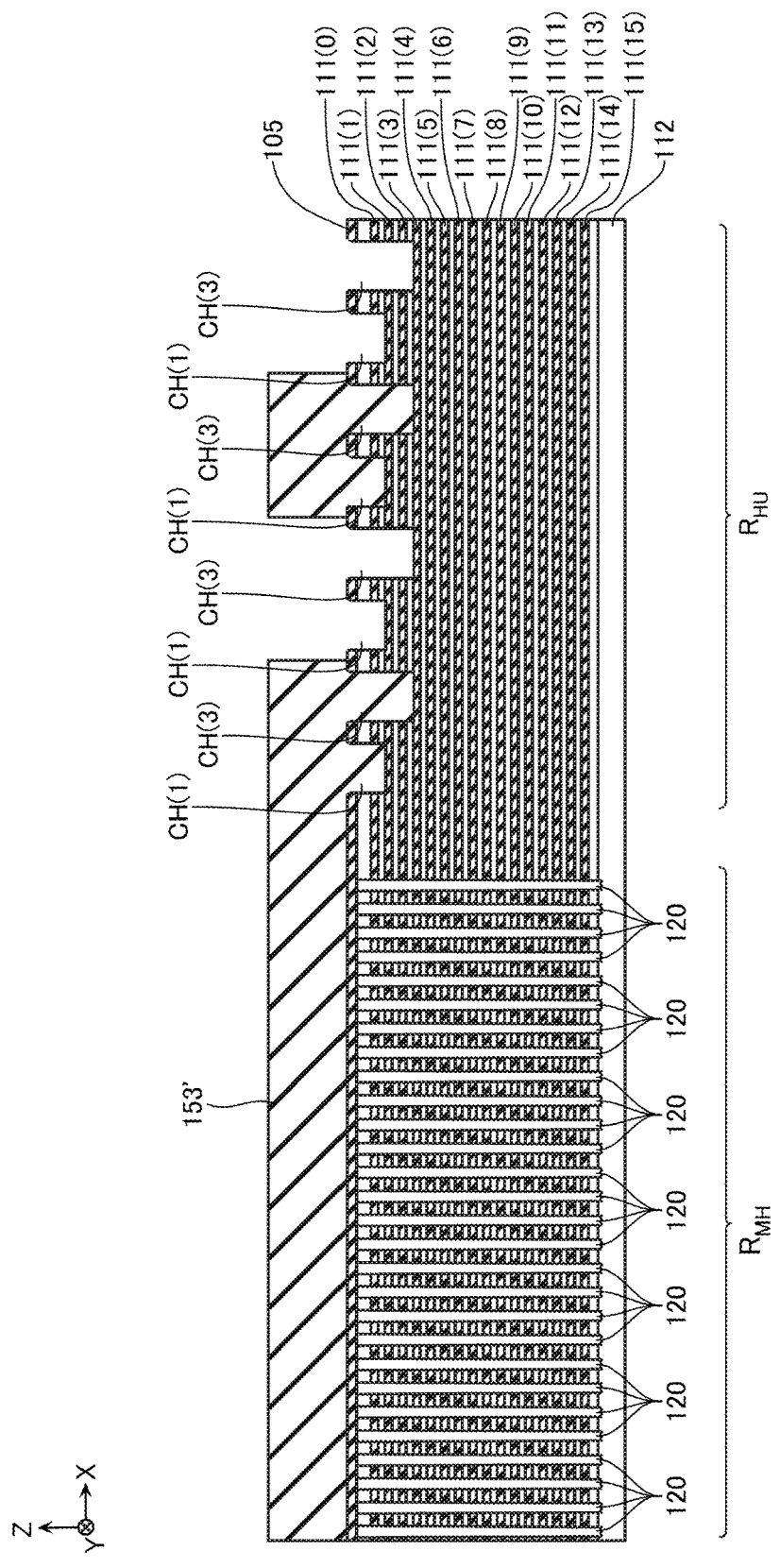
FIG. 46 is a schematic cross-sectional view for describing the manufacturing method.

Next, for example, as illustrated in FIG. 44 to FIG. 46, the resist 152' is removed, and a resist 153' is formed. The resist 153' covers the 4b+1-th and 4b+2-th (b is an integer of 0 or more) contact holes CH counted from the side close to the memory hole region $R_{MH}$ among the plurality of contact holes CH arranged in the X-direction, and exposes the other contact holes CH. The resist 153' has a film thickness (thickness in the Z-direction) larger than the film thickness of the resist 152'.

Figure 47:
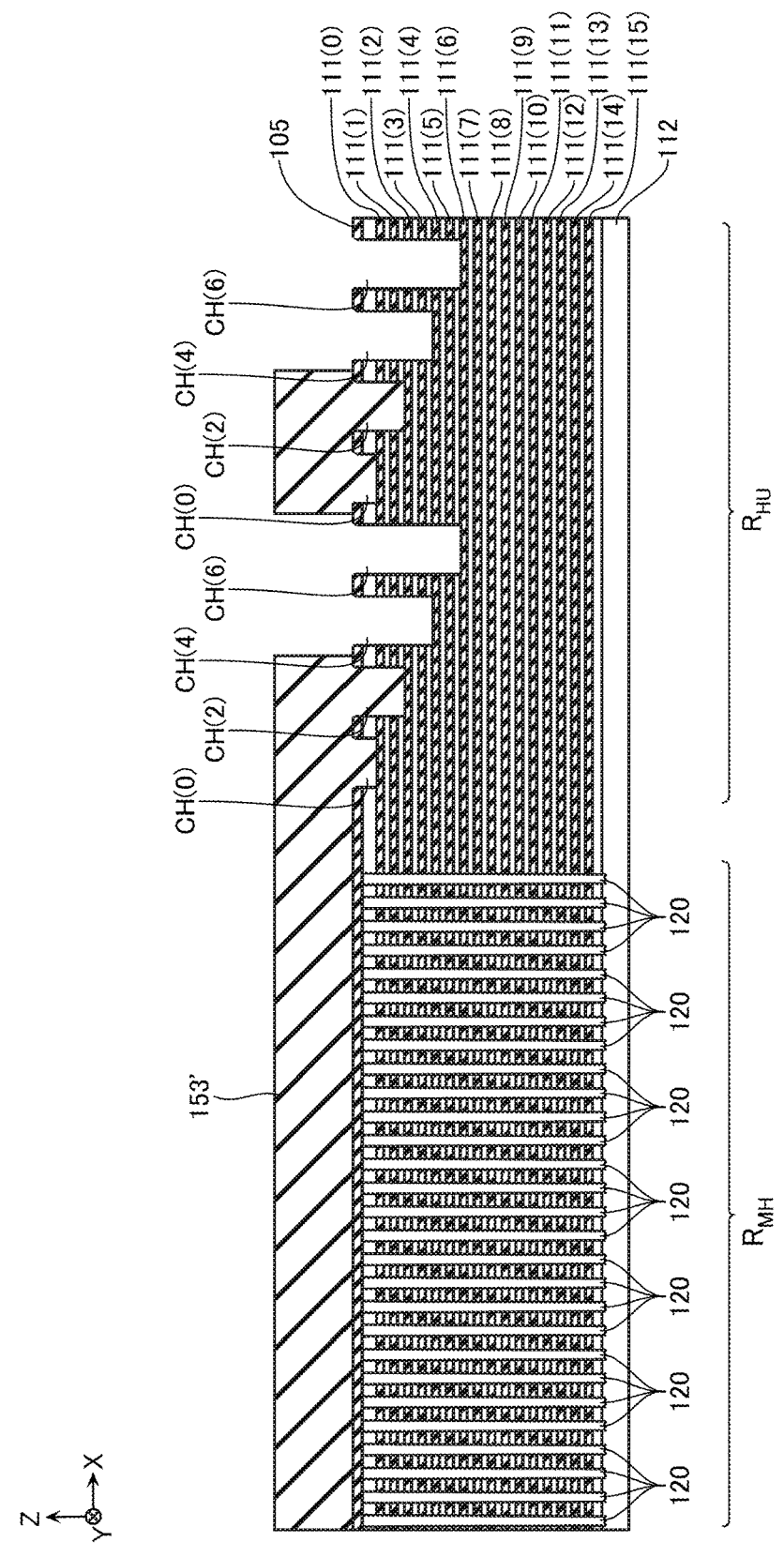
FIG. 47 is a schematic cross-sectional view for describing the manufacturing method.
Figure 48:
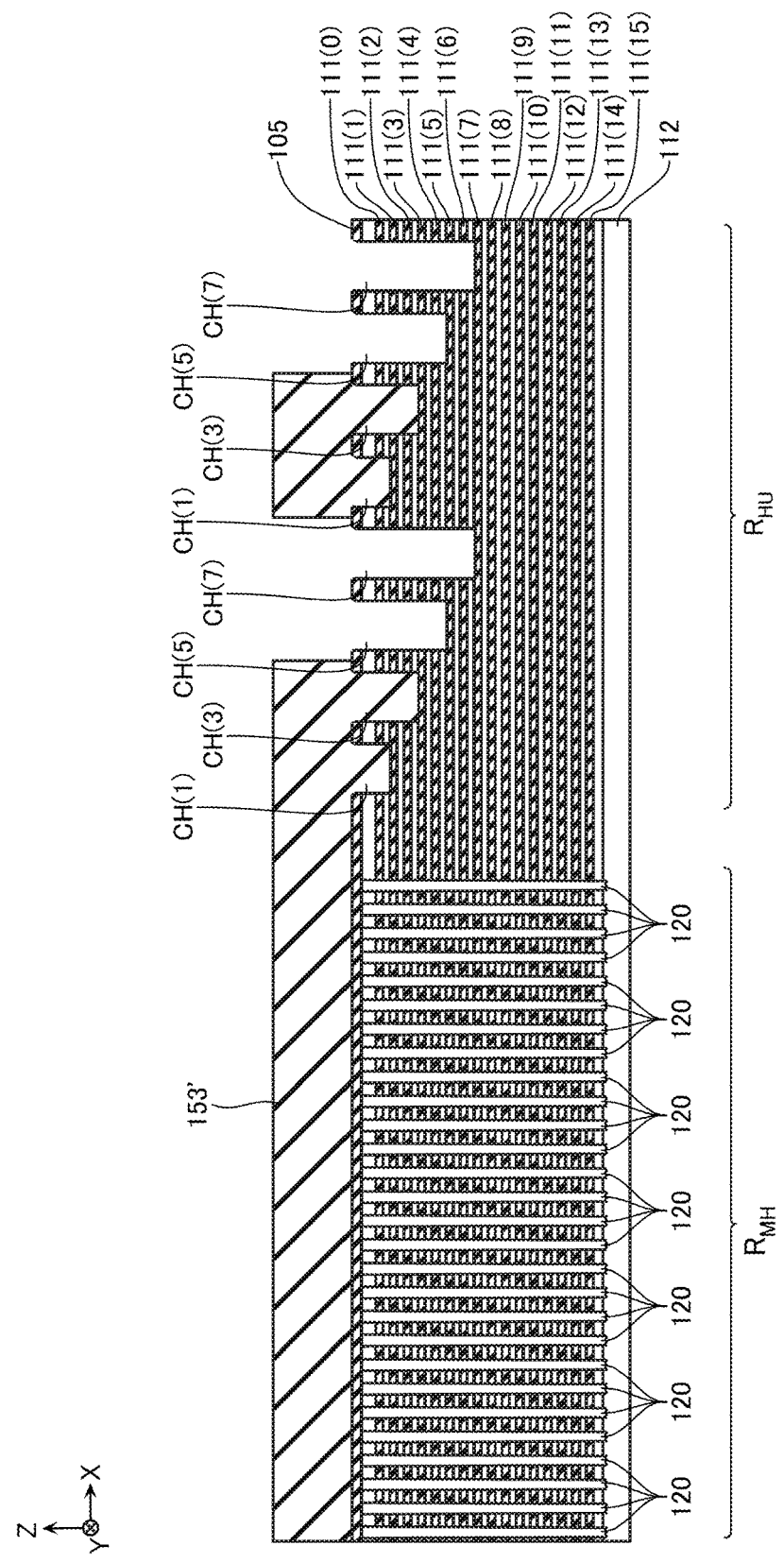
FIG. 48 is a schematic cross-sectional view for describing the manufacturing method.
Figure 49:
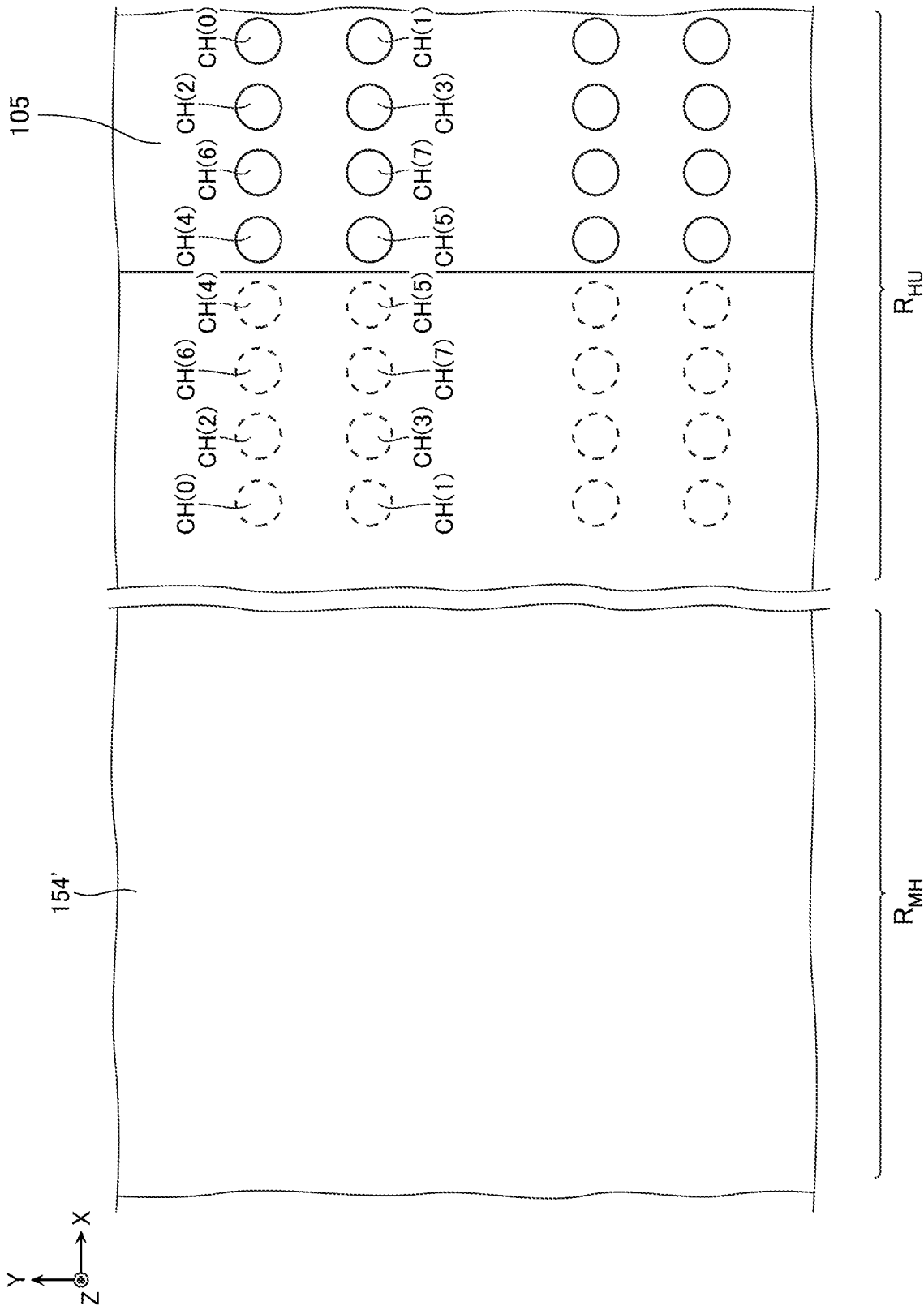
FIG. 49 is a schematic plan view for describing the manufacturing method.

Next, for example, as illustrated in FIG. 47 and FIG. 48, among the contact holes CH, in the portion not covered with the resist 153', the sacrifice layers 111 and the insulating layers 101 are removed by four layers for each. Accordingly, contact holes CH(4) and CH(6) are formed at portions corresponding to the 4b+3-th and the 4b+4-th counted from the side close to the memory hole region $R_{MH}$ among the plurality of contact holes CH corresponding to the contact electrode row CCG'(0). Contact holes CH(5) and CH(7) are formed at portions corresponding to the 4b+3-th and the 4b+4-th counted from the side close to the memory hole region $R_{MH}$ among the plurality of contact holes CH corresponding to the contact electrode row CCG'(1). This process is performed by RIE or the like.

Figure 50:
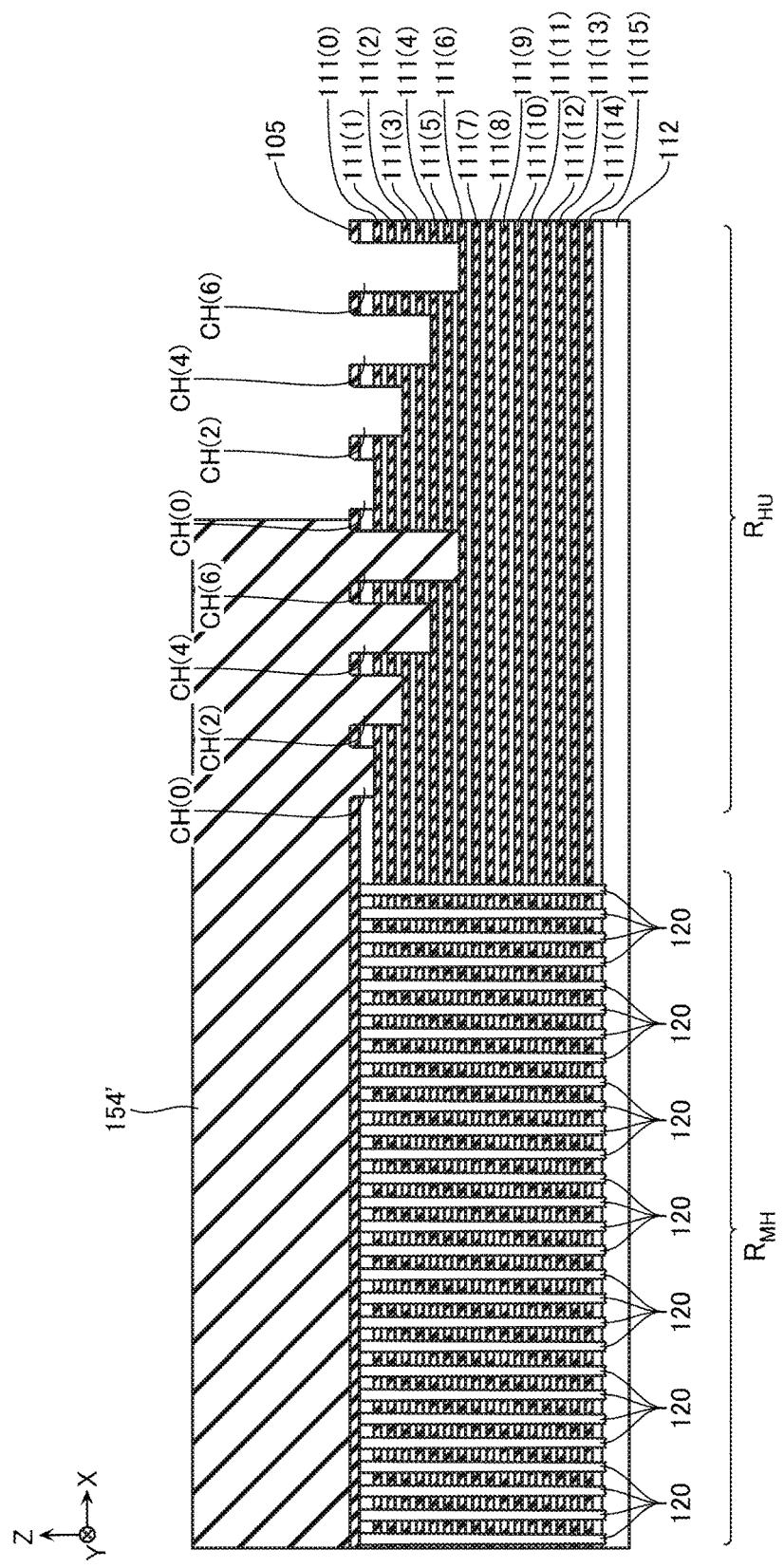
FIG. 50 is a schematic cross-sectional view for describing the manufacturing method.
Figure 51:
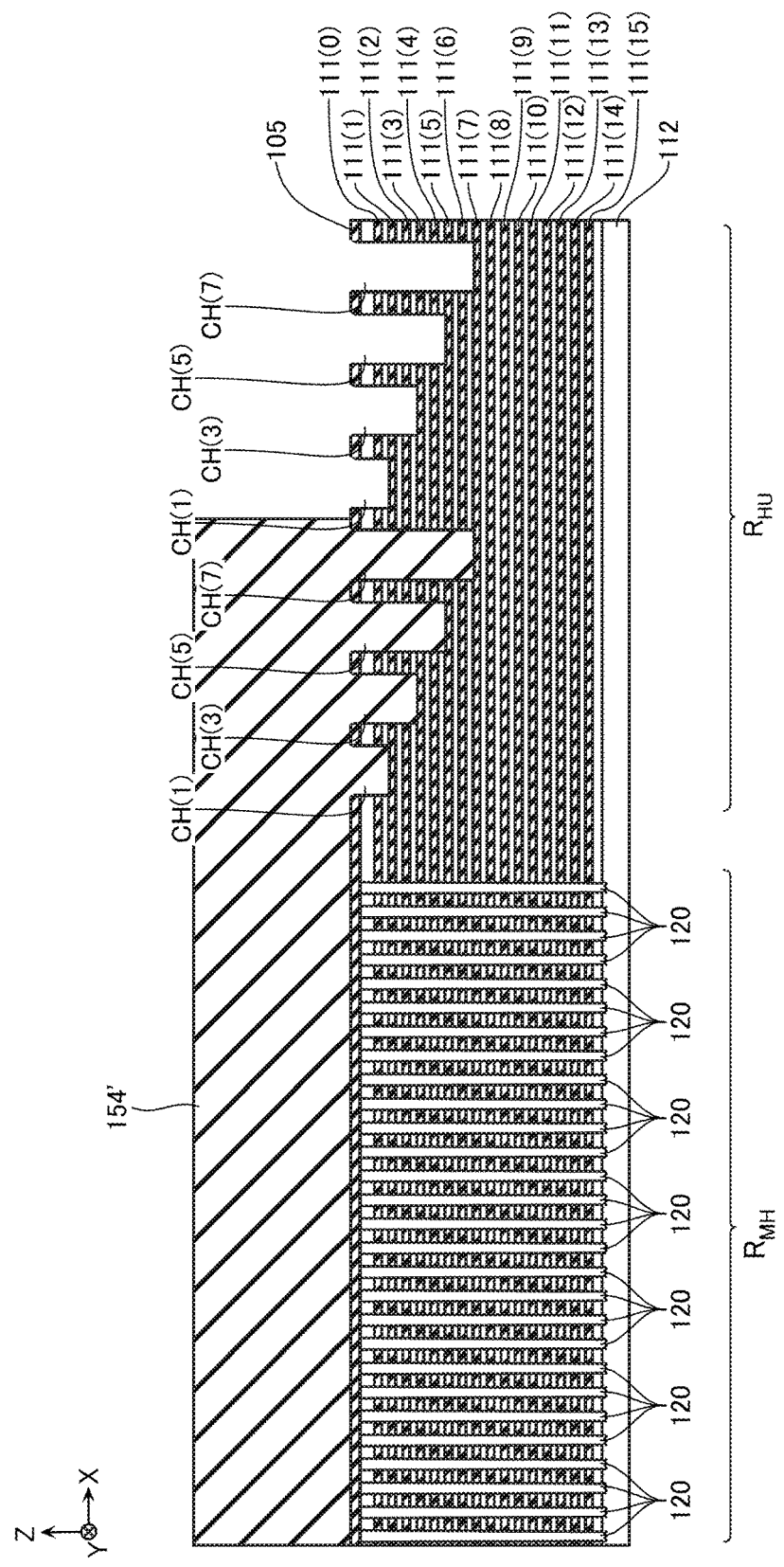
FIG. 51 is a schematic cross-sectional view for describing the manufacturing method.

Next, for example, as illustrated in FIG. 49 to FIG. 51, the resist 153' is removed, and a resist 154' is formed. The resist 154' covers a half close to the memory hole region $R_{MH}$ among the plurality of contact holes CH arranged in the X-direction, and exposes the other contact holes CH. The resist 154' has a film thickness (thickness in the Z-direction) larger than the film thickness of the resist 153'.

Figure 52:
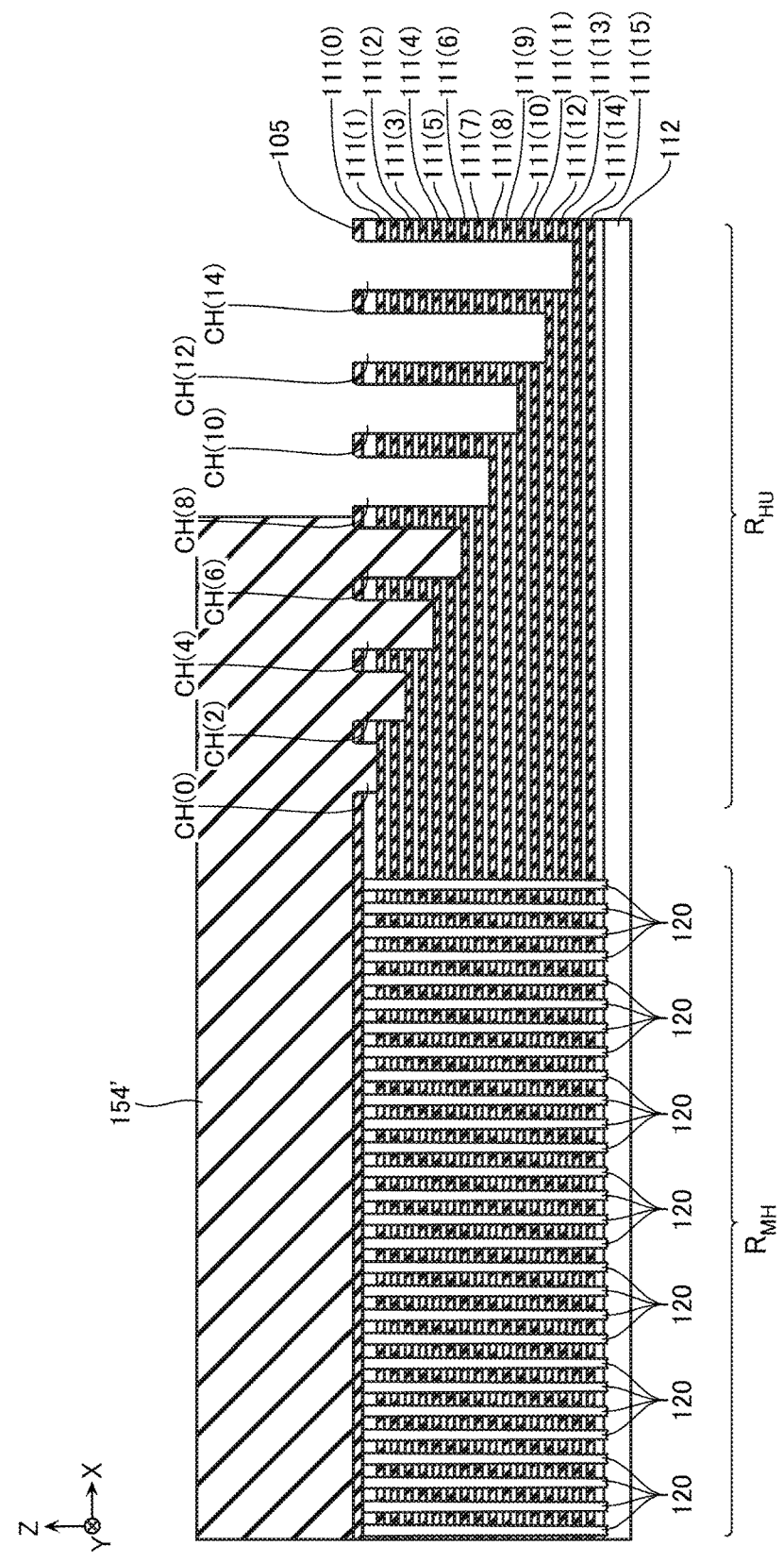
FIG. 52 is a schematic cross-sectional view for describing the manufacturing method.
Figure 53:
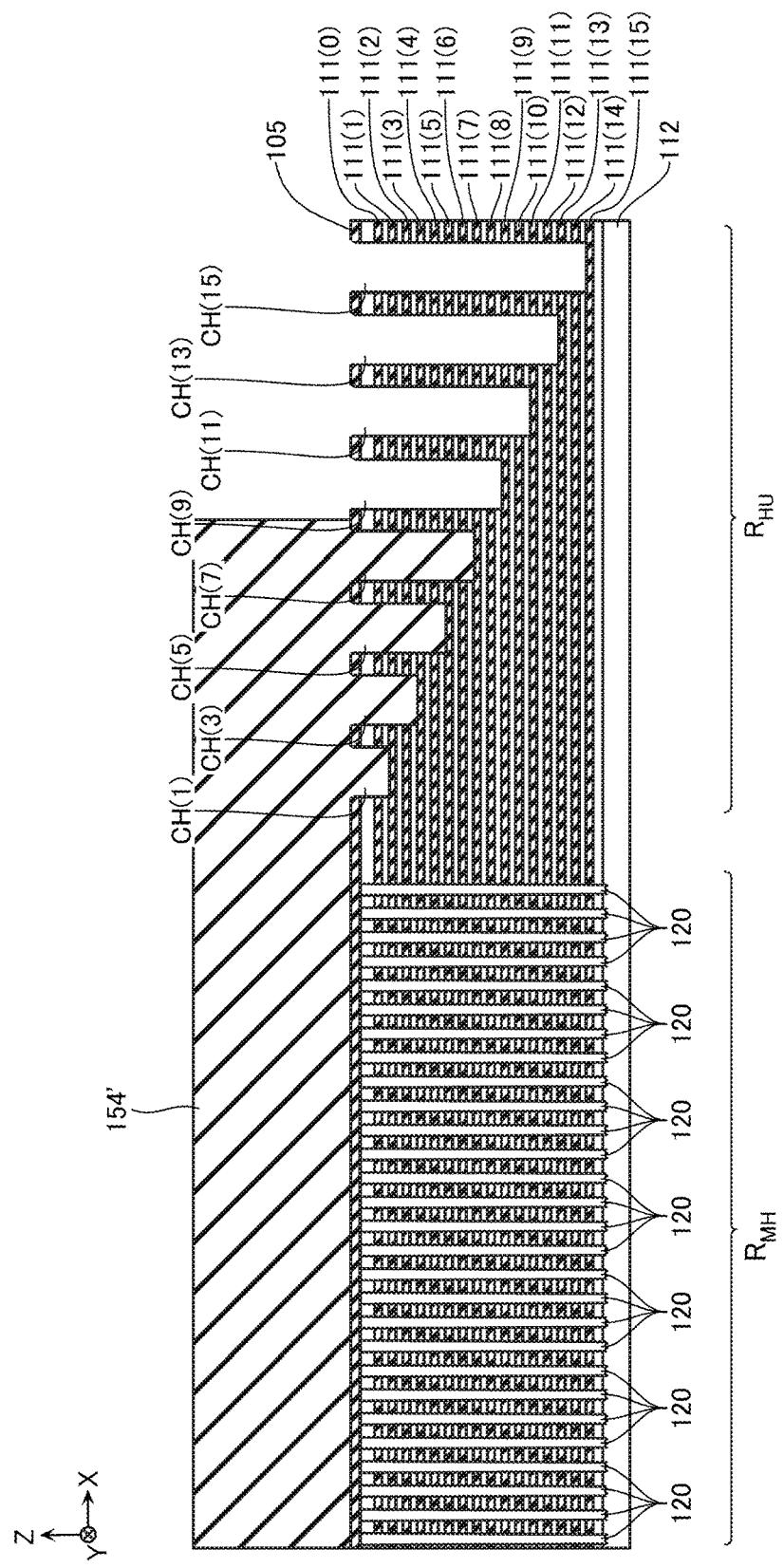
FIG. 53 is a schematic cross-sectional view for describing the manufacturing method.

Next, for example, as illustrated in FIG. 52 and FIG. 53, among the contact holes CH, in the portion not covered with the resist 154', the sacrifice layers 111 and the insulating layers 101 are removed by eight layers for each. Accordingly, contact holes CH(8), CH(10), CH(12), and CH(14) are formed at portions corresponding to a half far from the memory hole region $R_{MH}$ among the plurality of contact holes CH corresponding to the contact electrode row CCG'(0). Contact holes CH(9), CH(11), CH(13), and CH(15) are formed at portions corresponding to a half far from the memory hole region $R_{MH}$ among the plurality of contact holes CH corresponding to the contact electrode row CCG'(1). This process is performed by RIE or the like.

Subsequently, the processes following the process described with reference to FIG. 31 and FIG. 32 are performed, thus forming the semiconductor memory device described with reference to FIG. 36 to FIG. 38.

[Effects]

In the manufacturing method according to the comparative example, the resists 152' and 153' are formed in the process described with reference to FIG. 39 to FIG. 41 and the process described with reference to FIG. 44 to FIG. 46, respectively. Here, for reducing the area of the hook-up region $R_{HU}$, it is preferred to form the patterns of the resists 152' and 153' to be small. However, in the process described with reference to FIG. 42 and FIG. 43 and the process described with reference to FIG. 47 and FIG. 48, it is preferred to appropriately protect the hard mask 105 by the resists 152' and 153'. Therefore, it is preferred to increase the film thicknesses (thicknesses in the Z-direction) of the resists 152' and 153' to some extent. Here, the increased film thicknesses of the resists 152' and 153' makes difficult to form the patterns of the resists 152' and 153' to be small in some cases.

Therefore, in the manufacturing method according to the first embodiment, the resists 152 and 153 are formed in the process described with reference to FIG. 16 to FIG. 18 and the process described with reference to FIG. 21 to FIG. 23, respectively.

Here, as described with reference to FIG. 39 and the like, the resist 152' covers the 2b+1-th contact hole CH, and exposes the 2b+2-th contact hole CH counted from one side in the X-direction (for example, negative side in the X-direction). That is, the resist 152' is provided with line and space patterns at a pitch twice as large as a pitch of the contact hole CH. Meanwhile, as described with reference to FIG. 16 and the like, the resist 152 covers the 4a+1-th and 4a+4-th contact holes CH, and exposes the 4a+2-th and 4a+3-th contact holes CH counted from the one side in the X-direction (for example, negative side in the X-direction). That is, the resist 152 is provided with the line and space patterns at a pitch four times as large as the pitch of the contact hole CH.

As described with reference to FIG. 44 and the like, the resist 153' covers the 4b+1-th and 4b+2-th contact holes CH, and exposes the 4b+3-th and 4b+4-th contact holes CH counted from the one side in the X-direction (for example, negative side in the X-direction). That is, the resist 153' is provided with the line and space patterns at a pitch four times as large as the pitch of the contact hole CH.

Meanwhile, as described with reference to FIG. 21 and the like, the resist 153 covers the 8a+1-th, 8a+2-th, 8a+7-th, and 8a+8-th contact holes CH, and exposes the 8a+3-th to 8a+6-th contact holes CH counted from the one side in the X-direction (for example, negative side in the X-direction). That is, the resist 153 is provided with the line and space patterns at a pitch eight times as large as the pitch of the contact hole CH.

That is, in the first embodiment, by consolidating two openings formed in the resist to one opening, the pitch of the resist pattern is allowed to become twice as large. With this method, even when the film thicknesses of the resists 152 and 153 are relatively large, the area of the hook-up region $R_{Hu}$ can be reduced.

As illustrated in FIG. 37 and FIG. 38, in the semiconductor memory device according to the comparative example, the closer to the memory hole region $R_{MH}$ the contact electrode CC are disposed, the upper layer the conductive layer 110 is connected to. On the other hand, the semiconductor memory device according to the first embodiment is different from the comparative example in the relationship between the arrangement in the X-direction of the contact electrode CC and the conductive layer 110.

For example, as illustrated in FIG. 2 and FIG. 6, in the semiconductor memory device according to the first embodiment, the contact electrode CC(6) is disposed between the contact electrode CC(2) and the contact electrode CC(4). The contact electrodes CC(4), CC(12), CC(14), and CC(10) are disposed between the contact electrode CC(6) and the contact electrode CC(8). The contact electrode CC(14) is disposed between the contact electrode CC(10) and the contact electrode CC(12).

For example, as illustrated in FIG. 2 and FIG. 7, in the semiconductor memory device according to the first embodiment, the contact electrode CC(7) is disposed between the contact electrode CC(3) and the contact electrode CC(5). The contact electrodes CC(5), CC(13), CC(15), and CC(11) are disposed between the contact electrode CC(7) and the contact electrode CC(9). The contact electrode CC(15) is disposed between the contact electrode CC(11) and the contact electrode CC(13).

For example, as illustrated in FIG. 2, FIG. 6, and FIG. 7, in the semiconductor memory device according to the first embodiment, the contact electrodes CC(6) and CC(7) are disposed between the contact electrode CC(0) to the contact electrode CC(3) and the contact electrodes CC(4) and CC(5). The contact electrode CC(12) to the contact electrode CC(15) are disposed between the contact electrode CC(0) to the contact electrode CC(7) and the contact electrode CC(8) to the contact electrode CC(11).

Second Embodiment

[Configuration]

Figure 54:
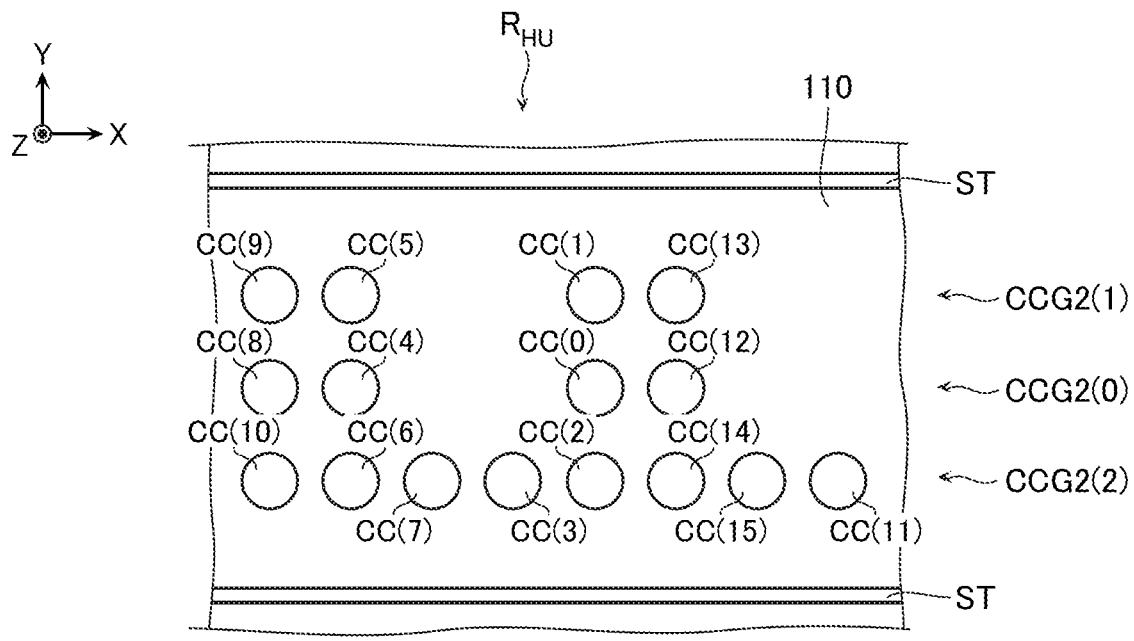
FIG. 54 is a schematic plan view illustrating a part of a configuration of a semiconductor memory device according to a second embodiment.

Next, with reference to FIG. 54, a semiconductor memory device according to the second embodiment will be described. FIG. 54 is a schematic plan view illustrating a part of a configuration of the semiconductor memory device according to the second embodiment.

The semiconductor memory device according to the second embodiment is basically configured similarly to the semiconductor memory device according to the first embodiment. However, as described with reference to FIG. 2, in the semiconductor memory device according to the first embodiment, the two contact electrode rows CCG arranged in the Y-direction are disposed in the hook-up region $R_{HU}$. In contrast, in the semiconductor memory device according to the second embodiment, three contact electrode rows CCG2 arranged in the Y-direction are disposed in the hook-up region $R_{HU}$. These three contact electrode rows CCG2 each include a plurality of contact electrodes CC arranged in the X-direction.

In the example of FIG. 54, the contact electrode rows CCG2(2), CCG2(0), and CCG2(1) are disposed in the order from the negative side in the Y-direction.

The contact electrode row CCG2(0) includes the contact electrodes CC(8), CC(4), CC(0), and CC(12) in the order from the one side in the X-direction (for example, negative side in the X-direction).

The contact electrode row CCG2(1) includes the contact electrodes CC(9), CC(5), CC(1), and CC(13) in the order from the one side in the X-direction.

The contact electrode row CCG2(2) includes the contact electrodes CC(10), CC(6), CC(7), CC(3), CC(2), CC(14), CC(15), and CC(11) in the order from the one side in the X-direction.

The plurality of contact electrodes CC(8), CC(4), CC(0), and CC(12) in the contact electrode row CCG2(0) are aligned with the plurality of contact electrodes CC(9), CC(5), CC(1), and CC(13) in the contact electrode row CCG2(1) and the plurality of contact electrodes CC(10), CC(6), CC(2), and CC(14) in the contact electrode row CCG2(2) in the Y-direction, respectively.

[Manufacturing Method]

Next, with reference to FIG. 55 to FIG. 59, the method for manufacturing the semiconductor memory device according to the second embodiment will be described. FIG. 55 to FIG. 59 are schematic plan views for describing the manufacturing method, and illustrate the plane corresponding to that in FIG. 54.

In the manufacture of the semiconductor memory device according to the second embodiment, the process described with reference to FIG. 8 and the process described with reference to FIG. 9 are performed.

Figure 55:
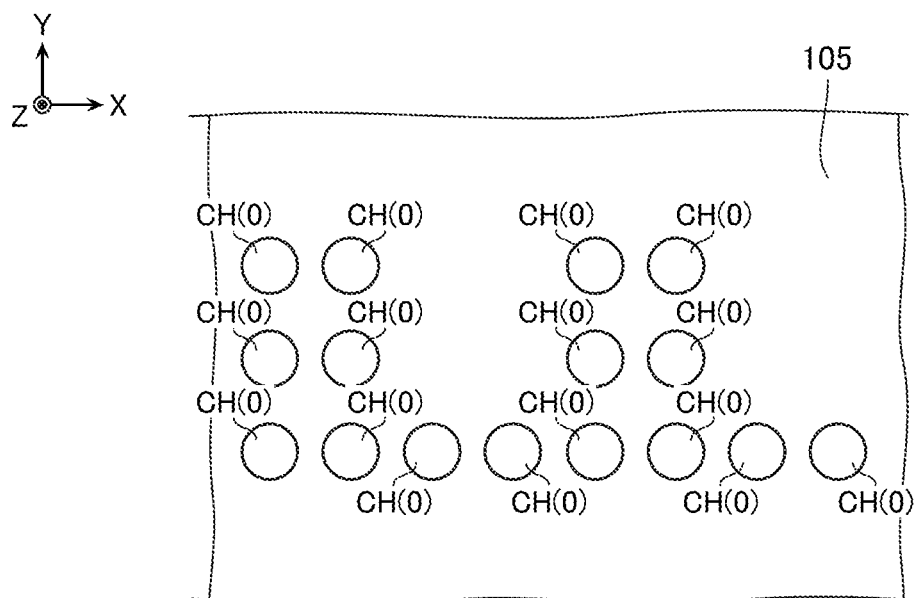
FIG. 55 is a schematic plan view for describing the method for manufacturing the semiconductor memory device.

Next, for example, as illustrated in FIG. 55, a plurality of contact holes CH(0) are formed at positions corresponding to the contact electrodes CC.

Figure 56:
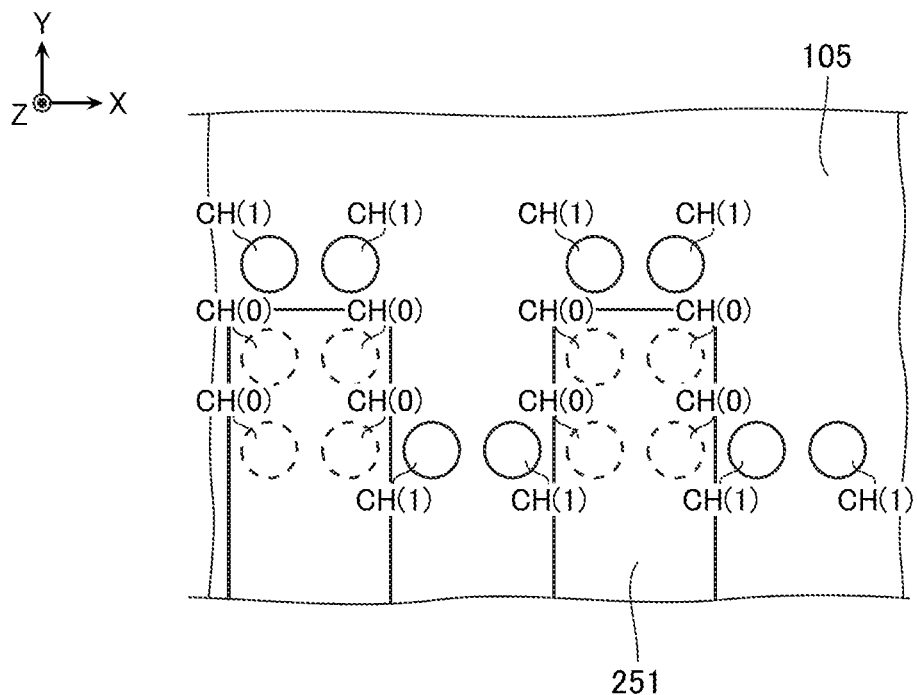
FIG. 56 is a schematic plan view for describing the manufacturing method.

Next, for example, as illustrated in FIG. 56, a resist 251 is formed. The resist 251 covers the contact holes CH corresponding to the contact electrode row CCG2(0). The resist 251 covers the first, second, fifth, sixth contact holes CH counted from the negative side in the X-direction among the eight contact holes CH corresponding to the contact electrode row CCG2(2). The resist 251 exposes the other contact holes CH.

For example, as illustrated in FIG. 56, among the contact holes CH, in the portion not covered with the resist 251, the sacrifice layer 111 and the insulating layer 101 are removed by one layer for each. This process is performed by RIE or the like.

Figure 57:
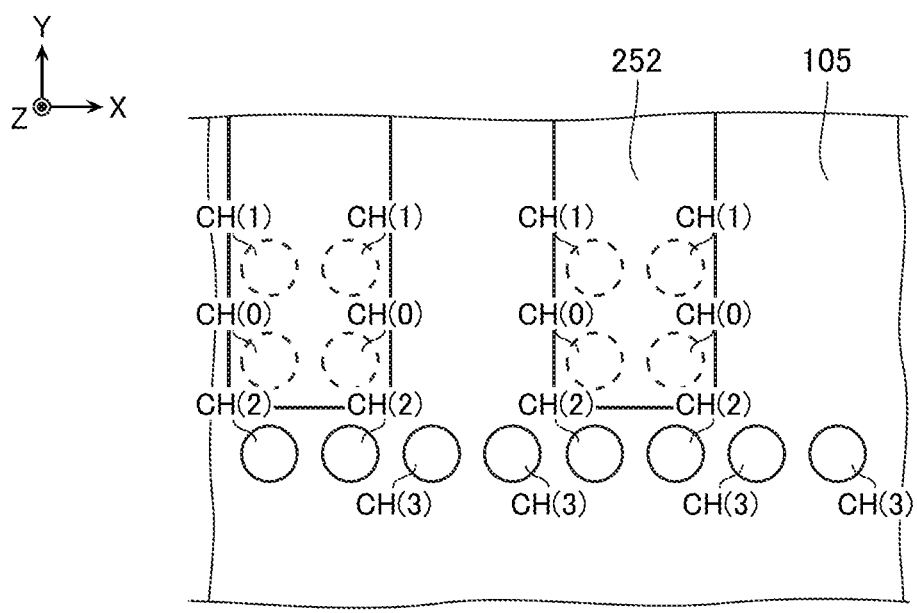
FIG. 57 is a schematic plan view for describing the manufacturing method.

Next, for example, as illustrated in FIG. 57, a resist 252 is formed. The resist 252 covers the contact holes CH corresponding to the contact electrode row CCG2(0). The resist 252 covers the contact hole CH corresponding to the contact electrode row CCG2(1). The resist 252 exposes the other contact holes CH.

For example, as illustrated in FIG. 57, among the contact holes CH, in the portion not covered with the resist 252, the sacrifice layers 111 and the insulating layers 101 are removed by two layers for each. This process is performed by RIE or the like.

Figure 58:
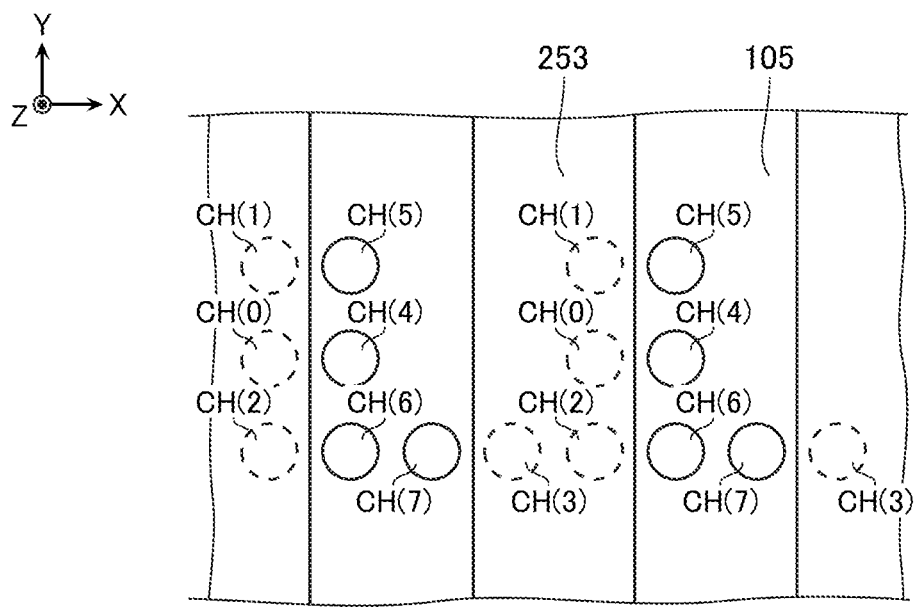
FIG. 58 is a schematic plan view for describing the manufacturing method.

Next, for example, as illustrated in FIG. 58, a resist 253 is formed. The resist 253 covers the first and third contact holes CH counted from the negative side in the X-direction among the four contact holes CH corresponding to the contact electrode row CCG2(0). The resist 253 covers the first and third contact holes CH counted from the negative side in the X-direction among the four contact holes CH corresponding to the contact electrode row CCG2(1). The resist 253 covers the first, fourth, fifth, and eighth contact holes CH counted from the negative side in the X-direction among the eight contact holes CH corresponding to the contact electrode row CCG2(2). The resist 253 exposes the other contact holes CH.

For example, as illustrated in FIG. 58, among the contact holes CH, in the portion not covered with the resist 253, the sacrifice layers 111 and the insulating layers 101 are removed by four layers for each. This process is performed by RIE or the like.

Figure 59:
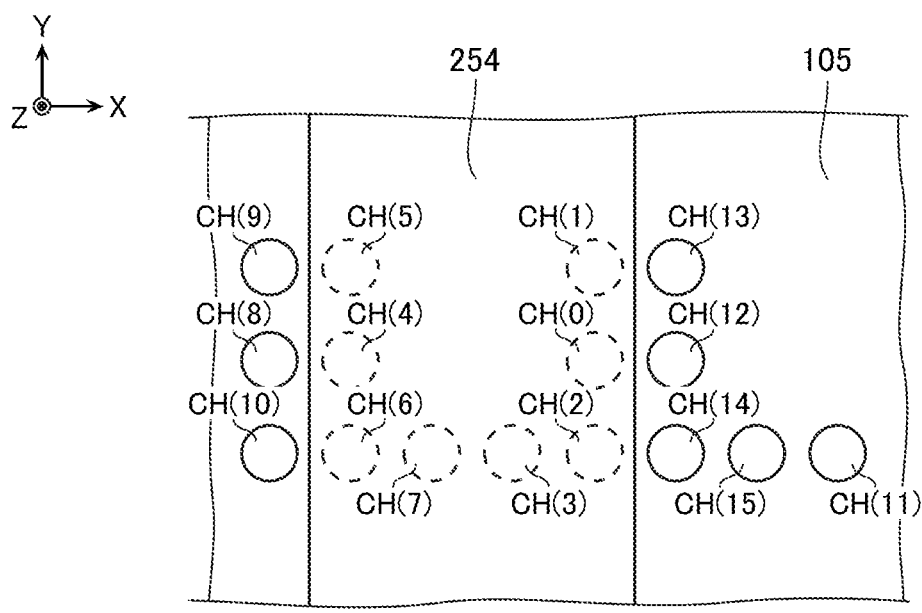
FIG. 59 is a schematic plan view for describing the manufacturing method.

Next, for example, as illustrated in FIG. 59, a resist 254 is formed. The resist 254 covers the second and third contact holes CH counted from the negative side in the X-direction among the four contact holes CH corresponding to the contact electrode row CCG2(0). The resist 254 covers the second and third contact holes CH counted from the negative side in the X-direction among the four contact holes CH corresponding to the contact electrode row CCG2(1). The resist 254 covers the second to fifth contact holes CH counted from the negative side in the X-direction among the eight contact holes CH corresponding to the contact electrode row CCG2(2). The resist 254 exposes the other contact holes CH.

For example, as illustrated in FIG. 59, among the contact holes CH, in the portion not covered with the resist 254, the sacrifice layers 111 and the insulating layers 101 are removed by eight layers for each. This process is performed by RIE or the like.

Third Embodiment

[Configuration]

Figure 60:
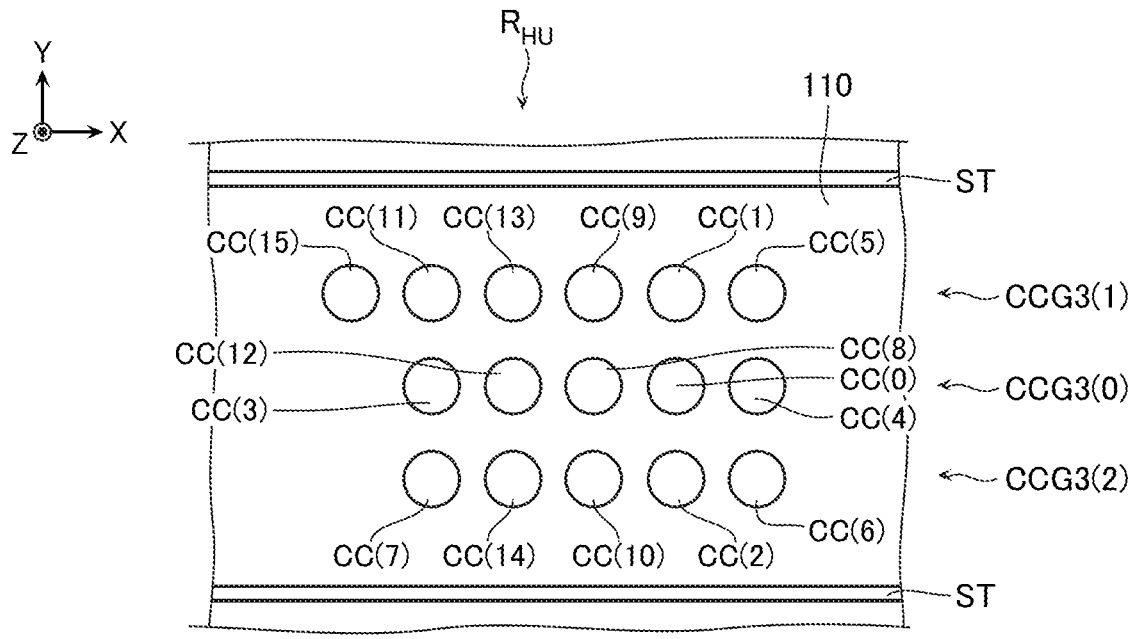
FIG. 60 is a schematic plan view illustrating a part of a configuration of a semiconductor memory device according to a third embodiment.

Next, with reference to FIG. 60, a semiconductor memory device according to the third embodiment will be described. FIG. 60 is a schematic plan view illustrating a part of a configuration of the semiconductor memory device according to the third embodiment.

The semiconductor memory device according to the third embodiment is basically configured similarly to the semiconductor memory device according to the first embodiment. However, as described with reference to FIG. 2, in the semiconductor memory device according to the first embodiment, the two contact electrode rows CCG arranged in the Y-direction are disposed in the hook-up region $R_{HU}$. In contrast, in the semiconductor memory device according to the third embodiment, three contact electrode rows CCG3 arranged in the Y-direction are disposed in the hook-up region $R_{HU}$. These three contact electrode rows CCG3 each include a plurality of contact electrodes CC arranged in the X-direction.

In the example of FIG. 60, the contact electrode rows CCG3(2), CCG3(0), and CCG3(1) are disposed in the order from the negative side in the Y-direction.

The contact electrode row CCG3(0) includes the contact electrodes CC(3), CC(12), CC(8), CC(0), and CC(4) in the order from the one side in the X-direction (for example, negative side in the X-direction).

The contact electrode row CCG3(1) includes the contact electrodes CC(15), CC(11), CC(13), CC(9), CC(1), and CC(5) in the order from the one side in the X-direction.

The contact electrode row CCG3(2) includes the contact electrodes CC(7), CC(14), CC(10), CC(2), and CC(6) in the order from the one side in the X-direction.

The plurality of contact electrodes CC(3), CC(12), CC(8), CC(0), and CC(4) in the contact electrode row CCG3(0) are aligned with the plurality of contact electrodes CC(11), CC(13), CC(9), CC(1), and CC(5) in the contact electrode row CCG3(1), and the plurality of contact electrodes CC(7), CC(14), CC(10), CC(2), and CC(6) in the contact electrode row CCG3(2) in the Y-direction, respectively.

[Manufacturing Method]

Next, with reference to FIG. 61 to FIG. 64, the method for manufacturing the semiconductor memory device according to the third embodiment will be described. FIG. 61 to FIG. 64 are schematic plan views for describing the manufacturing method, and illustrate the plane corresponding to that in FIG. 60.

In the manufacture of the semiconductor memory device according to the third embodiment, the process described with reference to FIG. 8, the process described with reference to FIG. 9, and the process described with reference to FIG. 55 are performed. However, in the process described with reference to FIG. 55, the plurality of contact holes CH(0) are formed at positions corresponding to the contact electrodes CC according to the embodiment.

Figure 61:
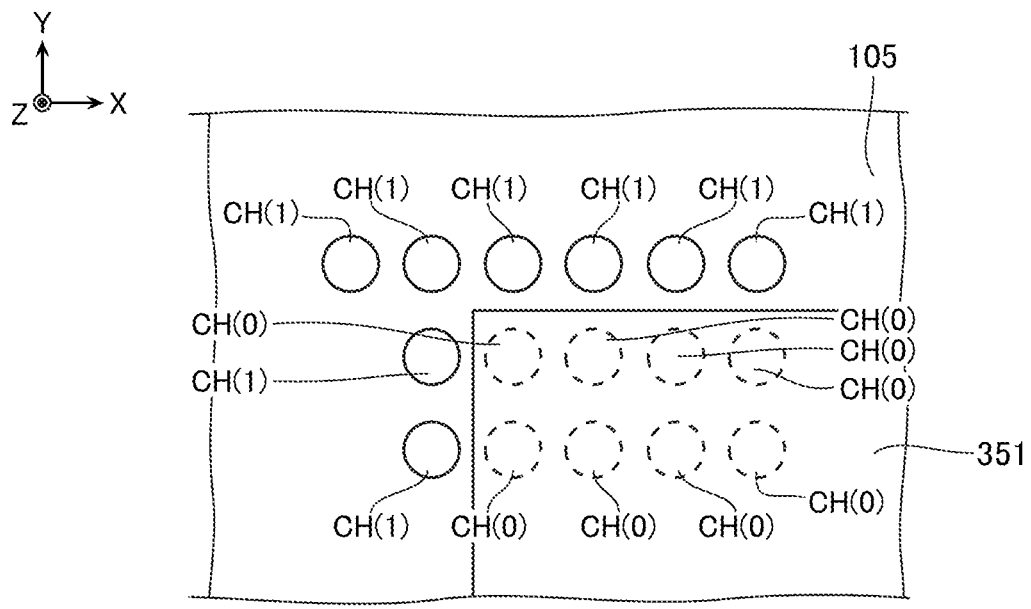
FIG. 61 is a schematic plan view for describing the method for manufacturing the semiconductor memory device.

Next, for example, as illustrated in FIG. 61, a resist 351 is formed. The resist 351 covers the second to fifth contact holes CH counted from the negative side in the X-direction among the five contact holes CH corresponding to the contact electrode row CCG3(0). The resist 351 covers the second to fifth contact holes CH counted from the negative side in the X-direction among the five contact holes CH corresponding to the contact electrode row CCG3(2). The resist 351 exposes the other contact holes CH.

For example, as illustrated in FIG. 61, among the contact holes CH, in the portion not covered with the resist 351, the sacrifice layer 111 and the insulating layer 101 are removed by one layer for each. This process is performed by RIE or the like.

Figure 62:
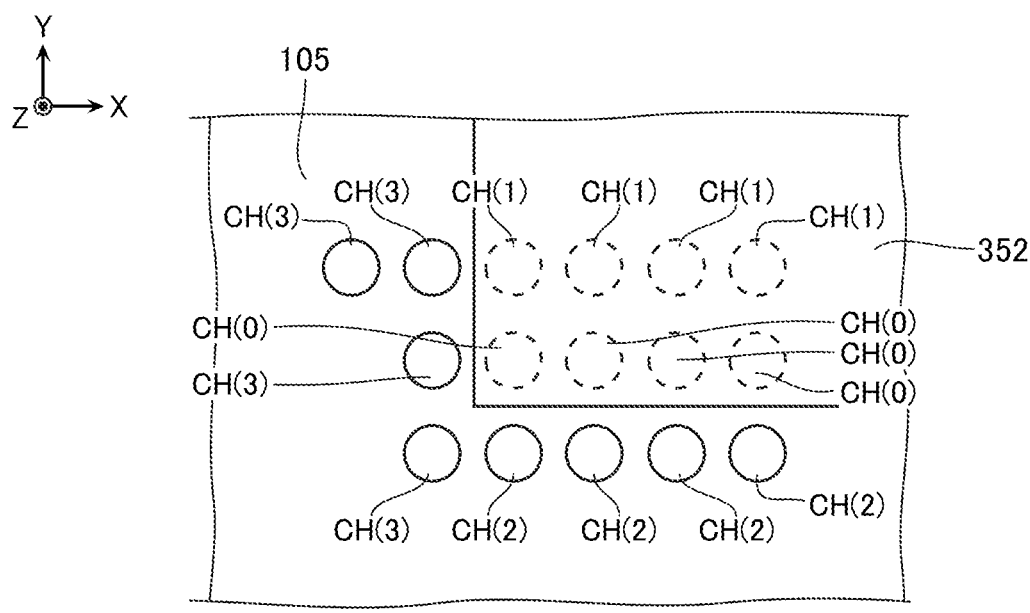
FIG. 62 is a schematic plan view for describing the manufacturing method.

Next, for example, as illustrated in FIG. 62, a resist 352 is formed. The resist 352 covers the second to fifth contact holes CH counted from the negative side in the X-direction among the five contact holes CH corresponding to the contact electrode row CCG3(0). The resist 352 covers the third to sixth contact holes CH counted from the negative side in the X-direction among the six contact holes CH corresponding to the contact electrode row CCG3(1). The resist 352 exposes the other contact holes CH.

For example, as illustrated in FIG. 62, among the contact holes CH, in the portion not covered with the resist 352, the sacrifice layers 111 and the insulating layers 101 are removed by two layers for each. This process is performed by RIE or the like.

Figure 63:
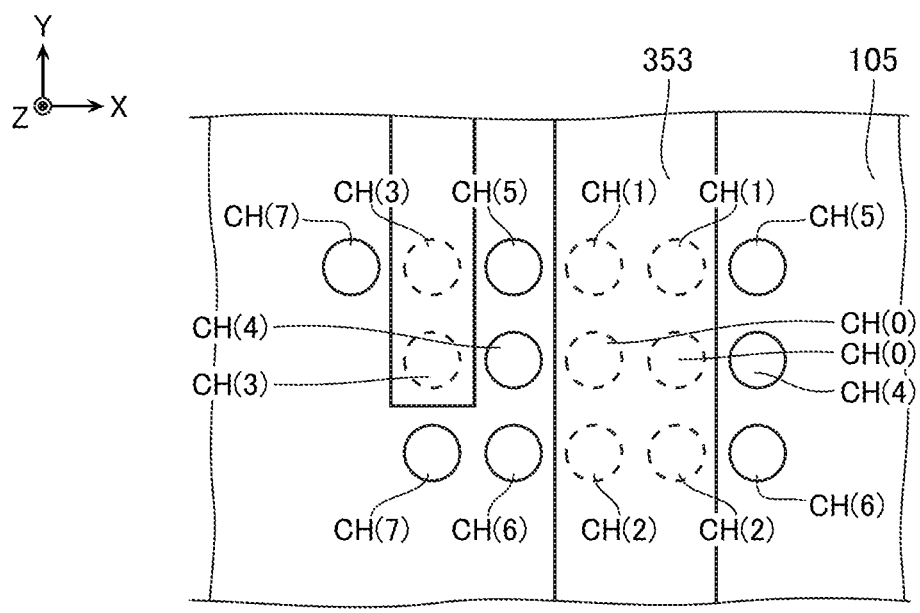
FIG. 63 is a schematic plan view for describing the manufacturing method.

Next, for example, as illustrated in FIG. 63, a resist 353 is formed. The resist 353 covers the first, third, and fourth contact holes CH counted from the negative side in the X-direction among the five contact holes CH corresponding to the contact electrode row CCG3(0). The resist 353 covers the second, fourth, and fifth contact holes CH counted from the negative side in the X-direction among the six contact holes CH corresponding to the contact electrode row CCG3(1). The resist 353 covers the third and fourth contact holes CH counted from the negative side in the X-direction among the five contact holes CH corresponding to the contact electrode row CCG3(2). The resist 353 exposes the other contact holes CH.

For example, as illustrated in FIG. 63, among the contact holes CH, in the portion not covered with the resist 353, the sacrifice layers 111 and the insulating layers 101 are removed by four layers for each. This process is performed by RIE or the like.

Figure 64:
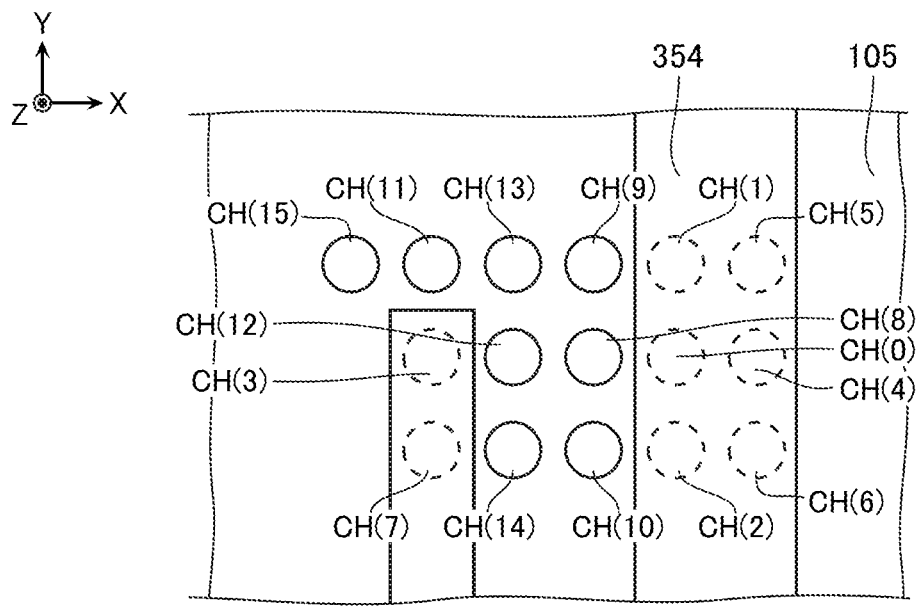
FIG. 64 is a schematic plan view for describing the manufacturing method.

Next, for example, as illustrated in FIG. 64, a resist 354 is formed. The resist 354 covers the first, fourth, and fifth contact holes CH counted from the negative side in the X-direction among the five contact holes CH corresponding to the contact electrode row CCG3(0). The resist 354 covers the fifth and sixth contact holes CH counted from the negative side in the X-direction among the six contact holes CH corresponding to the contact electrode row CCG3(1). The resist 354 covers the first, fourth, and fifth contact holes CH counted from the negative side in the X-direction among the five contact holes CH corresponding to the contact electrode row CCG3(2). The resist 354 exposes the other contact holes CH.

For example, as illustrated in FIG. 64, among the contact holes CH, in the portion not covered with the resist 354, the sacrifice layers 111 and the insulating layers 101 are removed by eight layers for each. This process is performed by RIE or the like.

Fourth Embodiment

[Configuration]

Figure 65:
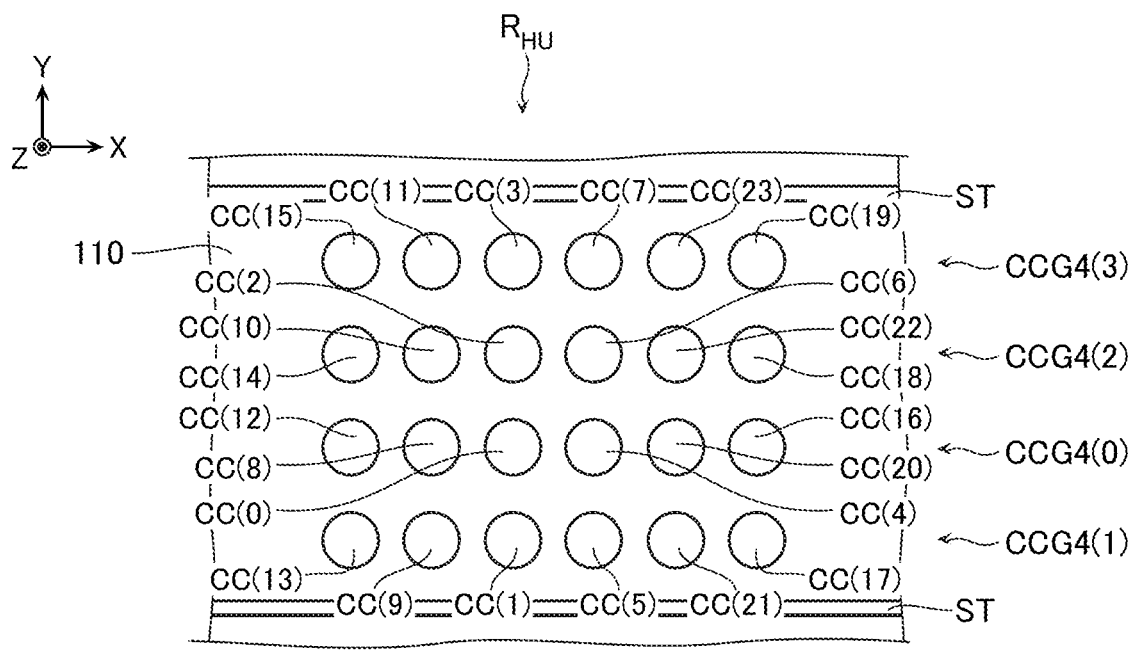
FIG. 65 is a schematic plan view illustrating a part of a configuration of a semiconductor memory device according to a fourth embodiment.

Next, with reference to FIG. 65, a semiconductor memory device according to the fourth embodiment will be described. FIG. 65 is a schematic plan view illustrating a part of a configuration of the semiconductor memory device according to the fourth embodiment.

The semiconductor memory device according to the fourth embodiment is basically configured similarly to the semiconductor memory device according to the first embodiment. However, as described with reference to FIG. 2, in the semiconductor memory device according to the first embodiment, the two contact electrode rows CCG arranged in the Y-direction are disposed in the hook-up region $R_{HU}$. In contrast, in the semiconductor memory device according to the fourth embodiment, four contact electrode rows CCG4 arranged in the Y-direction are disposed in the hook-up region $R_{HU}$. These four contact electrode rows CCG4 each include a plurality of contact electrodes CC arranged in the X-direction.

In the example of FIG. 65, the contact electrode rows CCG4(1), CCG4(0), CCG4(2), and CCG4(3) are disposed in the order from the negative side in the Y-direction.

The contact electrode row CCG4(0) includes the contact electrodes CC(12), CC(8), CC(0), CC(4), CC(20), and CC(16) in the order from the one side in the X-direction (for example, negative side in the X-direction).

The contact electrode row CCG4(1) includes the contact electrodes CC(13), CC(9), CC(1), CC(5), CC(21), and CC(17) in the order from the one side in the X-direction.

The contact electrode row CCG4(2) includes the contact electrode CC(14), CC(10), CC(2), CC(6), CC(22), and CC(18) in the order from the one side in the X-direction.

The contact electrode row CCG4(3) includes the contact electrodes CC(15), CC(11), CC(3), CC(7), CC(23), and CC(19) in the order from the one side in the X-direction.

The plurality of contact electrodes CC(12), CC(8), CC(0), CC(4), CC(20), and CC(16) in the contact electrode row CCG4(0) are aligned with the plurality of contact electrodes CC(13), CC(9), CC(1), CC(5), CC(21), and CC(17) in the contact electrode row CCG4(1), the plurality of contact electrodes CC(14), CC(10), CC(2), CC(6), CC(22), and CC(18) in the contact electrode row CCG4(2), and the plurality of contact electrodes CC(15), CC(11), CC(3), CC(7), CC(23), and CC(19) in the contact electrode row CCG4(3) in the Y-direction, respectively.

[Manufacturing Method]

Next, with reference to FIG. 66 to FIG. 70, the method for manufacturing the semiconductor memory device according to the fourth embodiment will be described. FIG. 66 to FIG. 70 are schematic plan views for describing the manufacturing method, and illustrate the plane corresponding to that in FIG. 65.

In the manufacture of the semiconductor memory device according to the fourth embodiment, the process described with reference to FIG. 8, the process described with reference to FIG. 9, and the process described with reference to FIG. 55 are performed. However, in the process described with reference to FIG. 55, the plurality of contact holes CH(0) are formed at positions corresponding to the contact electrodes CC according to the embodiment.

Figure 66:
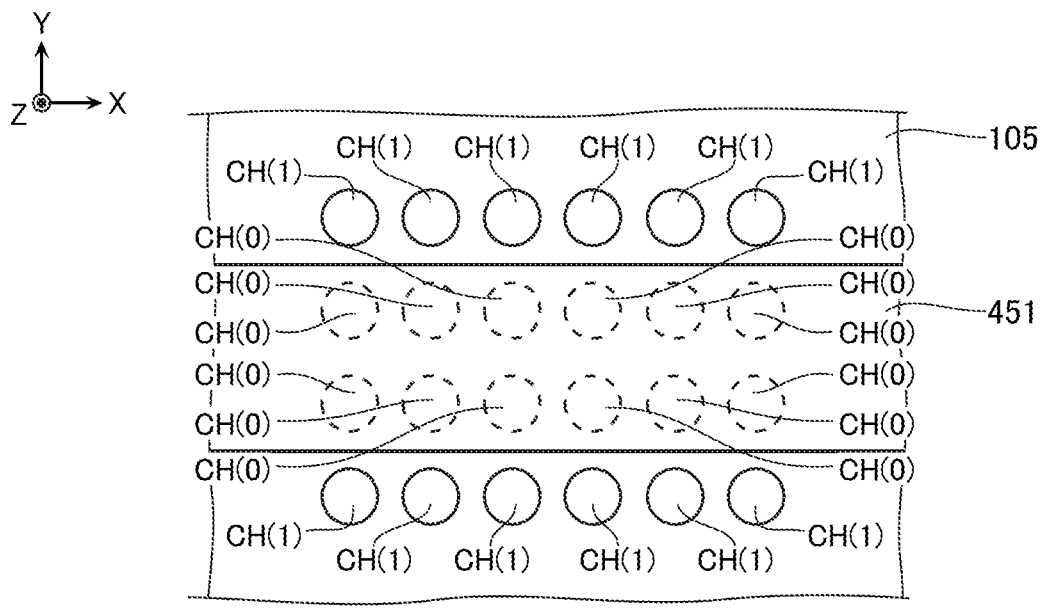
FIG. 66 is a schematic plan view for describing the method for manufacturing the semiconductor memory device.

Next, for example, as illustrated in FIG. 66, a resist 451 is formed. The resist 451 covers the contact holes CH corresponding to the contact electrode row CCG4(0) and the contact holes CH corresponding to the contact electrode row CCG4(2). The resist 451 exposes the other contact holes CH.

For example, as illustrated in FIG. 66, among the contact holes CH, in the portion not covered with the resist 451, the sacrifice layer 111 and the insulating layer 101 are removed by one layer for each. This process is performed by RIE or the like.

Figure 67:
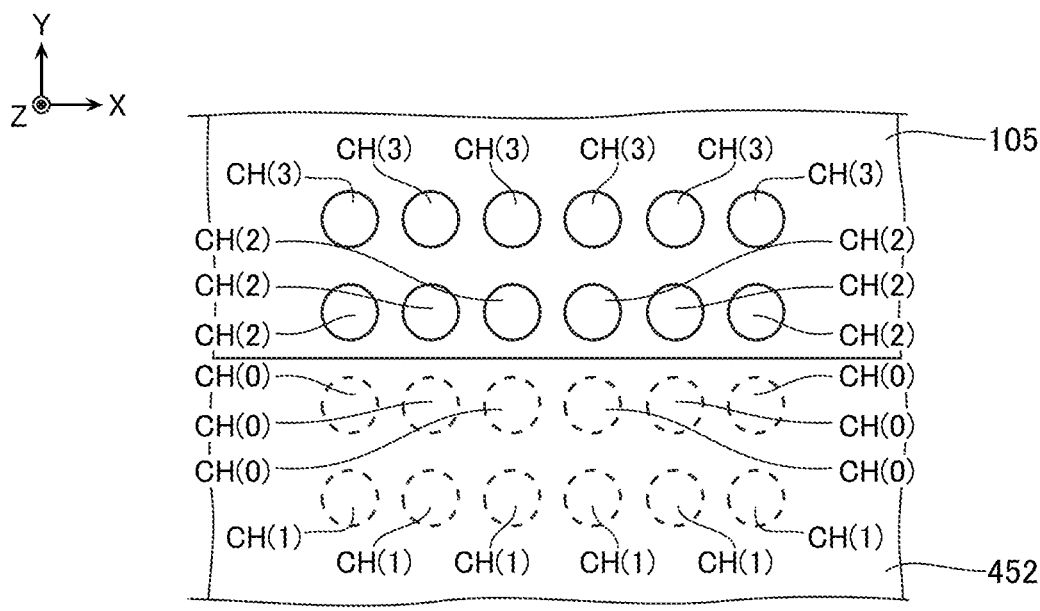
FIG. 67 is a schematic plan view for describing the manufacturing method.

Next, for example, as illustrated in FIG. 67, a resist 452 is formed. The resist 452 covers the contact holes CH corresponding to the contact electrode row CCG4(0) and the contact holes CH corresponding to the contact electrode row CCG4(1). The resist 452 exposes the other contact holes CH.

For example, as illustrated in FIG. 67, among the contact holes CH, in the portion not covered with the resist 452, the sacrifice layers 111 and the insulating layers 101 are removed by two layers for each. This process is performed by RIE or the like.

Figure 68:
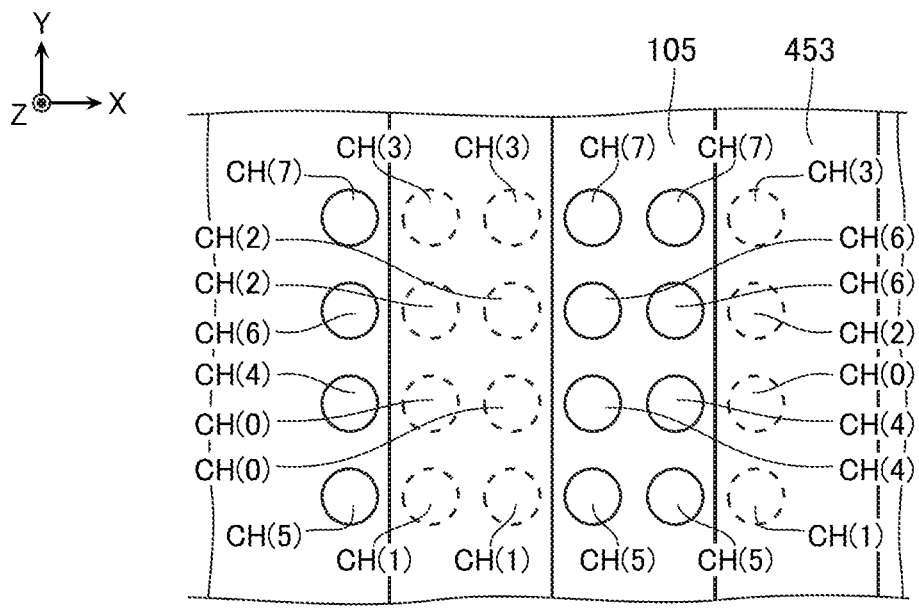
FIG. 68 is a schematic plan view for describing the manufacturing method.

Next, for example, as illustrated in FIG. 68, a resist 453 is formed. The resist 453 covers the second, third, and sixth contact holes CH counted from the negative side in the X-direction among the six contact holes CH corresponding to each of the contact electrode row CCG4(0) to the contact electrode row CCG4(3). The resist 453 exposes the other contact holes CH.

For example, as illustrated in FIG. 68, among the contact holes CH, in the portion not covered with the resist 453, the sacrifice layers 111 and the insulating layers 101 are removed by four layers for each. This process is performed by RIE or the like.

Figure 69:
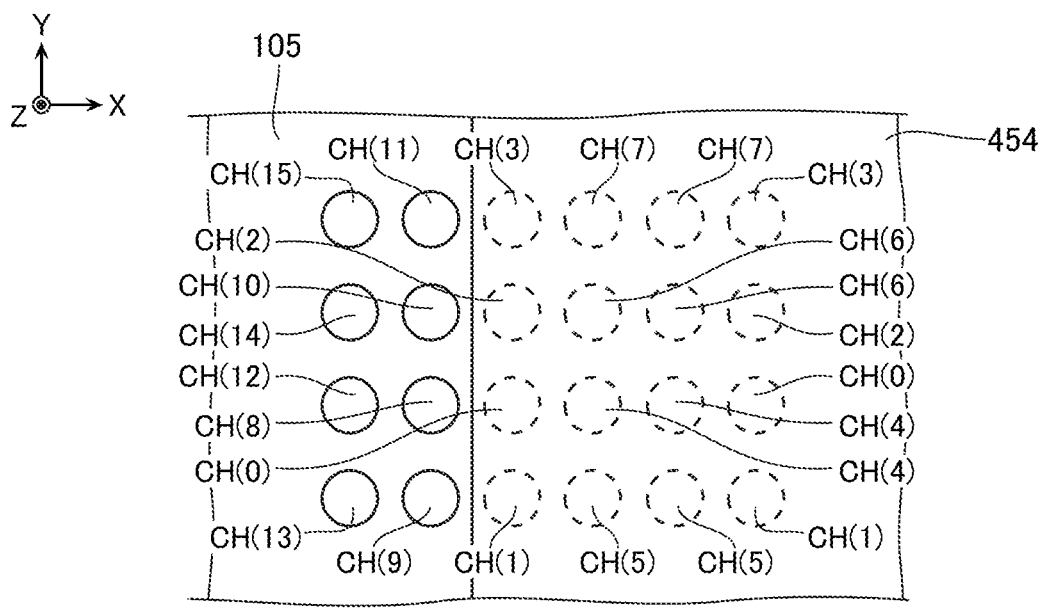
FIG. 69 is a schematic plan view for describing the manufacturing method.

Next, for example, as illustrated in FIG. 69, a resist 454 is formed. The resist 454 covers the third to sixth contact holes CH counted from the negative side in the X-direction among the six contact holes CH corresponding to each of the contact electrode row CCG4(0) to the contact electrode row CCG4(3). The resist 454 exposes the other contact holes CH.

For example, as illustrated in FIG. 69, among the contact holes CH, in the portion not covered with the resist 454, the sacrifice layers 111 and the insulating layers 101 are removed by eight layers for each. This process is performed by RIE or the like.

Figure 70:
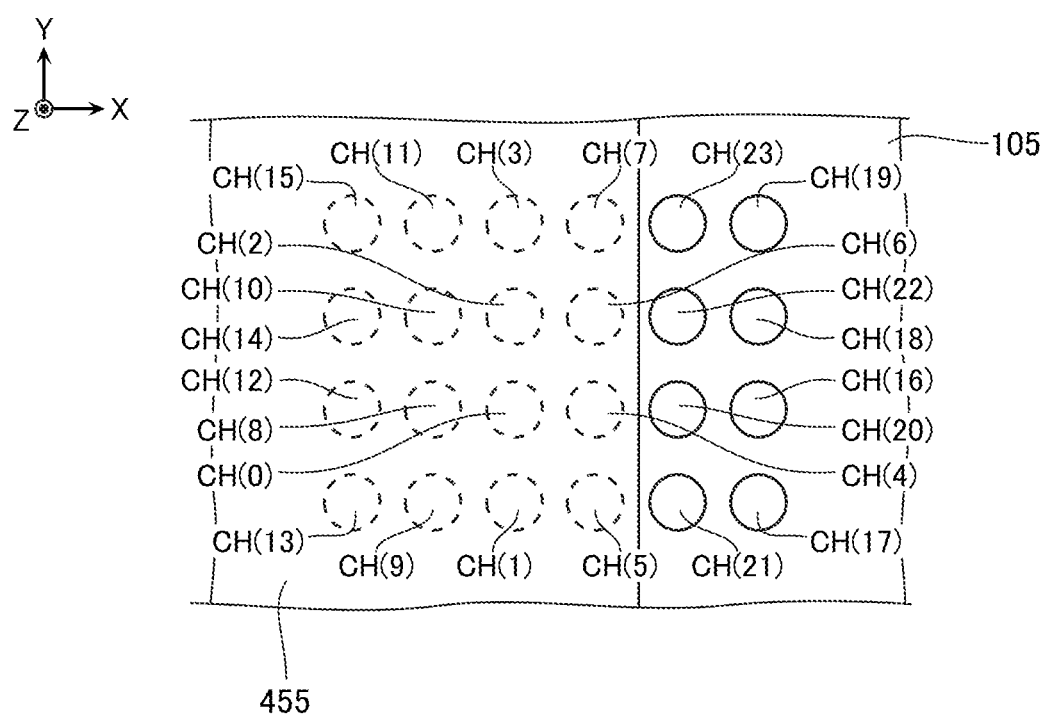
FIG. 70 is a schematic plan view for describing the manufacturing method.

Next, for example, as illustrated in FIG. 70, a resist 455 is formed. The resist 455 covers the first to fourth contact holes CH counted from the negative side in the X-direction among the six contact holes CH corresponding to each of the contact electrode row CCG4(0) to the contact electrode row CCG4(3). The resist 455 exposes the other contact holes CH.

For example, as illustrated in FIG. 70, among the contact holes CH, in the portion not covered with the resist 455, the sacrifice layers 111 and the insulating layers 101 are removed by 16 layers for each. This process is performed by RIE or the like.

Other Embodiments

The semiconductor memory devices according to the first embodiment to the fourth embodiment have been described above. However, the configurations and the manufacturing methods for the semiconductor memory devices according to the first embodiment to the fourth embodiment are merely examples, and the specific configuration and manufacturing method are adjustable as necessary.

For example, the number of the contact electrode rows arranged in the Y-direction in the hook-up region $R_{HU}$ is assumed to c (c is an integer of 1 or more).

In the first embodiment, c=2 is set. In the fourth embodiment, c=4 is set. Thus, in the first embodiment and the fourth embodiment, c is a power of 2.

Here, as described with reference to FIG. 12 to FIG. 15, the manufacturing method according to the first embodiment includes the process in which the line and space pattern extending in the X-direction is formed in the resist and RIE or the like is performed to cause the depths of the plurality of contact holes CH arranged in the Y-direction to be different. Hereinafter, this process is referred to as a "Y-directional step forming process". As described with reference to FIG. 16 to FIG. 30, the manufacturing method according to the first embodiment includes the process in which the line and space pattern extending in the Y-direction is formed in the resist and RIE or the like is performed to cause the depths of the plurality of contact holes CH arranged in the X-direction to be different. Hereinafter, this process is referred to as an "X-directional step forming process".

When c is a power of 2, as the examples of the first embodiment and the fourth embodiment, the contact holes CH can be formed by a combination of the Y-directional step forming process and the X-directional step forming process.

In this case, when the X-directional step forming process is started after the Y-directional step forming process is fully ended, any of the contact electrode rows in the hook-up region $R_{HU}$ includes a plurality of contact electrodes CC(nc). For example, the contact electrode row CCG4(0) described with reference to FIG. 65 includes the contact electrodes CC(0), CC(4), CC(8), CC(12), CC(16), and CC(20). Any of the contact electrode rows includes a plurality of contact electrodes CC(nc+1). For example, the contact electrode row CCG4(1) described with reference to FIG. 65 includes the contact electrodes CC(1), CC(5), CC(9), CC(13), CC(17), and CC(21). Similarly, the other contact electrode rows each include any of a plurality of contact electrodes CC(nc+2) to a plurality of contact electrodes CC(nc+c−1).

On the other hand, when the X-directional step forming process is performed before the Y-directional step forming process is fully ended, the configuration in which the c contact electrode rows in the hook-up region $R_{HU}$ each include any of the plurality of contact electrodes CC(nc) to the plurality of contact electrodes CC(nc+c−1) is not provided. However, even in this case, the following condition is satisfied in some cases. For example, any of the contact electrodes CC disposed in the hook-up region $R_{HU}$ is assumed as a contact electrode CCI. The conductive layer 110 connected to the contact electrode CCI is assumed as a conductive layer 110I. The conductive layer 110 above the conductive layer 110I by c layers or the conductive layer 110 below the conductive layer 110I by c layers is assumed as a conductive layer 110II. The contact electrode CC connected to the conductive layer 110II is assumed as a contact electrode CCII. In this case, the contact electrodes CCI and CCII are arranged in the X-direction or the Y-direction. The other contact electrode CC is arranged between the contact electrodes CCI and CCII in some cases.

In the second embodiment, c=3 is set. In the third embodiment, c=3 is set. Thus, in the second embodiment and the third embodiment, c is not a power of 2.

Here, for example, in the manufacturing method according to the second embodiment, as described with reference to FIG. 56 to FIG. 59, resist patterns different from the simple line and space pattern are used. For example, these resist patterns can be specified as follows. For example, the smallest power-of-2 d (4 in the second embodiment) larger than c (3 in the second embodiment) is specified. It is assumed a resist pattern when the number of the contact electrode rows CCG arranged in the Y-direction is d. Resist patterns corresponding to the c contact electrode rows are fixed, and patterns corresponding to the remaining d-c (1 in the second embodiment) contact electrode rows CCG are moved to positions aligned with the other contact electrode rows CCG in the X-direction. For example, the third, fourth, seventh, and eighth contact electrodes CC counted from the negative side in the X-direction of the contact electrode row CCG2(2) in FIG. 54 correspond to the contact electrodes CC in the remaining d-c contact electrode rows CCG.

Hereinafter, the process as described with reference to FIG. 56, FIG. 57, FIG. 61, or FIG. 62 is referred to as a "step forming process corresponding to Y-direction". The process as described with reference to FIG. 58, FIG. 59, FIG. 63, or FIG. 64 is referred to as a "step forming process corresponding to X-direction".

When c is not a power of 2, as the examples of the second embodiment and the third embodiment, the contact holes CH can be formed by a combination of the step forming process corresponding to Y-direction and the step forming process corresponding to X-direction.

In this case, when the step forming process corresponding to X-direction is started after the step forming process corresponding to Y-direction is fully ended, the c contact electrode rows in the hook-up region $R_{HU}$ each include any of a plurality of contact electrodes CC(nd) to a plurality of contact electrodes CC(nd+d−1).

On the other hand, when the step forming process corresponding to X-direction is performed before the step forming process corresponding to Y-direction is fully ended, the configuration in which the c contact electrode rows in the hook-up region $R_{HU}$ each include any of the plurality of contact electrodes CC(nd) to the plurality of contact electrodes CC(nd+d−1) is not provided. However, even in this case, the following condition is satisfied in some cases. For example, any of the contact electrodes CC disposed in the hook-up region $R_{HU}$ is assumed as a contact electrode CCIII. The conductive layer 110 connected to the contact electrode CCIII is assumed as a conductive layer 110III. The conductive layer 110 above the conductive layer 110III by d layers or the conductive layer 110 below the conductive layer 110III by d layers is assumed as a conductive layer 110VI. The contact electrode CC connected to the conductive layer 110VI is assumed as a contact electrode CCVI. In this case, the contact electrodes CCIII and CCVI are aligned in the X-direction or the Y-direction in some cases. The other contact electrode CC is arranged between the contact electrodes CCIII and CCVI in some cases.

For example, in the first embodiment to the fourth embodiment, the one end in the Z-direction of the semiconductor layer 120 is connected to the semiconductor layer 112. However, the one end in the Z-direction of the semiconductor layer 120 may be connected to the semiconductor substrate 100. For example, in the first embodiment to the fourth embodiment, the contact electrode CC is connected to the upper surface of the conductive layer 110. However, the contact electrode CC may be connected to the lower surface of the conductive layer 110.

For example, as described with reference to FIG. 10 and FIG. 11, in the manufacturing method according to the first embodiment to the fourth embodiment, the hard mask 105 is used. However, this method is merely an example, and the specific method is adjustable as necessary. For example, the semiconductor memory device according to any of the embodiments can be manufactured without using the hard mask 105.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
   a substrate;
   a plurality of conductive layers that are arranged in a first direction and extend in a second direction, the first direction intersecting with a surface of the substrate, and the second direction intersecting with the first direction;
   a semiconductor layer that extends in the first direction and is opposed to the plurality of conductive layers; and
   n (n is an integer of 2 or more) contact electrode regions arranged in a third direction intersecting with the first direction and the second direction, wherein
   the n is a power of 2,
   the contact electrode region includes a plurality of contact electrodes arranged in the second direction, and
   the plurality of conductive layers include a first conductive layer and a second conductive layer that is an n-th conductive layer counted from the first conductive layer, wherein
   the plurality of contact electrodes included in the n contact electrode regions include:
      a first contact electrode connected to the first conductive layer;
      a second contact electrode connected to the second conductive layer; and a third contact electrode disposed between the first contact electrode and the second contact electrode, wherein the first contact electrode, the second contact electrode, and the third contact electrode are arranged in the second direction or the third direction.

2. The semiconductor memory device according to claim 1, wherein the plurality of conductive layers include a third conductive layer closer to the substrate than the first conductive layer and the second conductive layer, and the third contact electrode is connected to the third conductive layer.

3. The semiconductor memory device according to claim 2, wherein the plurality of conductive layers include a fourth conductive layer closer to the substrate than the third conductive layer, the plurality of contact electrodes included in the n contact electrode regions include a fourth contact electrode connected to the fourth conductive layer, the first contact electrode or the second contact electrode is disposed between the third contact electrode and the fourth contact electrode, and the first contact electrode, the second contact electrode, the third contact electrode, and the fourth contact electrode are arranged in the second direction.

4. The semiconductor memory device according to claim 1, wherein the plurality of conductive layers include a third conductive layer farther from the substrate than the first conductive layer and the second conductive layer, and the third contact electrode is connected to the third conductive layer.

5. The semiconductor memory device according to claim 4, wherein the plurality of conductive layers include a fourth conductive layer closer to the substrate than the first conductive layer and the second conductive layer, the plurality of contact electrodes included in the n contact electrode regions include a fourth contact electrode connected to the fourth conductive layer, the fourth contact electrode is disposed between the third contact electrode and the second contact electrode, and the first contact electrode, the second contact electrode, the third contact electrode, and the fourth contact electrode are arranged in the second direction.

6. The semiconductor memory device according to claim 1, wherein, when the n contact electrode regions are assumed to be a first contact electrode region to an n-th contact electrode region, the plurality of contact electrodes included in a k-th (k is an integer of 1 or more and n or less) contact electrode region are each connected to any of nj+k-th (j is an integer of 0 or more) conductive layers counted from one side in the first direction among the plurality of conductive layers.

7. A semiconductor memory device comprising:

a substrate;

a first conductive layer separated from the substrate in a first direction intersecting with a surface of the substrate;

a second conductive layer disposed between the first conductive layer and the substrate;

a third conductive layer closer to the substrate than the second conductive layer or farther from the substrate than the first conductive layer;

a semiconductor layer that extends in the first direction and is opposed to the first conductive layer, the second conductive layer, and the third conductive layer;

a first contact electrode that extends in the first direction and is connected to the first conductive layer;

a second contact electrode that extends in the first direction and is connected to the second conductive layer; and a third contact electrode that extends in the first direction and is connected to the third conductive layer, wherein the first conductive layer, the second conductive layer, and the third conductive layer extend in a second direction intersecting with the first direction, and the third contact electrode is disposed between the first contact electrode and the second contact electrode in the second direction.

8. The semiconductor memory device according to claim 7, wherein the third conductive layer is closer to the substrate than the first conductive layer and the second conductive layer.

9. The semiconductor memory device according to claim 8, further comprising:

a fourth conductive layer closer to the substrate than the third conductive layer; and a fourth contact electrode that extends in the first direction and is connected to the fourth conductive layer, wherein the first contact electrode or the second contact electrode is disposed between the third contact electrode and the fourth contact electrode, and the first contact electrode, the second contact electrode, the third contact electrode, and the fourth contact electrode are arranged in the second direction.

10. The semiconductor memory device according to claim 7, wherein the third conductive layer is farther from the substrate than the first conductive layer and the second conductive layer.

11. The semiconductor memory device according to claim 10, further comprising:

a fourth conductive layer closer to the substrate than the second conductive layer; and a fourth contact electrode that extends in the first direction and is connected to the fourth conductive layer, wherein the fourth contact electrode is disposed between the third contact electrode and the second contact electrode, and the first contact electrode, the second contact electrode, the third contact electrode, and the fourth contact electrode are arranged in the second direction.

* * * * *